United States Patent
Ryu et al.

(10) Patent No.: US 8,811,304 B2
(45) Date of Patent: Aug. 19, 2014

(54) DIGITAL BROADCAST TRANSMITTER, DIGITAL BROADCAST RECEIVER, AND METHODS FOR CONFIGURING AND PROCESSING STREAMS THEREOF

(75) Inventors: Ga-hyun Ryu, Suwon-si (KR); Yong-sik Kwon, Suwon-si (KR); June-hee Lee, Seongnam-si (KR); Chan-sub Park, Incheon (KR); Jung-jin Kim, Yongin-si (KR); Kyo-shin Choo, Yongin-si (KR); Kum-ran Ji, Suwon-si (KR); Sung-il Park, Suwon-si (KR); Jong-hwa Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 928 days.

(21) Appl. No.: 12/784,540

(22) Filed: May 21, 2010

(65) Prior Publication Data
US 2010/0296506 A1    Nov. 25, 2010

Related U.S. Application Data

(60) Provisional application No. 61/213,257, filed on May 21, 2009, provisional application No. 61/213,272, filed on May 22, 2009, provisional application No. 61/180,972, filed on May 26, 2009, provisional application No. 61/213,301, filed on May 28, 2009, provisional application No. 61/223,112, filed on Jul. 6, 2009, provisional application No. 61/224,628, filed on Jul. 10, 2009, provisional application No. 61/224,612, filed on Jul. 10, 2009, provisional application No. 61/272,731, filed on Oct. 27, 2009.

(30) Foreign Application Priority Data
May 14, 2010 (KR) .................. 10-2010-0045390

(51) Int. Cl.
*H04W 4/00* (2009.01)

(52) U.S. Cl.
USPC ................................. 370/329

(58) Field of Classification Search
USPC ......... 370/465, 310, 315, 312, 314, 320, 321, 370/329, 330, 431
See application file for complete search history.

(56) References Cited

U.S. PATENT DOCUMENTS 7,634,015 B2 * 12/2009 Waxman ................ 375/260
7,733,817 B2 *  6/2010 Choi et al. ............. 370/310
(Continued)

FOREIGN PATENT DOCUMENTS

CN    101107854 A    1/2008
CN    101425864 A    5/2009
(Continued)

OTHER PUBLICATIONS

International Search Report and Written Opinion for counterpart International Application No. PCT/KR2010/003220 dated Dec. 24, 2010.

(Continued)

*Primary Examiner* — Anh Ngoc Nguyen
(74) *Attorney, Agent, or Firm* — Sughrue Mion, PLLC

(57) ABSTRACT

A method for processing a stream of a digital broadcast receiver is provided. The method which processes a stream that is divided into a first area allocated to first mobile data and a second area allocated to normal data, includes: receiving a transport stream including new mobile data in at least a part of the second area separately from the first mobile data, demodulating the transport stream, equalizing the demodulated transport stream, and decoding at least one of the first mobile data and the new mobile data from the equalized transport stream. Accordingly, mobile data services may be provided in various ways.

45 Claims, 53 Drawing Sheets

A) BEFORE INTERLEAVING

B) AFTER INTERLEAVING

(56) References Cited

U.S. PATENT DOCUMENTS

| | | |
|---|---|---|
| 7,733,819 B2 * | 6/2010 | Lee et al. .................... 370/312 |
| 7,751,446 B2 | 7/2010 | Lee et al. |
| 7,793,320 B2 | 9/2010 | Yun et al. |
| 7,885,270 B2 | 2/2011 | Frink et al. |
| 7,890,980 B2 | 2/2011 | Yun et al. |
| 8,054,906 B2 | 11/2011 | Choi et al. |
| 8,059,627 B2 | 11/2011 | Hong et al. |
| 8,542,761 B2 | 9/2013 | Choi et al. |
| 2007/0189408 A1 | 8/2007 | Waxman |
| 2008/0186850 A1 | 8/2008 | Lee et al. |
| 2008/0192858 A1 | 8/2008 | Kim et al. |
| 2008/0216113 A1 | 9/2008 | Yun et al. |
| 2008/0240065 A1 | 10/2008 | Choi et al. |
| 2009/0034450 A1 | 2/2009 | Urner |
| 2009/0041129 A1 | 2/2009 | Suh et al. |
| 2009/0046816 A1 | 2/2009 | Hong et al. |
| 2009/0097429 A1 | 4/2009 | Lee et al. |
| 2009/0252253 A1 | 10/2009 | Choi et al. |
| 2009/0257391 A1 | 10/2009 | Song et al. |
| 2009/0316831 A1 | 12/2009 | Song et al. |
| 2010/0172327 A1 | 7/2010 | Yun et al. |
| 2010/0180294 A1 | 7/2010 | Yun et al. |
| 2010/0232550 A1 | 9/2010 | Lee et al. |
| 2010/0296424 A1 | 11/2010 | Kwon et al. |
| 2011/0044316 A1 | 2/2011 | Kim et al. |
| 2011/0085603 A1 | 4/2011 | Lee et al. |
| 2011/0149817 A1 | 6/2011 | Song et al. |
| 2012/0079356 A1 | 3/2012 | Choi et al. |
| 2012/0084621 A1 | 4/2012 | Hong et al. |
| 2012/0163477 A1 | 6/2012 | Song et al. |
| 2012/0246541 A1 | 9/2012 | Kim et al. |

FOREIGN PATENT DOCUMENTS

| | | | |
|---|---|---|---|
| KR | 10-2008-0074680 A | | 8/2008 |
| KR | 10-2008-0078444 A | | 8/2008 |
| KR | 10-2009-0004773 A | | 1/2009 |
| KR | 10-2009-0031267 A | | 3/2009 |
| WO | 2008/120916 A1 | | 10/2008 |
| WO | 2009/002094 A1 | | 12/2008 |
| WO | 2009/008647 A2 | | 1/2009 |
| WO | 2009/038439 A2 | | 3/2009 |

OTHER PUBLICATIONS

Communication dated Jul. 24, 2013 issued by the Mexican Patent Office in counterpart Mexican Patent Application No. MX/a/2011/012386.

Communication dated Aug. 22, 2013 issued by the United States Patent and Trademark Office in counterpart U.S. Appl. No. 12/784,534.

US Final Office Action, dated Apr. 23, 2013, issued by the USPTO in related U.S. Appl. No. 12/784,535.

Communication, dated Apr. 5, 2013, issued by the Mexican Patent Office in counterpart Mexican Patent Application No. MX/a/2011/012385.

US Non-Final Office Action, dated Jun. 7, 2013, issued by the USPTO in related U.S. Appl. No. 13/321,745.

Communication, dated Nov. 12, 2013, issued by the Korean Intellectual Property Office in counterpart Korean Patent Application No. 10-2011-7027702.

Communication, dated Nov. 21, 2013, issued by the State Intellectual Property Office of P.R. China in counterpart Chinese Patent Application No. 201080022369.2.

Communication, dated Dec. 4, 2013, issued by the State Intellectual Property Office of P.R. China in counterpart Chinese Patent Application No. 201080022715.7.

US Non-Final Office Action, dated Oct. 1, 2013, issued by the USPTO in related U.S. Appl. No. 12/784,535.

Finnish Office Action, dated Jan. 27, 2014, issued by the Finnish Patent Office for Finnish Patent Application No. 20116248.

Finnish Office Action, dated Jan. 27, 2014, issued by the Finnish Patent Office for Finnish Patent Application No. 20116252.

Finnish Office Action, dated Jan. 31, 2014, issued by the Finnish Patent Office for Finnish Patent Application No. 20116261.

Finnish Office Action, dated Feb. 12, 2014, issued by the Finnish Patent Office for Finnish Patent Application No. 20116267.

Communication dated Jun. 23, 2014 issued by the State Intellectual Property Office of P.R. China in counterpart Chinese Application No. 201080022715.7.

* cited by examiner

FIG. 41

| Type 1 |
|---|
| Type 0 |
| Type 0 |
| Type 0 |
| Type 1 |
| Type 0 |
| Type 0 |
| Type 0 |
| Type 1 |
| Type 0 |
| Type 0 |
| Type 0 |

FIG. 42

| ex 1 | ex 2 | ex 3 | ex 4 | ex 5 | ex 6 |
|---|---|---|---|---|---|
| Type 0 | Type 0 | Type 0 | Type 0 | Type 1-1 | Type 1-4 |
| Type 1-4 | Type 1-4 | Type 1-3 | Type 1-3 | Type 1-3 | Type 1-4 |
| Type 1-3 | Type 0 | Type 0 | Type 1-2 | Type 1-2 | Type 1-4 |
| Type 1-2 | Type 1-4 | Type 1-4 | Type 1-4 | Type 1-4 | Type 1-4 |
| Type 1-1 | Type 0 | Type 0 | Type 0 | Type 1-1 | Type 1-4 |
| Type 0 | Type 1-4 | Type 1-3 | Type 1-3 | Type 1-3 | Type 1-4 |
| Type 1-4 | Type 0 | Type 0 | Type 1-2 | Type 1-2 | Type 1-4 |
| Type 1-3 | Type 1-4 | Type 1-4 | Type 1-4 | Type 1-4 | Type 1-4 |
| Type 1-2 | Type 0 | Type 0 | Type 0 | Type 1-1 | Type 1-4 |
| Type 1-1 | Type 1-4 | Type 1-3 | Type 1-3 | Type 1-3 | Type 1-4 |
| Type 0 | Type 0 | Type 0 | Type 1-2 | Type 1-2 | Type 1-4 |
| Type 1-4 | Type 1-4 | Type 1-4 | Type 1-4 | Type 1-4 | Type 1-4 |
| Type 1-3 | Type 0 | Type 0 | Type 0 | Type 1-1 | Type 1-4 |
| Type 1-2 | Type 1-4 | Type 1-3 | Type 1-3 | Type 1-3 | Type 1-4 |
| Type 1-1 | Type 0 | Type 0 | Type 1-2 | Type 1-2 | Type 1-4 |
| Type 0 | Type 1-4 | Type 1-4 | Type 1-4 | Type 1-4 | Type 1-4 |

…

DIGITAL BROADCAST TRANSMITTER, DIGITAL BROADCAST RECEIVER, AND METHODS FOR CONFIGURING AND PROCESSING STREAMS THEREOF

CROSS-REFERENCE TO RELATED APPLICATIONS

This application claims the benefit of U.S. Provisional Application No. 61/213,257 filed on May 21, 2009; No. 61/213,272 filed on May 22, 2009; No. 61/180,972 filed on May 26, 2009; No. 61/213,301 filed on May 28, 2009; No. 61/223,112 filed on Jul. 6, 2009; No. 61/224,628 filed on Jul. 10, 2009; No. 61/224,612 filed on Jul. 10, 2009; and No. 61/272,731 filed on Oct. 27, 2009, and claims priority from Korean Patent Application No. 10-2010-0045390 filed on May 14, 2010 in the Korean Intellectual Property Office, the disclosures of which are incorporated herein by reference in their entirety.

BACKGROUND

1. Field

Apparatuses and methods consistent with the exemplary embodiments relate to a digital broadcast transmitter, a digital broadcast receiver, and methods for configuring and processing streams thereof, and more particularly, to a digital broadcast transmitter to configure a transport stream including normal data and mobile data and to transmit the transport stream, a digital broadcast receiver to receive and to process the transport stream, and methods thereof.

2. Description of the Related Art

As digital broadcasting becomes widespread, diverse types of electronic apparatuses support digital broadcasting services. In particular, a personal portable apparatus, such as a mobile phone, a navigator, a personal digital assistance (PDA), and an MP3 player, as well as a general home appliance, such as a digital broadcast television and a set-top box, supports the digital broadcasting.

Accordingly, digital broadcast standards for providing digital broadcasting service to such a portable apparatus have been discussed.

Among these, an advanced television systems committee-mobile/handheld (ATSC-MH) standard has been discussed. According to ATSC-MH standard, mobile data is placed in a transport stream that is configured for transmitting general data for a digital broadcasting service (i.e., normal data), and is then transmitted.

Since the mobile data is received and processed at the portable apparatus, the mobile data is processed to be robust against an error because of the mobility of the portable apparatus unlike the normal data, and is included in the transport stream.

FIG. 1 is a view illustrating an example of a transport stream including mobile data and normal data.

The stream a) of FIG. 1 illustrates a stream in which mobile data and normal data are placed in packets allocated thereto and are multiplexed.

The stream a) of FIG. 1 is converted into a stream b) by interleaving. Referring to b) of FIG. 1, the interleaved mobile data MH can be divided into an area "A" and an area "B". The area "A" represents an area which extends from a portion where mobile data over a predetermined size are collected in a plurality of transmission units, and the area "B" represents the remaining area. Dividing the mobile data into the area "A" and the area "B" is merely an example and the mobile data may be divided in different ways according to situations. For example, in b) of FIG. 1, even a portion not including normal data is set to the area "A" and a portion corresponding to a transmission unit in which a bit of normal data is included is set to the area "B".

The area "B" is relatively susceptible to an error compared to the area "A". More specifically, digital broadcast data may include known data for correcting an error, such as a training sequence to be demodulated and equalized appropriately at a receiver. According to the related-art ATSC-MH standard, the known data is not placed in the area "B" and, thus, the area "B" is susceptible to an error.

Also, if the stream is configured as shown in FIG. 1, there is a limit in transmitting the mobile data. In other words, although an increased number of broadcasting stations and apparatuses support broadcasting services for mobile apparatuses, stream transmitting efficiency deteriorates due to the stream configuration as shown in FIG. 1 in which a portion allocated to normal data cannot be used.

Accordingly, there is a need for a method for utilizing a configuration of a transport stream more efficiently than known in the related art.

SUMMARY

Exemplary embodiments overcome the above disadvantages and other disadvantages not described above. However, it is understood that an exemplary embodiment is not required to overcome the disadvantages described above, and an exemplary embodiment may not overcome any of the problems described above.

Exemplary embodiments provide a digital broadcast transmitter, a digital broadcast receiver, and methods for configuring and processing streams thereof, which utilize a packet allocated to normal data on a transport stream in various ways, thereby diversifying transmission efficiency of mobile data and also improving reception performance of the transport stream.

According to an aspect of an exemplary embodiment, there is provided a method for configuring a stream of a digital broadcast transmitter, the method including placing mobile data in at least part of packets allocated to normal data among entire packets configuring the stream, and configuring a transport stream with the mobile data.

The method may further include performing encoding, interleaving, trellis encoding, multiplexing with a sync signal, and modulating on the transport stream, and outputting the transport stream.

According to an aspect of another exemplary embodiment, there is provided a digital broadcast transmitter including a data pre-processor to place mobile data in at least part of packets allocated to normal data among entire packets configuring a stream, and a multiplexer to configure a transport stream with the mobile data.

The digital broadcast transmitter may further include an exciter unit to perform encoding, interleaving, and trellis-encoding, modulating the transport stream, multiplexing with a sync signal, and outputting the stream.

According to an aspect of still another exemplary embodiment, there is provided a method for processing a stream of a digital broadcast receiver, the method including receiving a transport stream which is divided into a first area allocated to first mobile data and a second area allocated to normal data, and which includes separate mobile data placed in at least a part of the second area, demodulating the transport stream, equalizing the demodulated transport stream, and decoding at least one of the first mobile data and the new mobile data from the equalized transport stream.

According to an aspect of yet another exemplary embodiment, there is provided a digital broadcast receiver, including a receiver to receive a transport stream which is divided into a first area allocated to first mobile data and a second area allocated to normal data, and which includes new mobile data placed in at least a part of the second area, a demodulator to demodulate the transport stream, an equalizer to equalize the demodulated transport stream, and a decoder to decode at least one of the first mobile data and the new mobile data from the equalized transport stream.

According to exemplary embodiments as described above, a transport stream is configured in various ways, so that a receiver can be provided with diverse types of mobile data.

Additional aspects and advantages will be set forth in the detailed description, will be obvious from the detailed description, or may be learned by practicing the invention.

BRIEF DESCRIPTION OF THE DRAWING FIGURES

The above and/or other aspects will be more apparent by describing in detail exemplary embodiments, with reference to the accompanying drawings in which:

FIGS. 41 to 43 are views illustrating diverse types of slots which are arranged in sequence repeatedly;

DETAILED DESCRIPTION OF EXEMPLARY EMBODIMENTS

Figure 1:
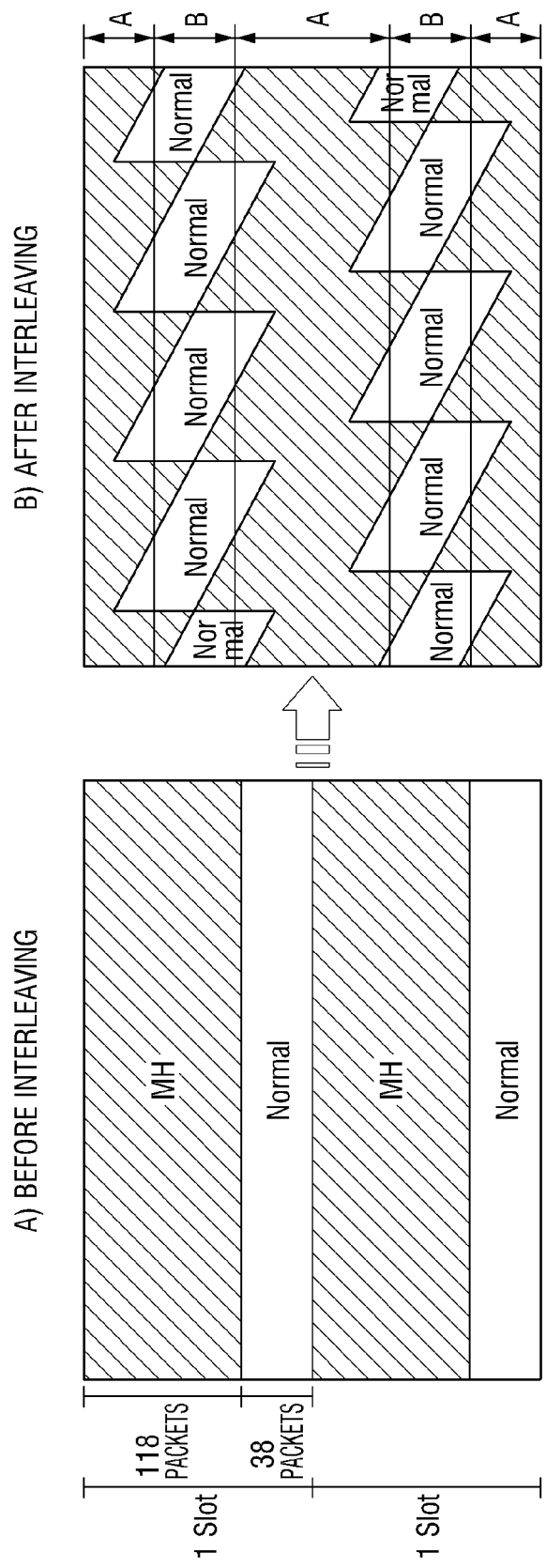
FIG. 1 is a view illustrating an example of a configuration of a transport stream according to the ATSC-MH standard.

Hereinafter, exemplary embodiments will be described in greater detail with reference to the accompanying drawings.

In the following description, same reference numerals are used for the same elements when they are depicted in different drawings. The matters defined in the description, such as detailed constructions and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the invention with unnecessary detail. Expressions such as "at least one of", when preceding a list of elements, modify the entire list of elements and do not modify the individual elements of the list.

[Digital Broadcast Transmitter]

Figure 2:
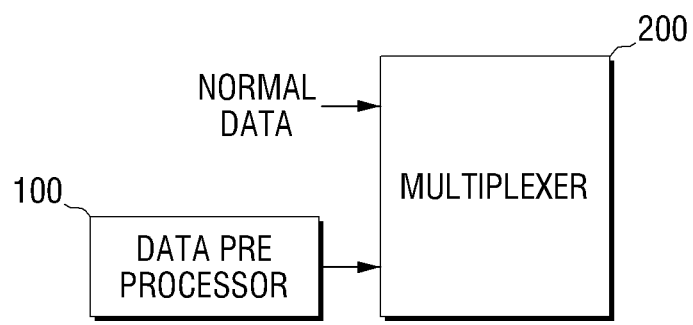
FIGS. 2 to 4 are block diagrams illustrating a digital broadcast transmitter according to various exemplary embodiments.

Referring to FIG. 2, a digital broadcast transmitter according to an exemplary embodiment includes a data pre-processor 100 and a multiplexer 200.

The data pre-processor 100 receives mobile data and processes the mobile data appropriately to convert the mobile data into a format suitable for transmission.

The multiplexer 200 configures a transport stream with the mobile data. Specifically, the multiplexer 200 can multiplex the mobile data output from the data pre-processor 100 with normal data if normal data exists, thereby configuring the transport stream.

The data pre-processor 100 may process the mobile data so that the mobile data is placed in all or some of the packets allocated to normal data of the entire stream.

That is, as shown in FIG. 1, some of the packets are allocated to normal data according to the ATSC-MH standard. More specifically, a stream is divided into a plurality of slots in a time unit as shown in FIG. 1, and one slot includes 156 packets in total. 38 of these packets are allocated to normal data, while the remaining 118 packets are allocated to mobile data. Hereinafter, for convenience of description, the 118 packets are referred to as a first area which is allocated to the mobile data, and the 38 packets are referred to as a second area which is allocated to the normal data. Also, the normal data includes diverse types of general data that can be received and processed by a receiving device (such as a TV), and the mobile data includes a type of data that can be received and processed by a mobile apparatus. The mobile data may be expressed by diverse terms such as robust data, turbo data, and additional data according to situations.

The data pre-processor 100 may place mobile data in the packet area which is allocated to the mobile data and may also separately place mobile data in all or some of the packets which are allocated to the normal data. Mobile data placed in the packets allocated to the mobile data may be referred to as "first mobile data" and the area allocated to the first mobile data may be referred to as the first area, as described above. On the other hand, mobile data placed in the second area, that is, in the packets allocated to the normal data, is referred to as new mobile data. The first mobile data and the new mobile data may be the same or different from each other. The data pre-processor 10 may place the mobile data in various patterns according to, for example, a setting condition of a frame mode and another mode. The patterns in which the mobile data is placed will be explained in detail below.

The multiplexer 200 configures a transport stream. Specifically, if there is normal data to be transmitted, the multiplexer 200 multiplexes the normal data and the stream output from the data pre-processor 100.

Figure 3:
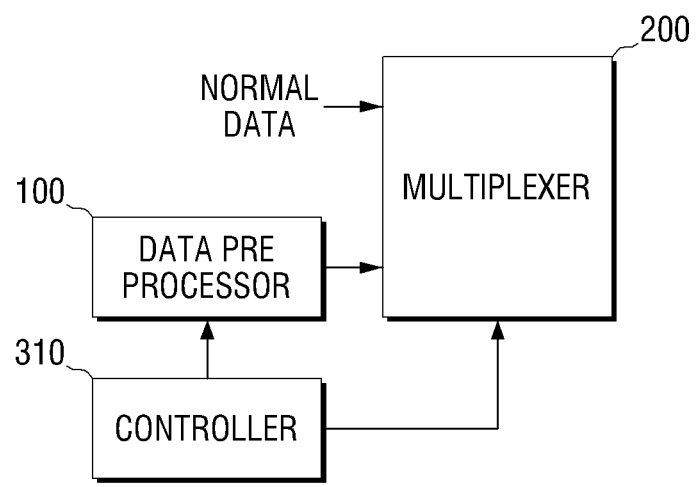

FIG. 3 is a view illustrating another exemplary embodiment in which a controller 310 is further included in the digital broadcast transmitter of FIG. 2. Referring to FIG. 3, the controller 310 of the digital broadcast transmitter determines a setting condition of a frame mode and controls operations of the data pre-processor 100.

More specifically, if it is determined that a first frame mode is set, the controller 310 controls the data pre-processor 100 not to place the mobile data in all of the packets allocated to the normal data and to place the mobile data in the first area. That is, the data pre-processor 100 outputs a stream including only the first mobile data. Accordingly, a transport stream is configured by placing normal data in the packets allocated to the normal data by the multiplexer 200.

If it is determined that a second frame mode is set, the controller 310 controls the data pre-processor 100 to place the first mobile data in the packets allocated to the mobile data, that is, in the first area, and also to place the mobile data in at least some of the packets allocated to the normal data, that is, in a part of the second area.

In this case, the controller 310 may determine a setting condition of a separately provided mode, that is, a mode for determining in how many packets the mobile data is placed among the packets allocated to the normal data. Accordingly, the controller 310 may control the data pre-processor 100 to place the mobile data in a predetermined number of packets which are determined according to the setting condition of the mode among all of the packets allocated to the normal data.

According to various exemplary embodiments, a variety of modes may be provided. For example, the mode may be either a first mode in which the mobile data is placed in some of the packets allocated to the normal data or a second mode in which the mobile data is placed in all of the packets allocated to the normal data.

The first mode herein may be a mode in which the mobile data is placed in a part of a data area of each packet. That is, the mobile data is placed in a part of an entire data area of a packet, while the normal data is placed in the remaining data area of the packet.

Otherwise, the first mode may be a mode in which the mobile data is placed in the entire data area of some packet.

In addition, various modes may be prepared in consideration of the number of packets allocated to the normal data, size, type, transmission time, transmission environment of mobile data, and so on.

In the case that 38 packets are allocated to the normal data as illustrated in FIG. 1, the mode may be set to one of the following modes:

1) a first mode in which the mobile data is placed in 1/4 of packets except for a predetermined number of packets among the 38 packets;

2) a second mode in which the mobile data is placed in 1/2 of packets except for a predetermined number of packets among the 38 packets;

3) a third mode in which the mobile data is placed in 3/4 of packets except for a predetermined number of packets among the 38 packets; and 4) a fourth mode in which the mobile data is placed in all of the 38 packets.

The data pre-processor 100 may insert known data in addition to the mobile data. The known data is a sequence that is commonly known to the digital broadcast transmitter and the digital broadcast receiver. The digital broadcast receiver receives the known data from the digital broadcast transmitter, identifies a difference over a pre-known sequence, and then comprehends a degree of error correction accordingly. The known data may be expressed by different terms such as training data, training sequence, reference signal, and supplemental reference signal, but the term "known data" will be used hereinafter for convenience of description.

The data pre-processor 100 inserts at least one of the mobile data and the known data into diverse portions of the entire transport stream, thereby improving reception performance.

That is, it can seen from b) of FIG. 1 that the mobile data MH is collected in the area "A" and is distributed in the area "B" in a conical form. Accordingly, the area "A" may be referred to as a body area and the area "B" may be referred to as a head/tail area. In the related art MH stream, the head/tail area does not contain known data and thus has a problem that it does not perform as well as the body area.

Accordingly, the data pre-processor 100 inserts the known data into an appropriate location so that the known data can be placed in the head/tail area. The known data may be placed in a pattern of long training sequences in which data over a predetermined size is arranged continuously, or may be placed in a distributed pattern in which data is arranged discontinuously.

The mobile data and the known data may be inserted in various ways according to various exemplary embodiments, some of which will be explained in detail below with reference to the drawings. However, an example of a detailed configuration of the digital broadcast transmitter will be explained first.

[Example of Detailed Configuration of Digital Broadcast Transmitter]

Figure 4:
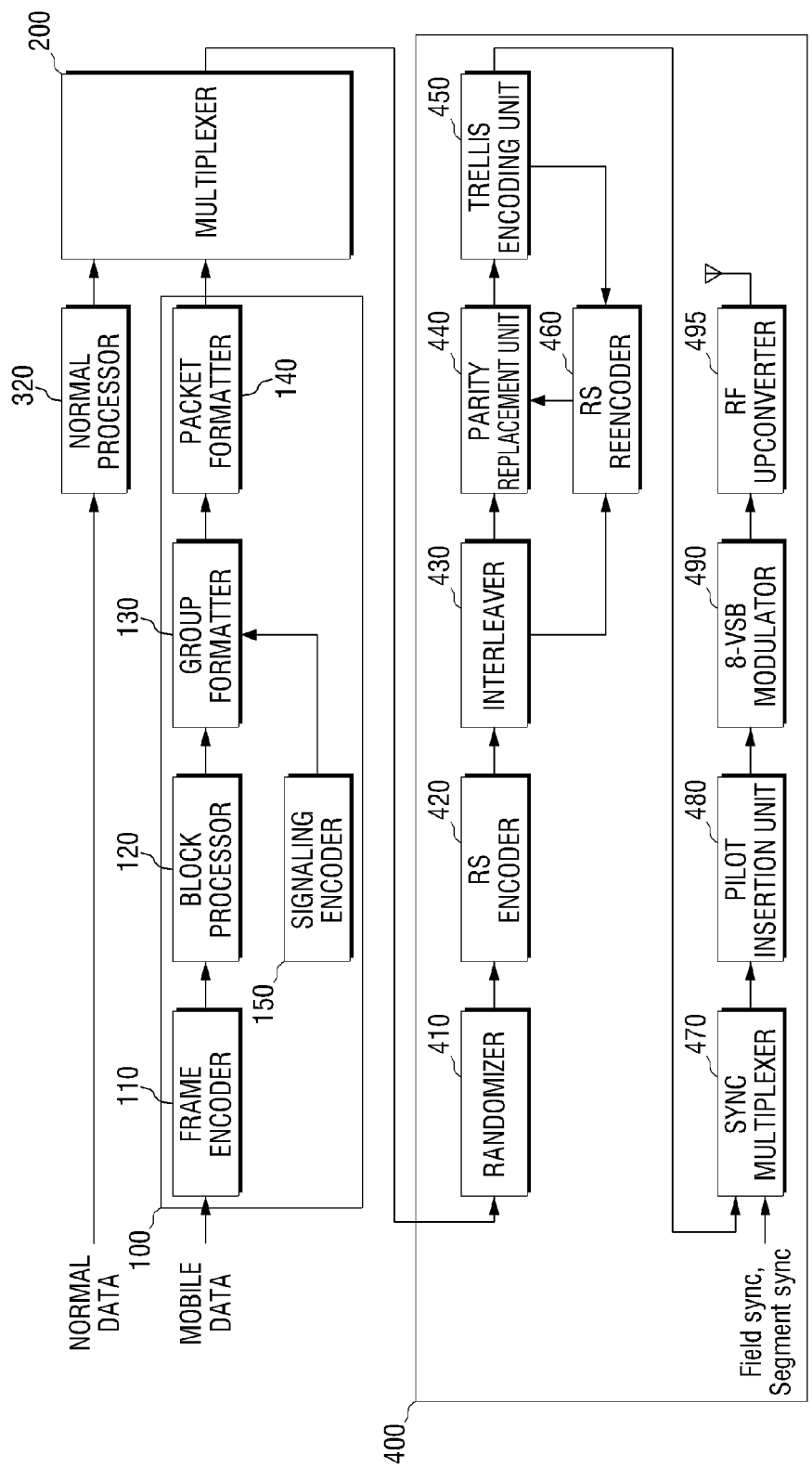

FIG. 4 is a block diagram illustrating an example of a detailed configuration of a digital broadcast transmitter according to an exemplary embodiment. Referring to FIG. 4, the digital broadcast transmitter may include a normal processor 320 and an exciter unit 400 in addition to the data pre-processor 100 and the multiplexer 200. The controller 310 of FIG. 3 is omitted from FIG. 4, though it is understood that the controller 310 can be included in the digital broadcast transmitter. Also, some elements may be deleted from the digital broadcast transmitter of FIG. 4 or one or more new elements may be added, according to other exemplary embodiments. Also, the arrangement order and the number of elements may vary according to various exemplary embodiments.

Referring to FIG. 4, the normal processor 320 receives normal data and converts the normal data into a format suitable for configuring a transport stream. That is, since the digital broadcast transmitter configures a transport stream including normal data and mobile data and transmits the transport stream, a related art digital broadcast receiver for normal data may be able to receive and process the normal data appropriately. Accordingly, the normal processor 320 adjusts a packet timing and a presentation clock reference (PCR) of the normal data (which may be referred to as main service data) so as to make the normal data format suitable for the MPEG/ATSC standard which is used to decode normal data. A detailed description thereof is disclosed in ANNEX B of ATSC-MH, the disclosure of which is incorporated herein in its entirety by reference, and thus is omitted herein.

The data pre-processor 100 includes a frame encoder 110, a block processor 120, a group formatter 130, a packet formatter 140, and a signaling encoder 150.

The frame encoder 110 performs Reed-Solomon (RS) frame encoding. More specifically, the frame encoder 110 receives a single service and builds a predetermined number of RS frames. For example, if a single service is an M/H ensemble unit including a plurality of M/H parades, a predetermined number of RS frames are built for each M/H parade. In particular, the frame encoder 110 randomizes input mobile data, performs RS-CRC encoding, divides each RS frame according to a pre-set RS frame mode, and outputs a predetermined number of RS frames.

Figure 5:
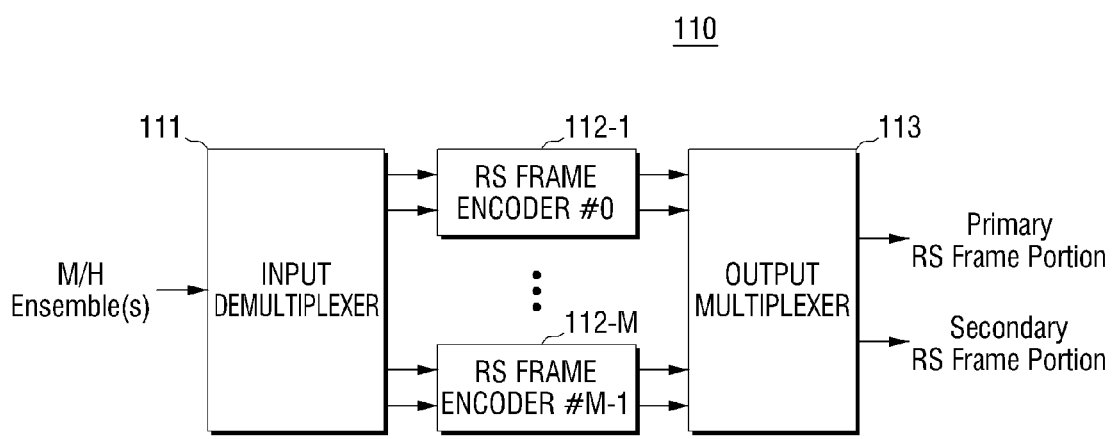
FIG. 5 is a block diagram illustrating an example of a frame encoder.

FIG. 5 is a block diagram illustrating an example of the frame encoder 110. Referring to FIG. 5, the frame encoder 110 includes an input demultiplexer 111, a plurality of RS frame encoders 112-1~112-M, and an output multiplexer 113.

If mobile data of a predetermined service unit (for example, an M/S ensemble unit) is input, the input demultiplexer 111 demultiplexes the mobile data into a plurality of ensembles such as a primary ensemble and a secondary ensemble according to pre-set configuration information (e.g., an RS frame mode), and outputs the demultiplexed ensembles to each RS frame encoder 112-1~112-M. Each RS frame encoder 112-1~122-M performs randomization, RS-CRC encoding, and dividing with respect to the input ensembles, and outputs the ensembles to the output multiplexer 113. The output multiplexer 113 multiplexes frame portions output from each RS frame encoder 112-1~112-M and outputs a primary RS frame portion and a secondary RS frame portion. In this case, only the primary RS frame portion may be output according to a setting condition of an RS frame mode.

Figure 6:
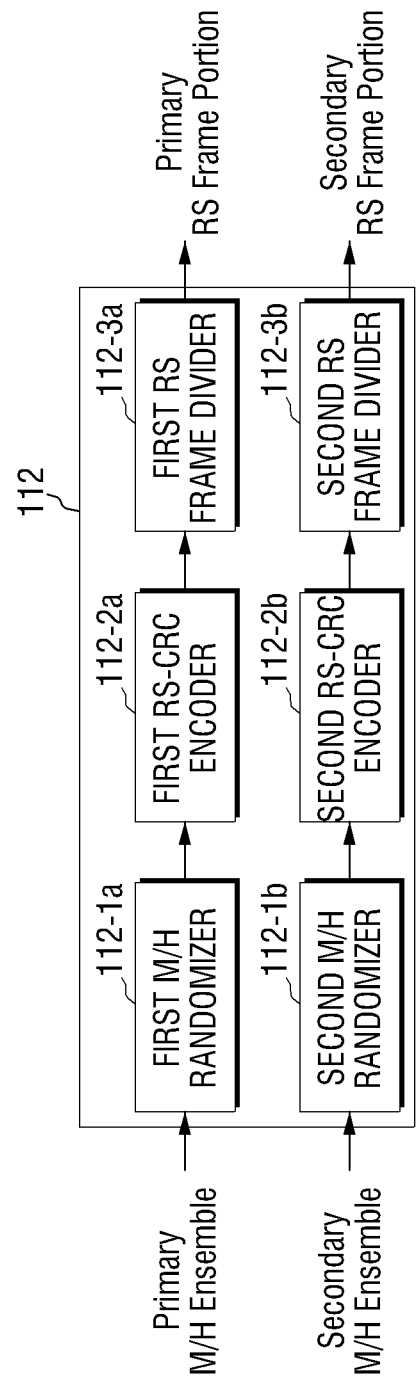
FIG. 6 is a block diagram illustrating an example of a Reed-Solomon (RS) frame encoder of the frame encoder of FIG. 5.

FIG. 6 is a block diagram illustrating an example of one of the RS frame encoders 112-1~112-M. Referring to FIG. 6, the frame encoder 112 includes a plurality of M/H randomizers 112-1a, 112-1b, a plurality of RS-CRC encoders 112-2a, 112-2b, and a plurality of RS frame dividers 112-3a, 112-3b. If the primary M/H ensemble and the secondary M/H ensemble are input from the input demultiplexer 111, the M/H randomizers 112-1a and 112-1b perform randomization and the RS-CRC encoders 112-2a and 112-2b perform RS-CRC encoding for the randomized data. The RS frame dividers 112-3a, 112-3b divide data to be block-coded appropriately and outputs the data to the output multiplexer 113 so that the block processor 120 disposed at the rear end of the frame encoder 110 block-codes the data appropriately. The output multiplexer 113 combines and multiplexes the frame portions and outputs the frame portions to the block processor 120 so that the block processor 120 block-codes the frame portions.

The block processor 120 codes a stream output from the frame encoder 110 by a block unit. That is, the block processor 120 performs block-coding.

Figure 7:
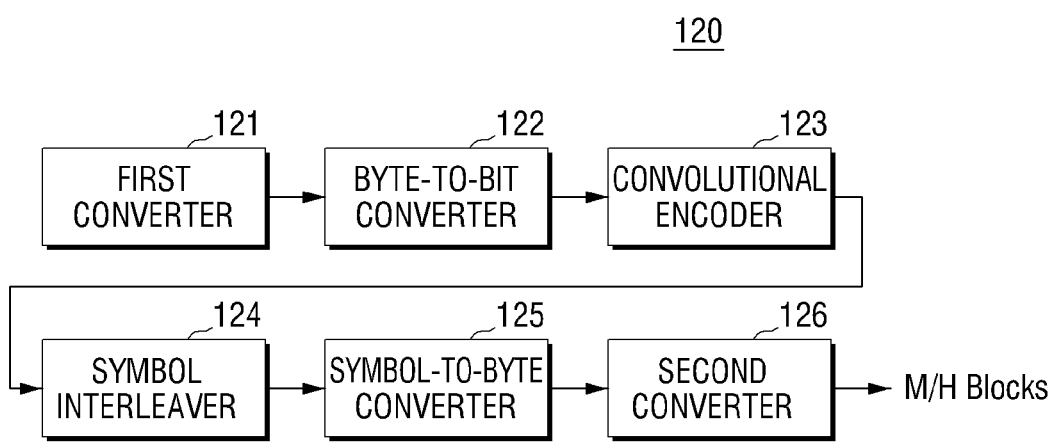
FIG. 7 is a block diagram illustrating an example of a block processor.

FIG. 7 is a block diagram illustrating an example of the block processor 120.

Referring to FIG. 7, the block processor 120 includes a first converter 121, a byte-to-bit converter 122, a convolutional encoder 123, a symbol interleaver 124, a symbol-to-byte converter 125, and a second converter 126.

The first converter 121 converts the RS frame output from the frame encoder 110 on a block basis. That is, the first converter 121 combines the mobile data in the RS frame according to a preset block mode and outputs a serially concatenated convolutional code (SCCC) block.

For example, if the block mode is "00", a single M/H block is converted into a single SCCC block.

Figure 8:
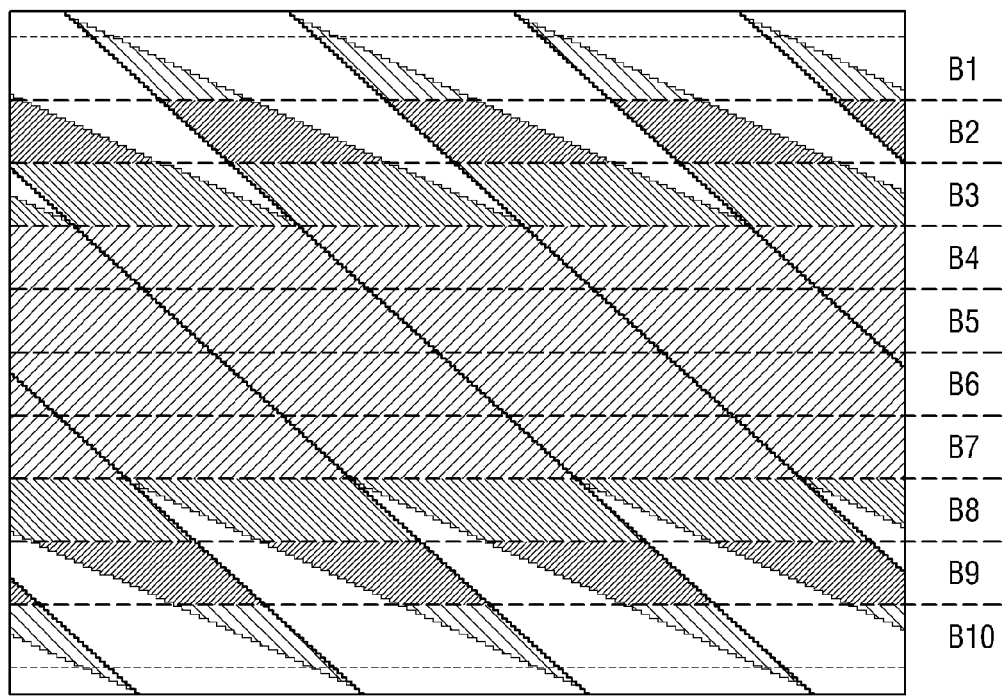
FIG. 8 is a view illustrating an example of dividing a stream into blocks.

FIG. 8 is a view illustrating M/H blocks which are a result of dividing mobile data on a block basis. Referring to FIG. 8, a single mobile data unit, for example, a M/H group, is divided into 10 M/H blocks B1~B10. If the block mode is "00", each block B1~B10 is converted into a SCCC block. If the block mode is "01", two M/H blocks are combined to form a single SCCC block and the SCCC block is output. The combination pattern may be diversely set according to various exemplary embodiments. For example, blocks B1 and B6 are combined to form a block SCB1 and blocks B2 and B7, blocks B3 and B8, blocks B4 and B9, and blocks B5 and B10 are combined to form blocks SCB2, SCB3, SCB4, and SCB5, respectively. According to the other block modes, blocks are combined in various ways and the number of combined blocks is variable.

The byte-to-bit converter 122 converts the SCCC block from a byte unit into a bit unit. This is because the convolutional encoder 123 operates on a bit basis. Accordingly, the convolutional encoder 123 performs convolutional encoding with respect to the converted data.

After that, the symbol interleaver 124 performs symbol interleaving. The symbol interleaving may be performed in the same way as the block interleaving. The symbol-interleaved data is converted into a byte unit by the symbol-to-byte converter 125 and is then reconverted into an M/H block unit by the second converter 126 and output.

The group formatter 130 receives the stream which is processed by the block processor 120 and formats the stream on a group basis. More specifically, the group formatter 130 maps the data output from the block processor 120 onto an appropriate location within the stream, and adds known data, signaling data, and initialization data to the stream.

In addition, the group formatter 130 adds a place holder byte for normal data, an MPEG-2 header, non-systematic RS parity and a dummy byte for conforming to a group format.

The signaling data refers to diverse information for processing the transport stream. The signaling data may be appropriately processed by the signaling encoder 150 and may be provided to the group formatter 130.

A transmission parameter channel (TPC) and a fast information channel (FIC) may be used to transmit the mobile data. The TPC is used to provide various parameters such as various forward error correction (FEC) mode information and M/H fame information. The FIC is used for a receiver to obtain a service swiftly and includes cross layer information between a physical layer and an upper layer. If such TPC information and FIC information are provided to the signaling encoder 150, the signaling encoder 150 processes the information appropriately and provides the processed information as signaling data.

Figure 9:
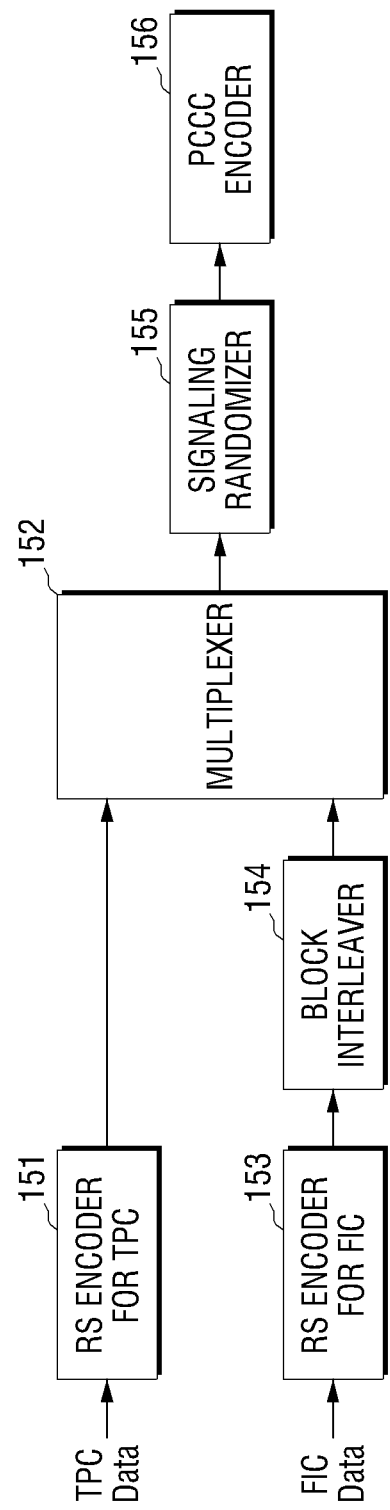
FIG. 9 is a block diagram illustrating an example of a signaling encoder.

FIG. 9 is a block diagram illustrating an example of the signaling encoder 150.

Referring to FIG. 9, the signaling encoder 150 includes an RS encoder for a TPC 151, a multiplexer 152, an RS encoder for a FIC 153, a block interleaver 154, a signaling randomizer 155, and a PCCC encoder 156. The RS encoder for the TPC 151 performs RS-encoding for input TPC data to form a TPC codeword. The RS encoder for the FIC 153 and the block interleaver 154 perform RS-encoding and block-interleaving for input FIC data to form an FIC codeword. The multiplexer 152 places the FIC code word after the TPC code word to form a series of sequences. The formed sequences are randomized by the signaling randomizer 155 and are coded into a parallel concatenated convolutional code (PCCC) by the PCCC encoder 156, and are then output to the group formatter 130 as signaling data.

The known data is a sequence that is commonly known to the digital broadcast transmitter and the digital broadcast receiver, as described above. The group formatter 130 inserts the known data into an appropriate location according to a control signal provided from an additional element, such as the controller 310, so that the known data is placed in an appropriate location in the stream after being interleaved by the exciter unit 400. For example, the known data may be inserted into an appropriate location so as to be placed even in the area "B" of the stream of b) of FIG. 1. The group formatter 130 determines a location where the known data is to be inserted with reference to an interleaving rule.

The initial data refers to data based on which the trellis encoder 450 provided in the exciter unit 400 initializes internal memories at a proper time. The initial data will be described in detail when the exciter unit 400 is described.

The group formatter 130 may include a group format configuring unit (not shown) to insert various areas and signals into the stream and configure the stream as a group format, and a data deinterleaver to deinterleave the stream configured as the group format.

The data deinterleaver rearranges data in the reverse order of the interleaver 430 located at the rear end with reference to the stream. The stream deinterleaved by the data deinterleaver may be provided to the packet formatter 140.

The packet formatter 140 may remove diverse place holders which are provided to the stream by the group formatter 130, and may add an MPEG header having a packet identifier (PID) of mobile data to the stream. Accordingly, the packet formatter 140 outputs the stream in the unit of a predetermined number of packets for every group. For example, the packet formatter 140 may output 118 TS packets.

The data pre-processor 100 is implemented in various ways as described above to configure mobile data in an appropriate form. For example, in the case that a plurality of mobile services is provided, each element of the data pre-processor 100 may be a plurality of elements.

The multiplexer 200 multiplexes a normal stream processed by the normal processor 320 and a mobile stream processed by the data pre-processor 100, thereby configuring a transport stream. The transport stream output from the multiplexer 200 includes normal data and mobile data and may further include known data to improve reception performance.

The exciter unit 400 performs encoding, interleaving, trellis encoding, and modulation with respect to the transport stream configured by the multiplexer 200, and outputs the processed transport stream. The exciter unit 400 may be referred to as a data post-processor in some exemplary embodiments.

Referring to FIG. 4, the exciter unit 400 includes a randomizer 410, an RS encoder 420, an interleaver 430, a parity replacement unit 440, a trellis encoding unit 450, an RS re-encoder 460, a sync multiplexer 470, a pilot insertion unit 480, an 8-VSB modulator 490, and an RF upconverter 495.

The randomizer 410 randomizes the transport stream output from the multiplexer 200. The randomizer 410 may perform the same function as a randomizer according to the ATSC standard.

The randomizer 410 may perform an XOR operation with respect to the MPEG header of the mobile data and the entire normal data with a pseudo random binary sequence (PRBS) which may be 16 bits long or longer, but may not perform an XOR operation with respect to a payload byte of the mobile data. However, even in this case, a PRBS generator continues to perform shifting of a shift register. That is, the randomizer 410 bypasses the payload byte of the mobile data.

The RS encoder 420 performs RS encoding with respect to the randomized stream.

More specifically, if a portion corresponding to the normal data is input, the RS encoder 420 performs systematic RS encoding in the same way as in a related art ATSC system. That is, the RS encoder 420 adds a parity of 20 bytes to an end of each packet of 187 bytes. On the other hand, if a portion corresponding to the mobile data is input, the RS encoder 420 performs non-systematic RS encoding. In this case, the RS FEC data of 20 bytes, which is obtained by the non-systematic RS encoding, is placed in a predetermined parity byte location within each packet of the mobile data. Accordingly, the data has a compatibility with a receiver according to the related art ATSC standard. If both of the MPEG PID and the RS parity are used for mobile data, the RS encoder 420 may be bypassed.

The interleaver 430 interleaves the stream encoded by the RS encoder 420. Interleaving may be performed in the same way as in a conventional ATSC system. That is, the interleaver 430 selects a plurality of channels, which are made up of different numbers of shift registers, in sequence using a switch and performs writing and reading of the data. As a result, a predetermined number of interleavings are performed according to the number of shift registers in a corresponding channel.

The parity replacement unit 440 corrects the parity that is changed as a result of initializing memories by the trellis encoding unit 450 at the rear end of the stream. If both of the MPEG PID and the RS parity are used for mobile data, the parity replacement unit 440 may be bypassed.

That is, the trellis encoding unit 450 receives the interleaved stream and performs trellis encoding. The trellis encoding unit 450 uses 12 trellis encoders in general. Accordingly, the trellis encoding unit 450 may use a demultiplexer to divide the stream into 12 independent streams and output the streams to the trellis encoders and a multiplexer to combine the streams trellis-encoded by the trellis encoders into a single stream.

Each of the trellis encoders uses a plurality of internal memories to perform trellis encoding by performing a logical operation with respect to a newly input value and a value pre-stored in the internal memory.

As described above, the transport stream may include known data. The known data refers to a sequence that is commonly known to the digital broadcast transmitter and the digital broadcast receiver. The digital broadcast receiver checks the state of the received known data and determines a degree of error correction accordingly. The known data may be transmitted in a state as known to the digital broadcast receiver. However, since the value stored in the internal memory provided in the trellis encoder is not known, the internal memories are initialized to an arbitrary value prior to the known data being input to the trellis encoder. Accordingly, the trellis encoding unit 450 initializes the memory prior to trellis encoding the known data. The memory initialization may be referred to as a "trellis reset".

Figure 10:
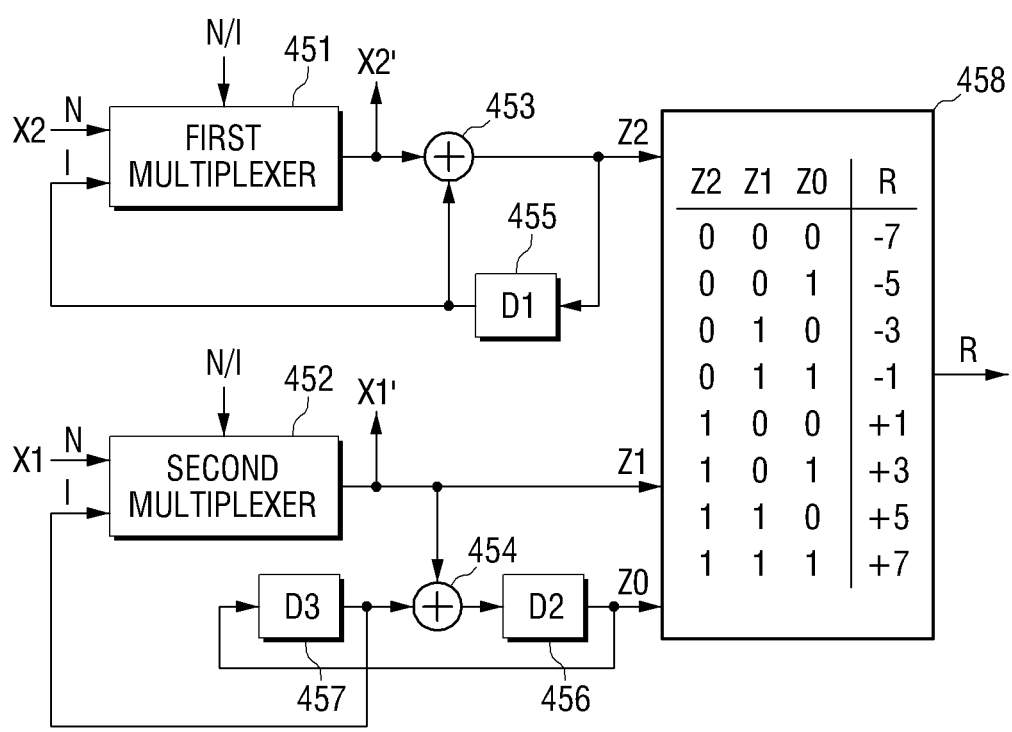
FIGS. 10 to 13 are views illustrating diverse examples of a trellis encoder.

FIG. 10 is view illustrating an example of one of the plurality of trellis encoders provided in the trellis encoding unit 450.

Referring to FIG. 10, the trellis encoder includes a first multiplexer 451, a second multiplexer 452, a first adder 453, a second adder 454, a first memory 455, a second memory 456, a third memory 457, and a mapper 458.

The first multiplexer 451 receives data N of the stream and a value I stored in the first memory 455 and outputs a single value N or I according to a control signal N/I. More specifically, a control signal to select I is applied when a value corresponding to an initialization data section is input so that the first multiplexer 451 outputs I. N is output in the other section. Likewise, the second multiplexer 452 outputs I when a value corresponding to an initialization data section is input.

Accordingly, if a value corresponding to a section other than the initialization data section is input, the first multiplexer 451 outputs the input value to the rear end as is. The output value is input to the first adder 453 along with a value pre-stored in the first memory 455. The first adder 453 performs a logical operation such as XOR with respect to the input values and outputs Z2. In this state, if a value corresponding to the initialization data section is input, the value stored in the first memory 455 is selected by the first multiplexer 451 and output. Accordingly, since the two same values are input to the first adder 453, a value of the logical operation is a constant value. That is, the XOR produces a 0 output. Since the output value from the first adder 453 is input to the first memory 455 as is, the first memory 455 is initialized to a value 0.

If a value corresponding to the initialization data section is input, the second multiplexer 452 selects a value stored in the third memory 457 as is and outputs the value. The output value is input to the second adder 454 along with a value stored in the third memory 457. The second adder 454 performs a logical operation with respect to the two same values and outputs a resulting value to the second memory 456. Since the values input to the second adder 454 are the same, a logical operation value for the same values (for example, a result value 0 of XOR) is input to the second memory 456. Accordingly, the second memory 456 is initialized. On the other hand, the value stored in the second memory 456 is shifted to and stored in the third memory 457. Accordingly, when next initialization data is input, a current value of the second memory 456, that is, a value 0, is input to the third memory 457 as is so that the third memory 457 is also initialized.

The mapper 458 receives the values output from the first adder 453, the second multiplexer 452, and the second memory 456, and maps these values onto a corresponding symbol value R and outputs the mapped values. For example, if Z0, Z1, and Z2 are output as 0, 1, and 0, the mapper 458 outputs a −3 symbol.

Since the RS encoder 420 is located before the trellis encoding unit 450, a parity has already been added to the value input to the trellis encoding 450. Accordingly, the parity is changed according to the change in some value of data caused by the initialization at the trellis encoder 450.

Specifically, the RS reencoder 460 changes the value of the initialization data section using X1' and X2' output from the trellis encoding unit 450, thereby generating a new parity. The RS reencoder 460 may be referred to as a non-systematic RS encoder.

Although in an exemplary embodiment of FIG. 10, the memory is initialized to a value "0", the memory may be initialized to another value in another exemplary embodiment.

Figure 11:
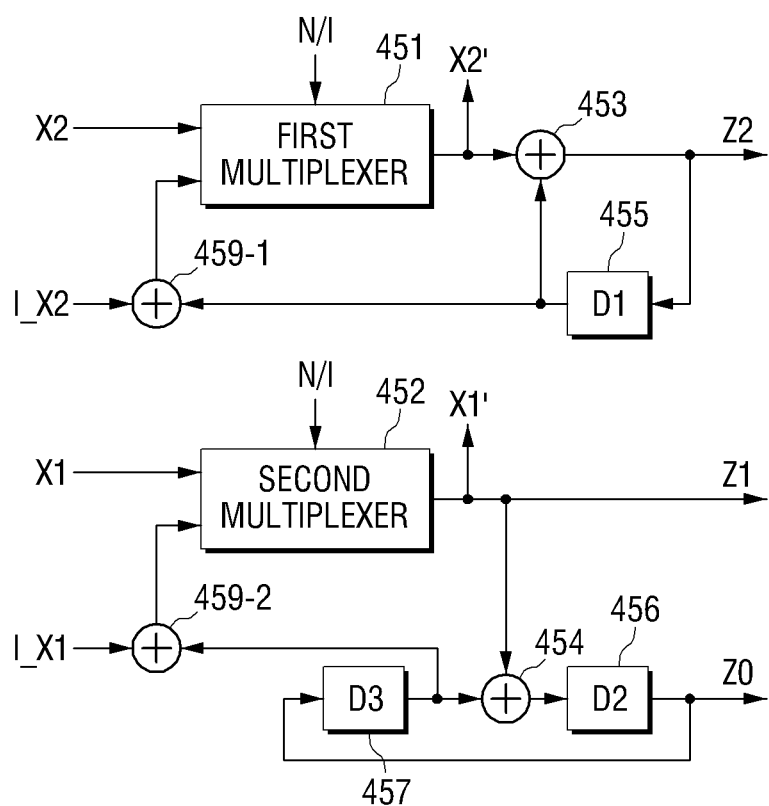

FIG. 11 is a view illustrating a trellis encoder according to another exemplary embodiment.

Referring to FIG. 11, the trellis encoder includes a first multiplexer 451, a second multiplexer 452, first through fourth adders 453, 454, 459-1, 459-2, and first through third memories 455, 456, 457. The mapper 458 is omitted from FIG. 11.

The first multiplexer 451 may output one of a stream input value X2 and a value of the third adder 459-1. The third adder 459-1 receives I_X2 and a storage value of the first memory 455. The I_X2 refers to a memory reset value input from an external source. For example, in order to initialize the first memory 455 to "1", I_X2 is input as "1". If the first memory 455 stores a value "0", the third adder 459-1 outputs a value "1" and, thus, the first multiplexer 451 outputs a value "1". Accordingly, the first adder 453 performs XOR with respect to the output value "1" from the first multiplexer 451 and the storage value "0" in the first memory 455 and stores a resulting value "1" in the first memory 455. As a result, the first memory 455 is initialized to "1".

Likewise, the second multiplexer 452 selects the output value from the fourth adder 459-2 in the initialization data section and outputs the value. The fourth adder 459-2 outputs a resulting value of XOR for a memory reset value I_X1 input from an external source and a value of the third memory 457. Assuming that the second memory 456 and the third memory 457 store values "1" and "0", respectively, and the second memory 456 and the third memory 457 are intended to be initialized to "1" and "1", respectively, the second multiplexer 452 outputs a resulting value "1" of XOR for the value "0" stored in the third memory 457 and the I_X1 value "1". The output value "1" is input to the second adder 454 and the second adder 454 outputs a resulting value "1" of XOR for the value "1" and the value "0" stored in the third memory 457 to the second memory 456. The original value "1" stored in the second memory 456 is shifted to the third memory 457 so that the third memory 457 is initialized to "1". In this state, if the second I_X1 is input as "1" too, a resulting value "0" of XOR for the input value "1" and the value "1" of the third memory 457 is output from the second multiplexer 452. The second adder 454 performs an XOR operation on the value "0" output from the second multiplexer 452 and the value "1" stored in the third memory 457, thereby producing a resulting value "1", and inputs the resulting value "1" to the second memory 456. The value "1" stored in the second memory 456 is shifted to and stored in the third memory 457. As a result, the second memory 456 and the third memory 457 are both initialized to "1".

Figure 12:
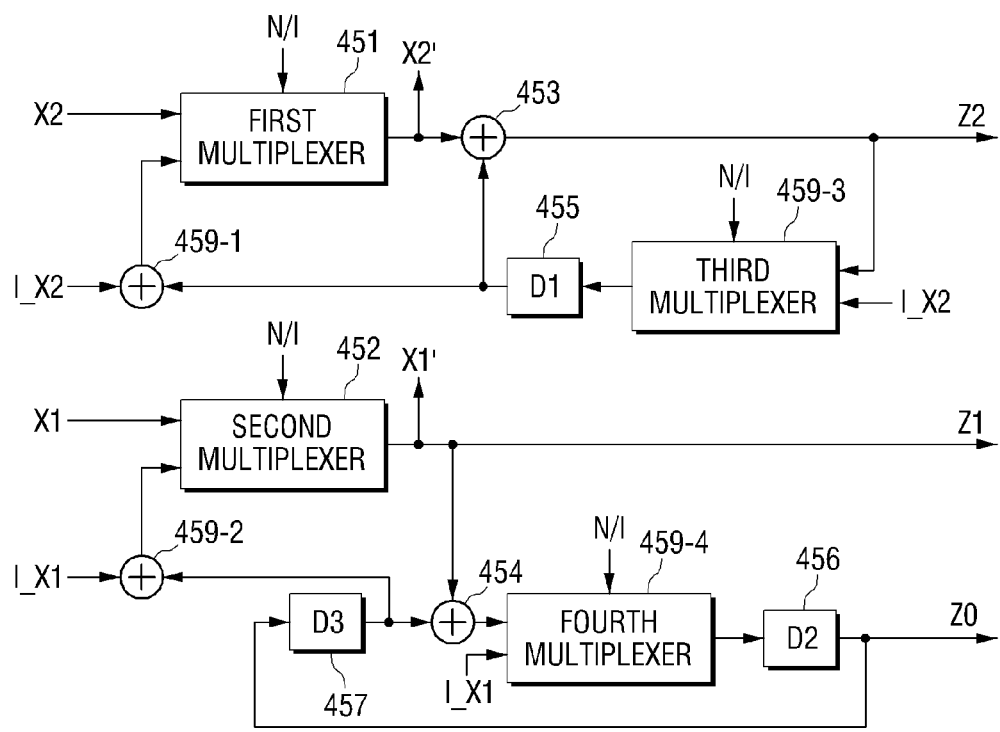
Figure 13:
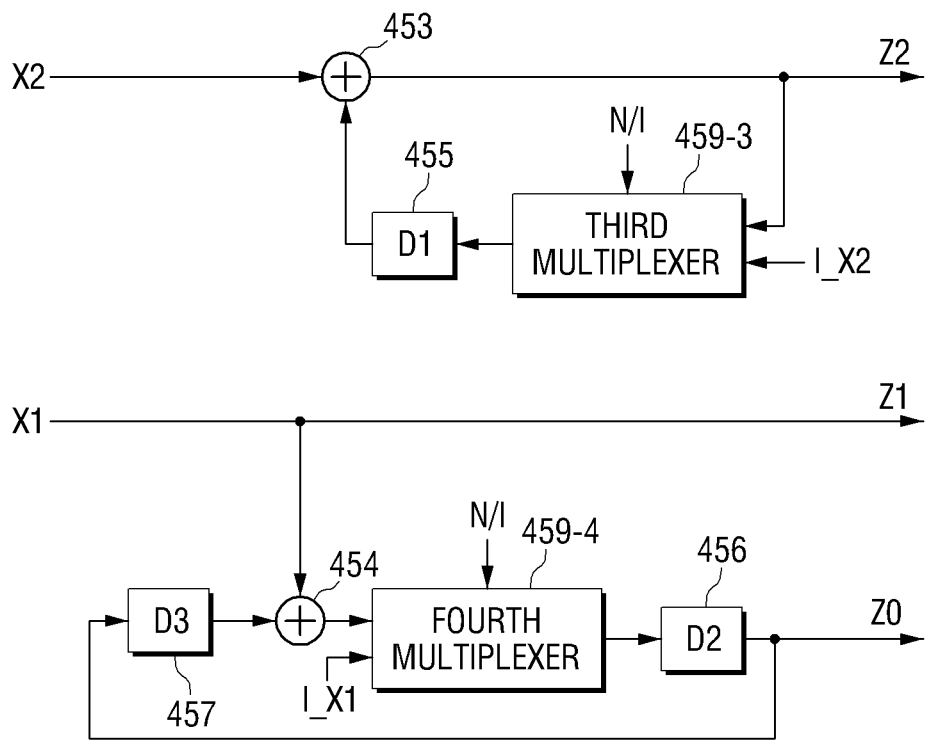

FIGS. 12 and 13 illustrate a trellis encoder according to various exemplary embodiments.

Referring to FIG. 12, the trellis encoder may further include a third multiplexer 459-3 and a fourth multiplexer 459-4 in addition to the configuration of FIG. 11. The third and the fourth multiplexers 459-3 and 459-4 output values output from the first and the second adders 453 and 454 or values I_X2 and I_X1 according to the control signal N/I. Accordingly, the first through the third memories 455, 456, 457 can be initialized to a desired value.

FIG. 13 illustrates a trellis encoder with a more simplified configuration. Referring to FIG. 13, the trellis encoder may include first and second adders 453, 454, first through third memories 455, 456, 457, and third and fourth multiplexers 459-3, 459-4. Accordingly, the first through the third memories 455, 456, 457 are initialized according to the values I_X1 and I_X2 input to the third and the fourth multiplexers 459-3 and 459-4. That is, referring to FIG. 13, the values I_X2 and I_X1 are input to the first memory 455 and the second memory 456 as they are so that the first memory 455 and the second memory 456 are initialized to the values I_X2 and I_X1.

A further detailed description of the trellis encoder of FIGS. 12 and 13 is omitted.

Referring back to FIG. 4, the sync multiplexer 470 adds a field sync and a segment sync to the stream trellis-encoded by the trellis encoding unit 450.

As described above, if the data pre-processor 100 places the mobile data even in the packets allocated to the normal data, the digital broadcast transmitter should inform the digital broadcast receiver that there exists new mobile data. The existence of new mobile data may be informed in various ways, one of which is a method using a field sync. This will be described in detail below.

The pilot insertion unit 480 inserts a pilot into the transport stream that is processed by the sync multiplexer 470, and the 8-VSB modulator 490 modulates the transport stream according to an 8-VSV modulation scheme. The RF upconverter 495 converts the modulated stream into an upper RF band signal for transmission and transmits the converted signal through an antenna.

As described above, the transport stream is transmitted to the receiver with the normal data, the mobile data, and the known data being included therein.

Figure 14:
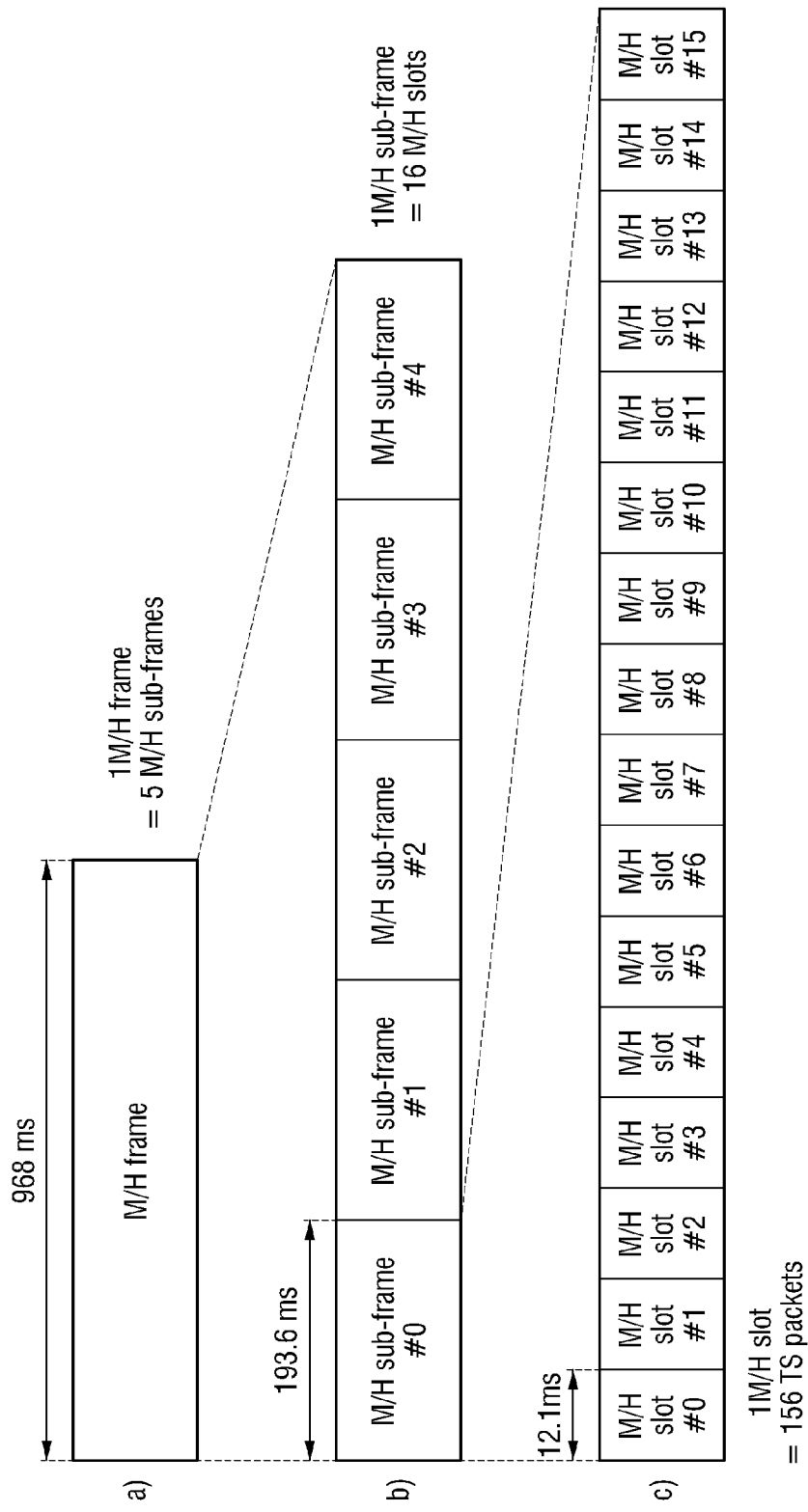
FIG. 14 is a view illustrating an example of a structure of a mobile data frame.

FIG. 14 is a view to explain a unit structure of a mobile data frame, that is, an M/H frame of the transport stream. Referring to a) and b) of FIG. 14, one M/H frame has a size of 968 ms in total in a time unit and is divided into 5 sub-frames. One sub-frame has a time unit of 193.6 ms and is divided into 16 slots as shown in c) of FIG. 14. Each slot has a time unit of 12.1 ms and includes 156 transport stream packets in total. As described above, 38 of these packets are allocated to the normal data and the remaining 118 packets are allocated to the mobile data. That is, one M/H group is made up of 118 packets.

In this state, the data pre-processor 100 places the mobile data and the known data even in the packets allocated to the normal data, thereby improving transmission efficiency of data and reception performance.

[Various Exemplary Embodiments of Changed Transport Stream]

FIGS. 15 to 21 are views illustrating configurations of a transport stream according to various exemplary embodiments.

Figure 15:
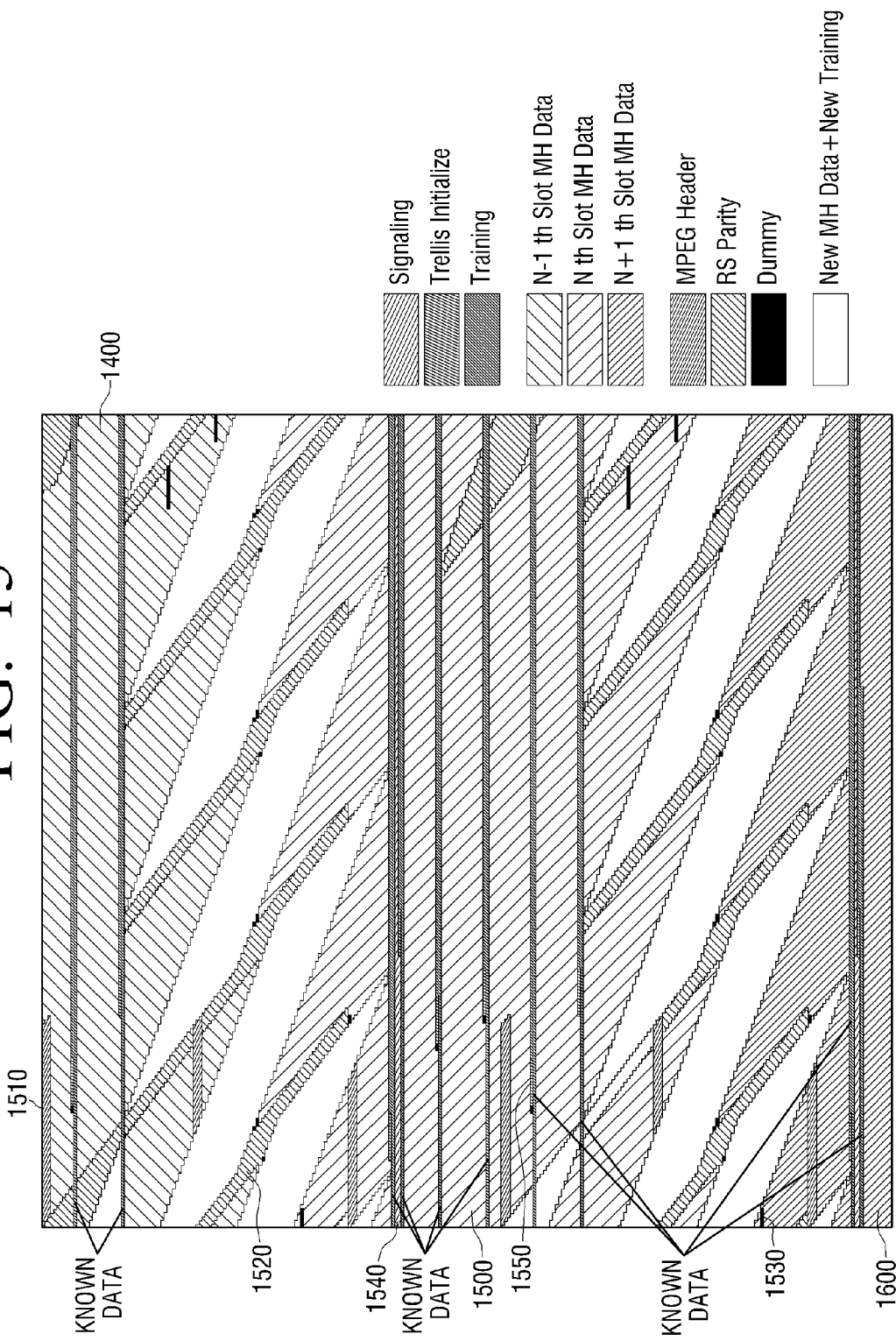
FIGS. 15 to 21 are views illustrating examples of configurations of a stream according to various exemplary embodiments.

FIG. 15 illustrates a simple variation configuration of a transport stream. That is, FIG. 15 illustrates a stream configuration after interleaving in a situation where the mobile data is placed in the packets allocated to the normal data, that is, in the second area. In the stream of FIG. 15, known data is placed in the second area along with the mobile data.

Accordingly, even the portion which is not used for mobile data in the related-art ATSC-MH, that is, 38 packets, may be used for mobile data. Also, since the second area is used independently from the first mobile data area (first area), one or more additional services may be provided. If new mobile data is to be used as the same service as the first mobile data, data transmission efficiency can be further improved.

If the new mobile data and the known data are transmitted together as shown in FIG. 15, the digital broadcast receiver may be notified of the existence or location of the new mobile data and the known data using singling data or field sync.

Placing the mobile data and the known data may be performed by the data pre-processor 100. More specifically, the group formatter 130 of the data pre-processor 100 may place the mobile data and the known data even in the 38 packets.

It can be seen from FIG. 15 that the known data is placed in the body area where the first mobile data are collected in the pattern of 6 long training sequences. Also, the signaling data is located between the first and the second long training sequences for the sake of achieving error robustness of the signaling data. On the other hand, the known data may be placed in the packets allocated to the normal data in a distributed pattern other than the long training sequence pattern.

As shown in FIG. 15, the transport stream may include an MPEG header portion 1510, an RS parity area 1520, a dummy area 1530, signaling data 1540, and initialization data 1550. It can be seen from FIG. 15 that the initialization data is located right before the known data. The initialization data refers to data corresponding to the initialization data section. Also, the transport stream may further include N−$1^{st}$ slot M/H data 1400, Nth slot M/H data 1500, and N+$1^{st}$ slot M/H data 1600.

Figure 16:
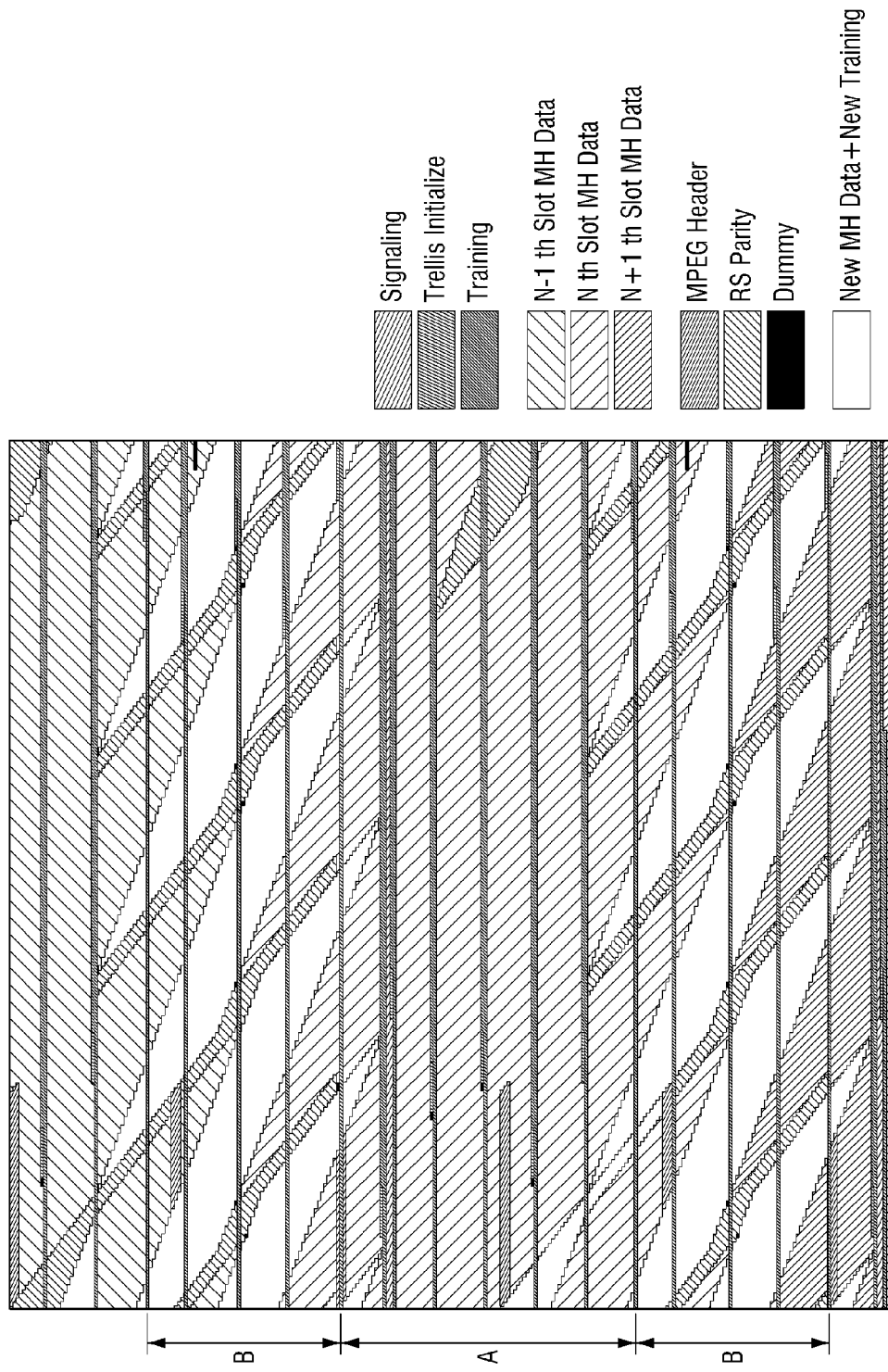

FIG. 16 illustrates a configuration of a transport stream for transmitting the mobile data and the known data using both the packets allocated to the normal data, i.e., the second area, and a part of the first area allocated to the first mobile data.

Referring to FIG. 16, in the area "A", i.e., the body area where the conventional mobile data is collected, the known data is arranged in a pattern of 6 long training sequences. Also, in the area "B", the known data is arranged in a pattern of long training sequences. In order to arrange the known data in the area "B" in the pattern of long training sequences, the known data is included in not only the 38 packets area but also some of 118 packets allocated to the first mobile data. New mobile data is placed in the remaining area of the 38 packets not including the known data. Accordingly, the area "B" shows improved error correction performance.

On the other hand, by newly adding known data to a part of the area for the first mobile data, an additional process such as adding information regarding a location of the new known data to the existing signaling data and configuring a header of the existing mobile packet into which the new known data is inserted in a format that cannot be recognized by a related art mobile data receiver, such as a null packet format, may be performed for the sake of obtaining compatibility with the related art mobile data receiver. Accordingly, the related art mobile data receiver does not malfunction because the related art mobile data receiver does not recognize the newly added known data.

Figure 17:
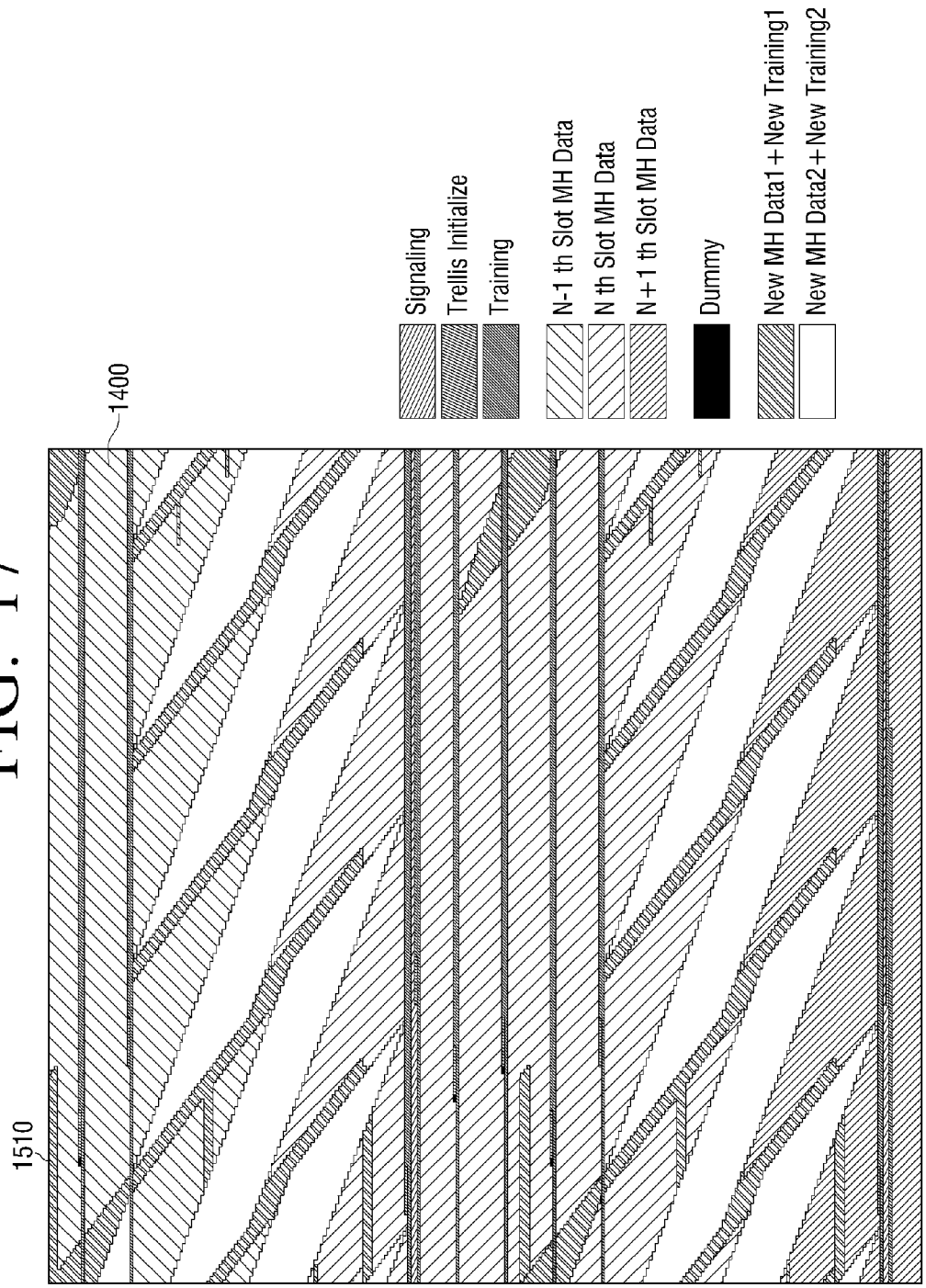

FIG. 17 illustrate a configuration of a stream in which at least one of mobile data and known data is placed even in a location such as the MPEG header, the RS parity, at least a part of the dummy, and the existing M/H data. In this case, a plurality of new mobile data can be placed according to locations.

That is, it can be seen from FIG. 17 that new mobile data and new known data are placed in the MPEG header, the RS parity, and a part of the dummy. The mobile data inserted in the aforementioned location may be different from or the same as the mobile data inserted into the normal data packet.

The new mobile data may be located in all of the first mobile data area in addition to the aforementioned location.

The stream shown in FIG. 17 contributes to a high transmission efficiency of the mobile data and the known data compared to those of FIGS. 15 and 16. In particular, the stream of FIG. 17 makes it possible to provide a plurality of mobile data.

Also, in the case of the stream of FIG. 17, it can be notified whether new mobile data is added or not by including new signaling data to the new mobile data area using existing signaling data or field sync.

Figure 18:
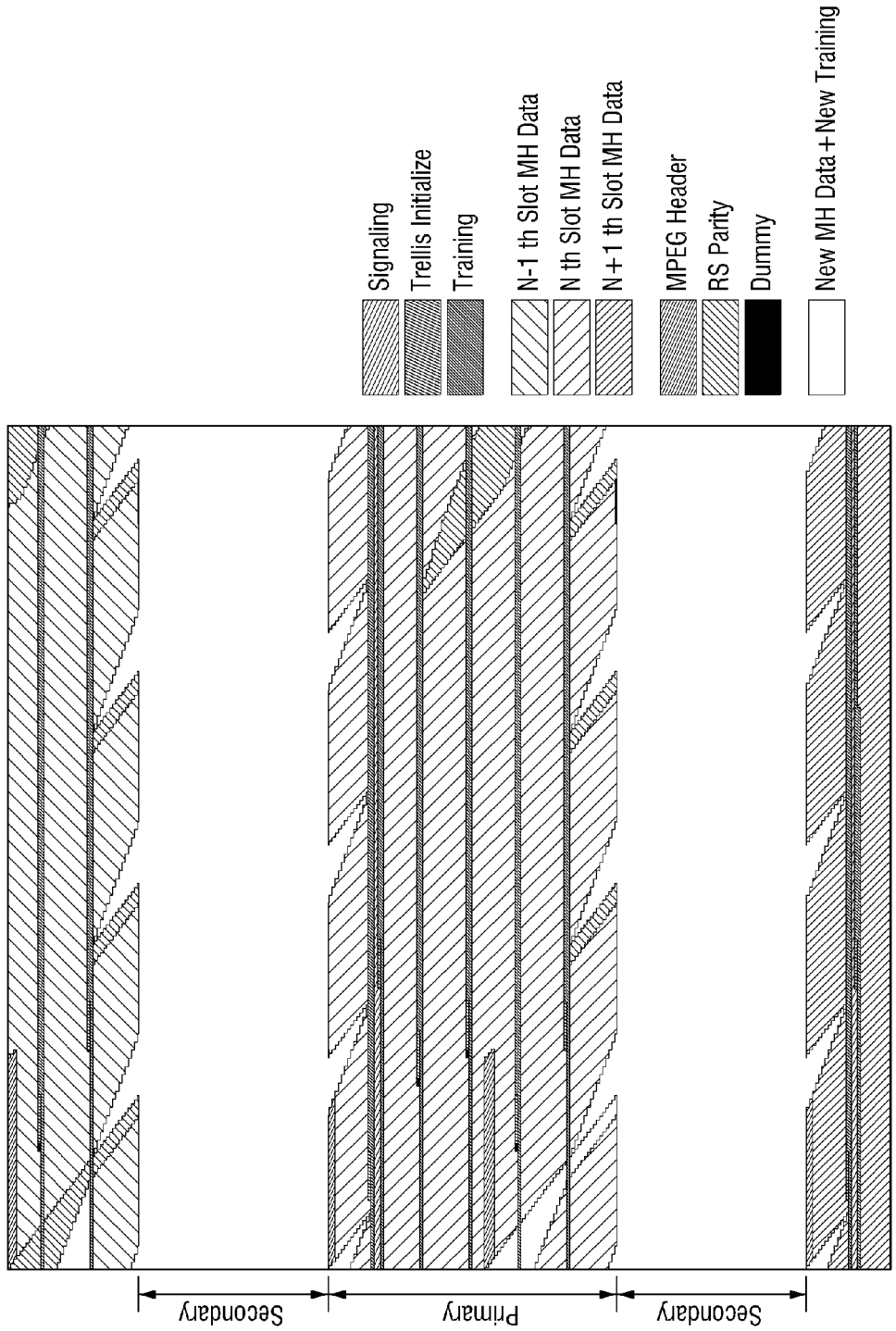

FIG. 18 illustrates a configuration of a stream in which new mobile data and new known data are inserted into the area "B", that is, the first area corresponding to the secondary service area, in addition to the second area.

As shown in FIG. 18, the entire stream is divided into primary service areas and secondary service areas. The primary service area may be referred to as a body area and the secondary service area may be referred to as a head/tail area. Since the head/tail area does not include known data and includes data of different slots in a distributed pattern, the head/tail area shows poor performance compared to the body area. Accordingly, new mobile data and new known data may be inserted into the head/tail area. The known data may be arranged in a pattern of long training sequences like in the body area, though it is understood that another exemplary embodiment is not limited thereto. That is, the known data may be arranged in a distributed pattern or in a combination of the pattern of long training sequences and the distributed pattern.

On the other hand, as the first mobile data area is used as an area for new mobile data, it is possible to maintain the compatibility with a receiver conforming to the related art ATSC-MH standard by configuring a header of the packet of the area including the new mobile data or the new known data of the existing mobile data area in a format that cannot be recognized by the receiver.

Also, the existence of the new mobile data and the known data may be notified using signaling data.

Figure 19:
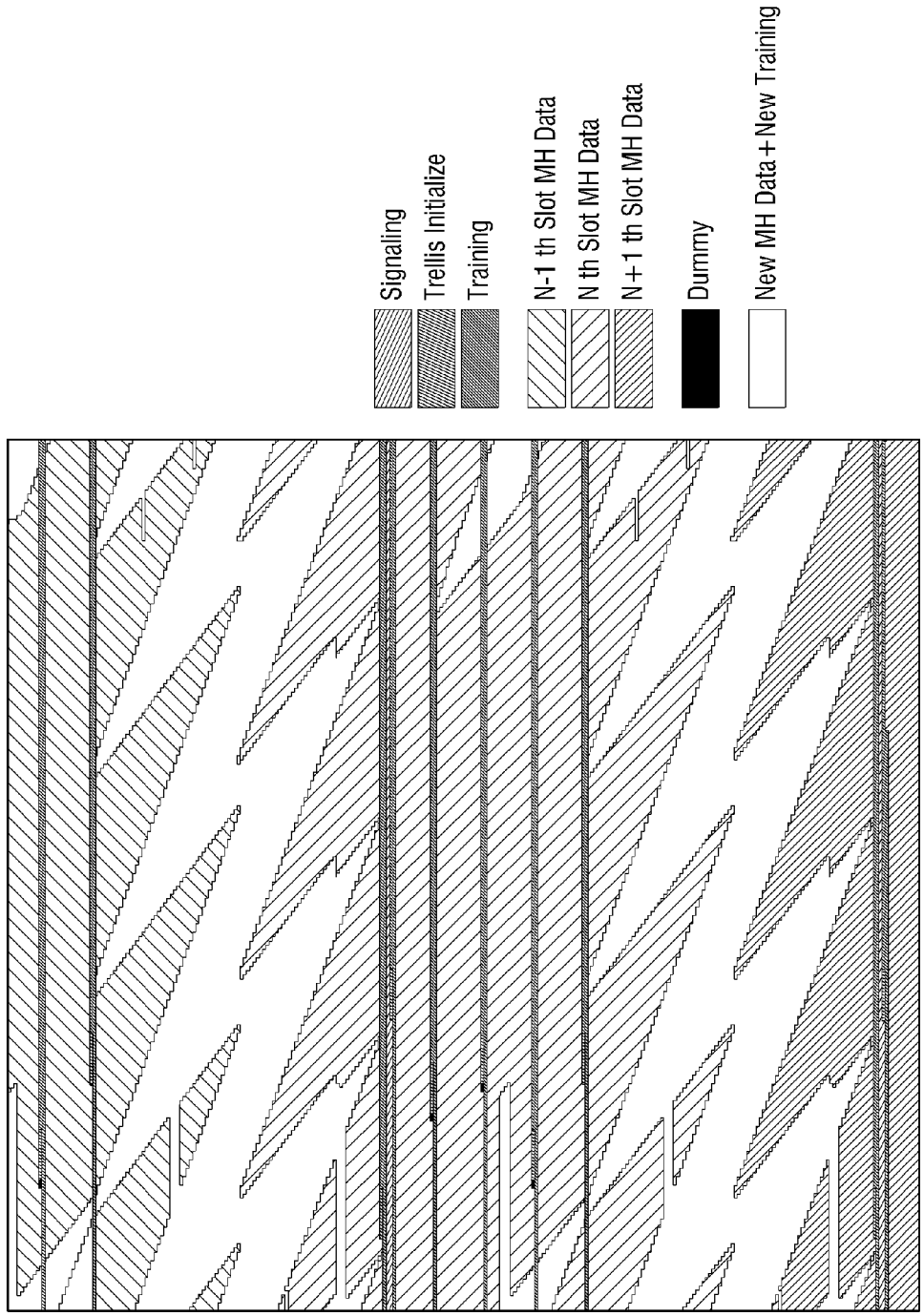

FIG. 19 illustrates an example of a transport stream for transmitting new mobile data and known data using all of the related art normal data area, the MPEG header, the RS parity area, at least a part of the dummy of the first mobile data, and the first mobile data area. FIG. 17 illustrates a case where another new mobile data different from the new mobile data located in the normal data area is transmitted using the aforementioned areas, but FIG. 19 illustrates a case where the same new mobile data is transmitted using all of the aforementioned portions and the normal data area.

Figure 20:
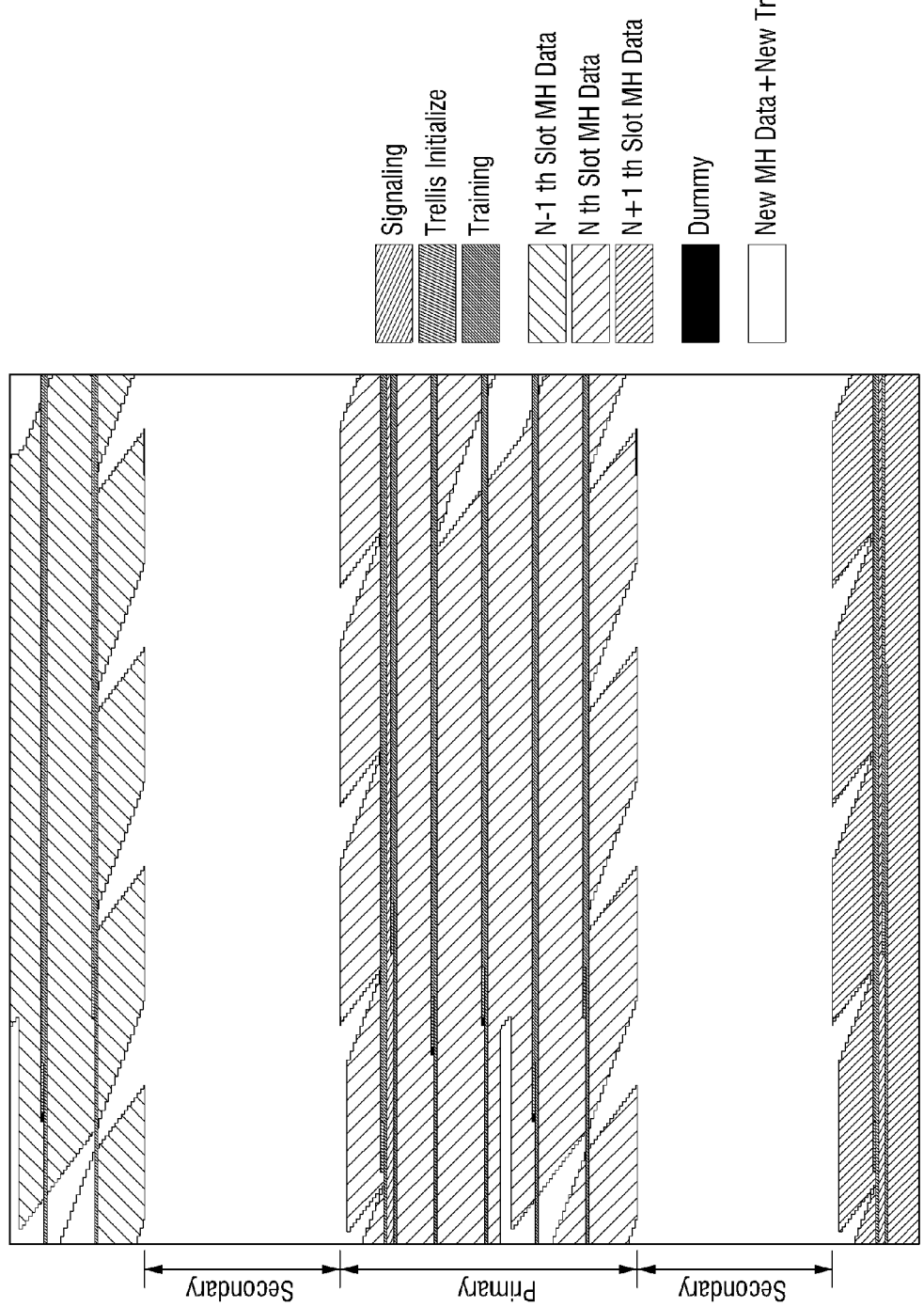

FIG. 20 illustrates an example of a transport stream in the case that new mobile data and known data are transmitted using all of the entire area "B", the normal data area, the MPEG header, the RS parity area, and at least a part of the dummy of the first mobile data.

Like in the above-described case, the portion including the new mobile data and the known data may be made unrecognized by the receiver for the sake of achieving the compatibility with the related art receiver.

Figure 21:
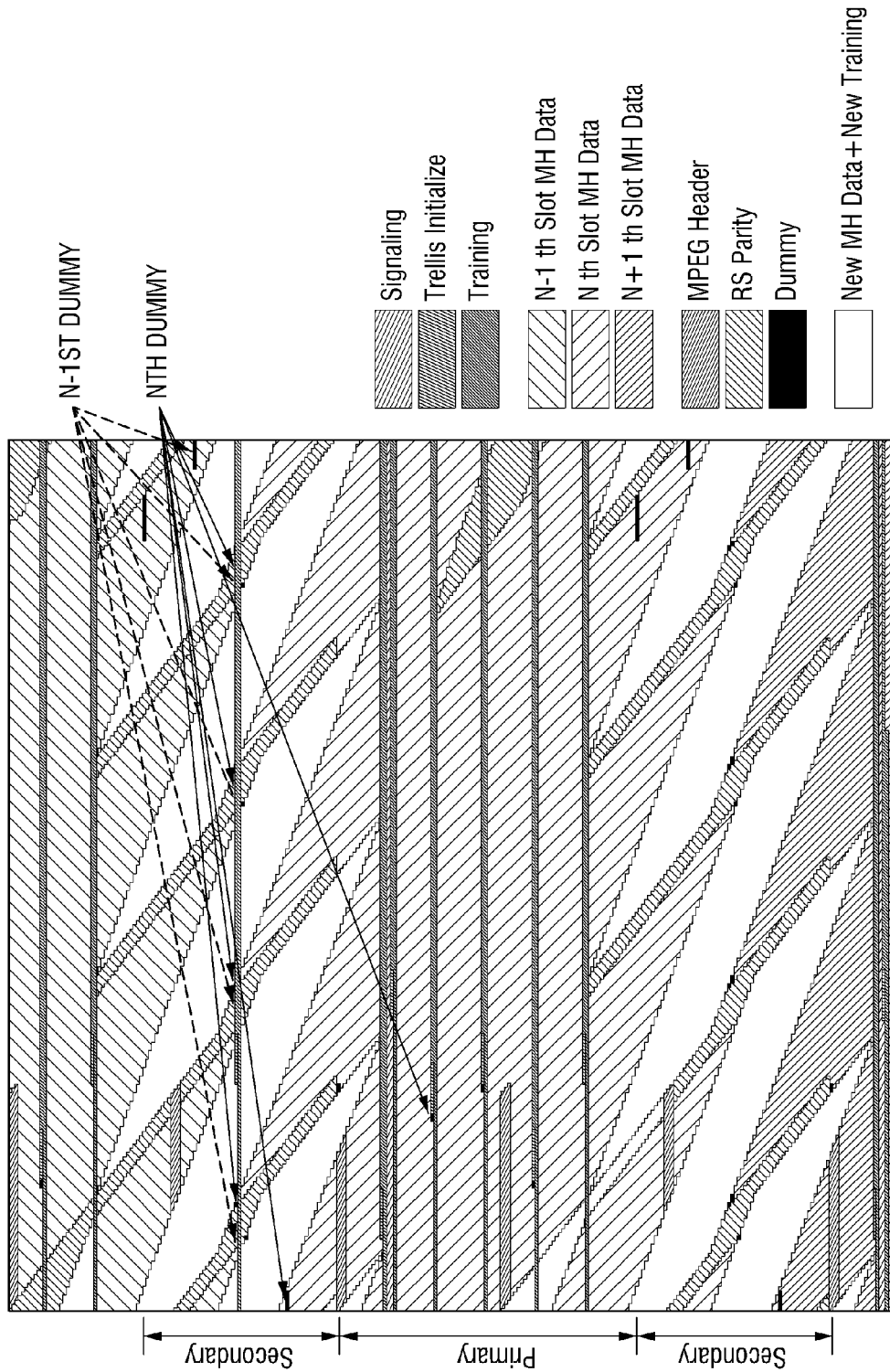

FIG. 21 illustrates configuration of a transport stream in the case that the dummy of the area used for the first mobile data is replaced with a parity or an area for new mobile data and the mobile data and the known data are placed using the replaced dummy and normal data area. Referring to FIG. 21, a dummy of an N−1$^{st}$ slot and a dummy of an Nth slot are illustrated.

As described above, FIGS. 15 to 21 illustrate the stream after interleaving. The data pre-processor 100 places the mobile data and the known data in appropriate locations so as to have the stream configuration of FIGS. 15 to 21 after interleaving.

More specifically, the data pre-processor 100 places the mobile data in the normal data area, that is, in the 38 packets in a predetermined pattern in the stream shown in a) of FIG. 1. In this case, the mobile data may be placed in the entire payload of the packet or in some area of the packet. Also, the mobile data may be placed in an area which corresponds to a head or a tail of the existing mobile area after interleaving.

The known data may be placed in the mobile data packet or the normal data packet. In this case, the known data may be arranged continuously or intermittently in a vertical direction as in a) of FIG. 1 so that the known data is arranged in the pattern of long training sequences or similar long training sequences in a horizontal direction after interleaving.

Also, the known data may be placed in a distributed pattern other than the pattern of long training sequences. Hereinafter, various examples of arrangements of the known data will be described.

[Arrangement of Known Data]

As described above, the known data is placed in an appropriate location by the group formatter 130 of the data pre-processor 100 and is then interleaved by the interleaver 430 of the exciter unit 400 along with a stream. FIGS. 22 to 28 are views to explain how to place known data according to various exemplary embodiments.

Figure 22:
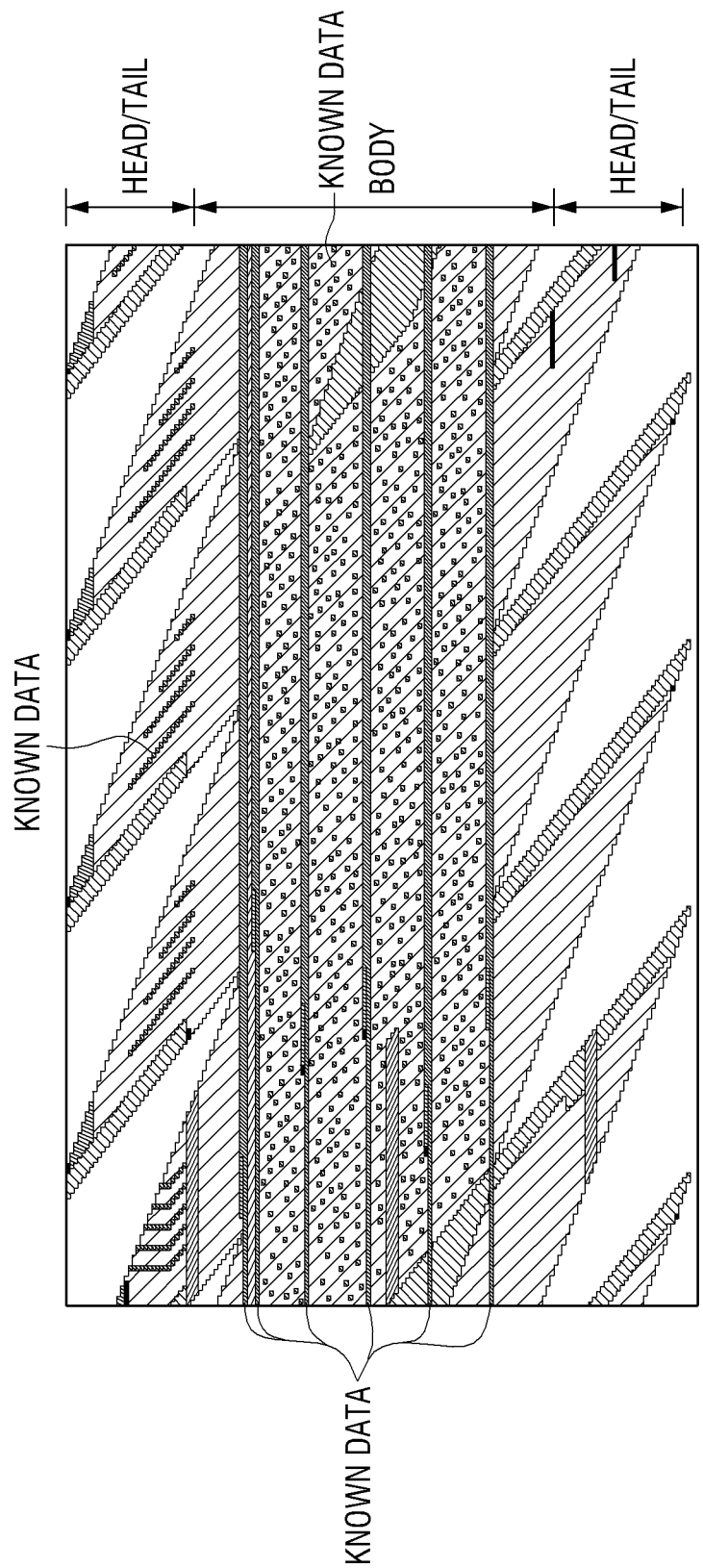
FIGS. 22 to 28 are views illustrating configurations of a known data insertion pattern according to various exemplary embodiments.

FIG. 22 illustrates known data that is additionally placed in a conical part within the head/tail area along with distributed-type known data being placed in the body area along long training sequences. By newly adding known data while maintaining related art known data as is, synchronization, channel estimation performance, and equalization performance can be improved.

Placing the known data as shown in FIG. 22 is performed by the group formatter 130. The group formatter 130 may determine a location where the known data is to be inserted in consideration of an interleaving rule of the interleaver 430. Different interleaving rules may be applied according to various exemplary embodiments, and the group formatter 130 can determine an appropriate location of the known data according to the interleaving rule. For example, if known data of a predetermined size is inserted into a part of payload or a separate field every $4^{th}$ packet, the known data distributed in a uniform pattern may be obtained by interleaving.

Figure 23:
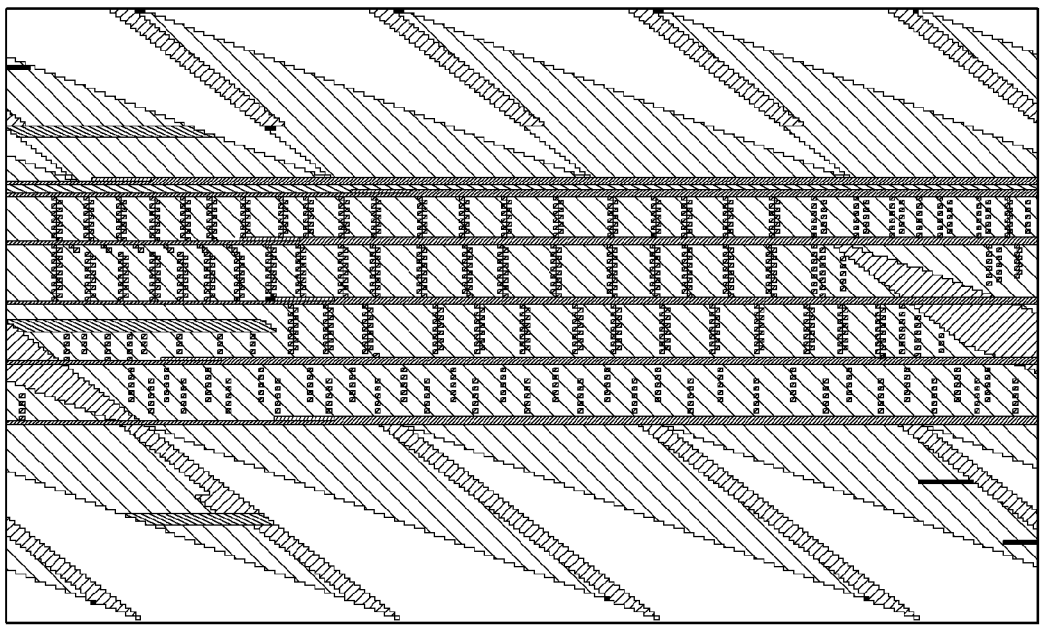

FIG. 23 illustrates a configuration of a stream in which known data is inserted in a different way according to another exemplary embodiment.

Referring to FIG. 23, distributed known data is not placed in the conical area but is placed only in the body area along with long training sequences.

Figure 24:
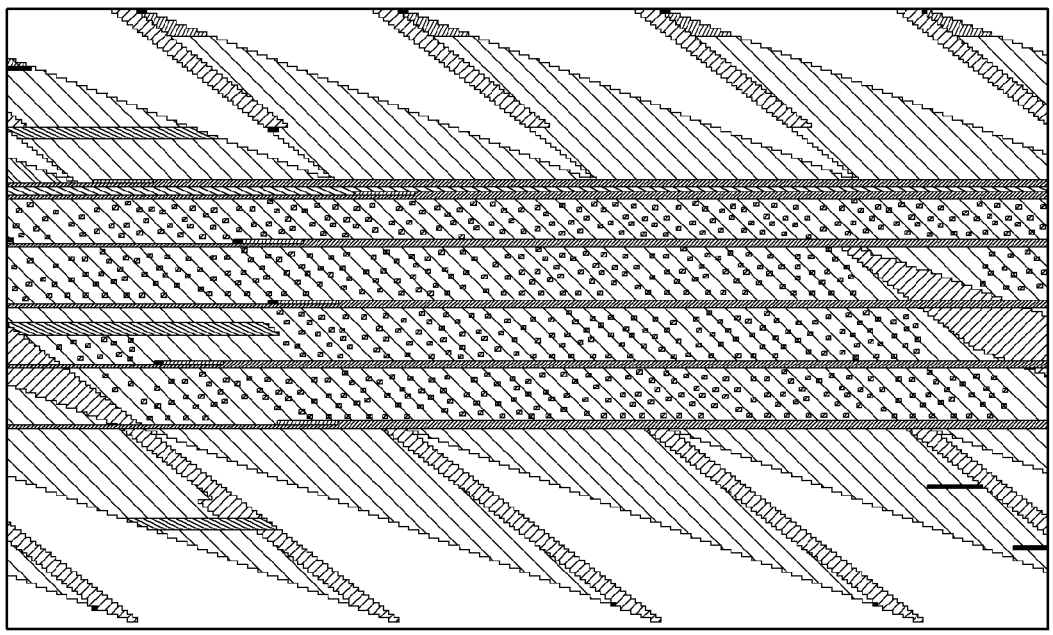

FIG. 24 illustrates a configuration of a stream in which the length of the long training sequence is reduced compared to that of FIG. 23 and distributed known data is placed as much as the number of reduced long training sequences. Accordingly, the data transmission efficiency remains the same and Doppler tracking performance is improved.

Figure 25:
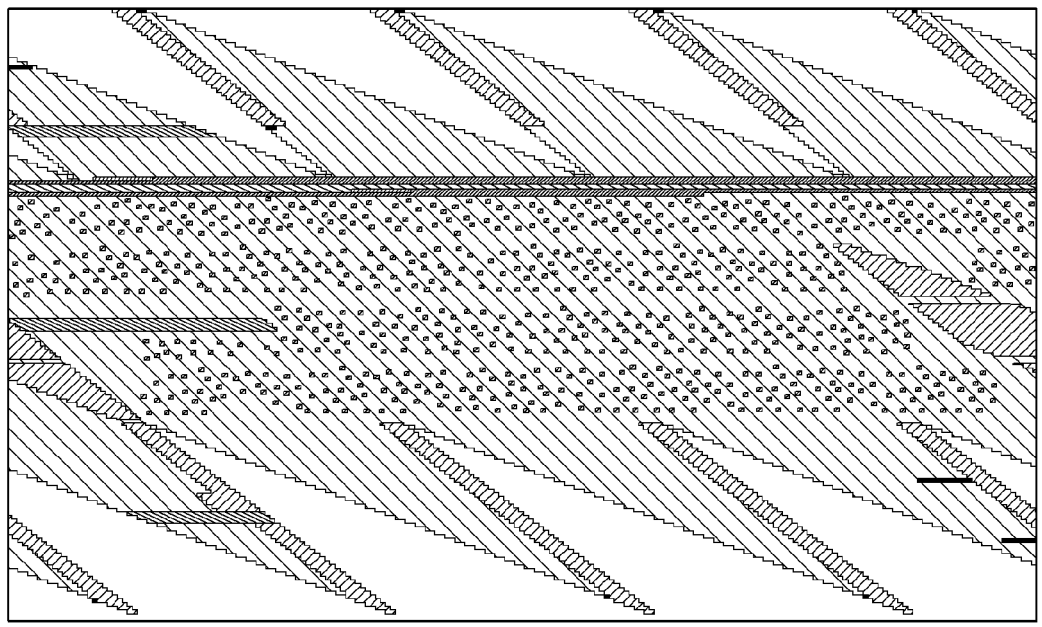

FIG. 25 illustrates a configuration of a stream in which known data is inserted in another different way according to another exemplary embodiment.

Referring to FIG. 25, a first one of 6 long training sequences in the body area remains as is and the remaining sequences are replaced for distributed known data. Accordingly, initial synchronization and channel estimation performance can be maintained due to the first long training sequence from which the body area starts and also the Doppler tracking performance can be improved.

Figure 26:
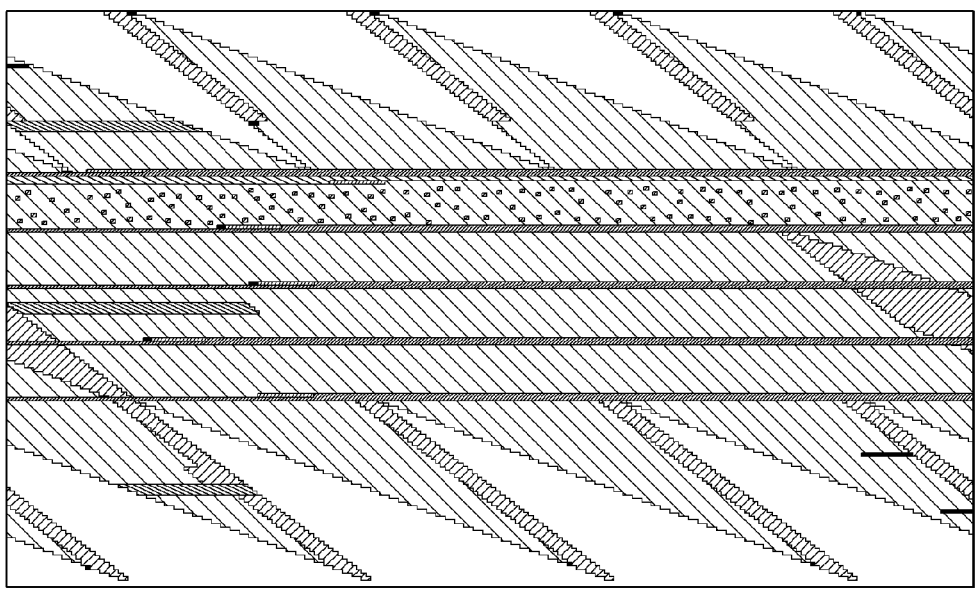

FIG. 26 illustrates a configuration of a stream in which known data is inserted in still another different way according to another exemplary embodiment. Referring to FIG. 26, a second one of 6 long training sequence is replaced for distributed known data.

Figure 27:
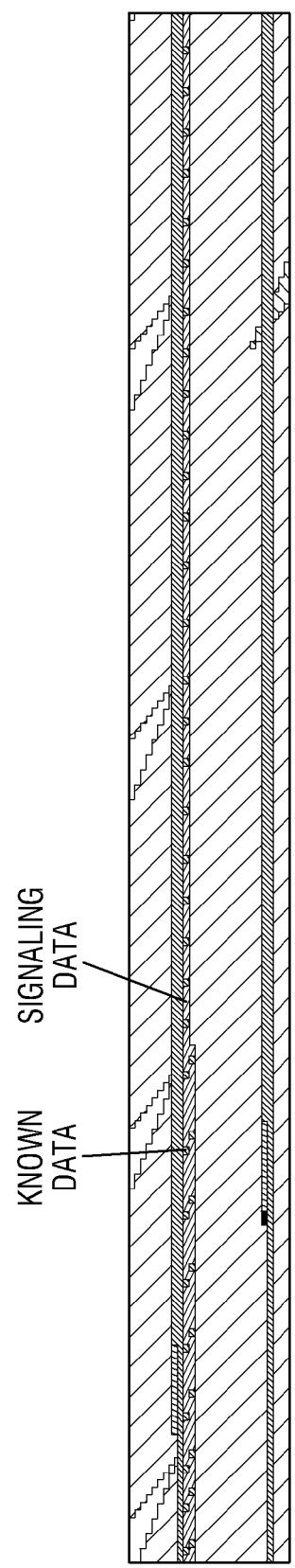

FIG. 27 illustrates a stream in which distributed known data placed in the stream of FIG. 26 and signaling data are alternately arranged.

Figure 28:
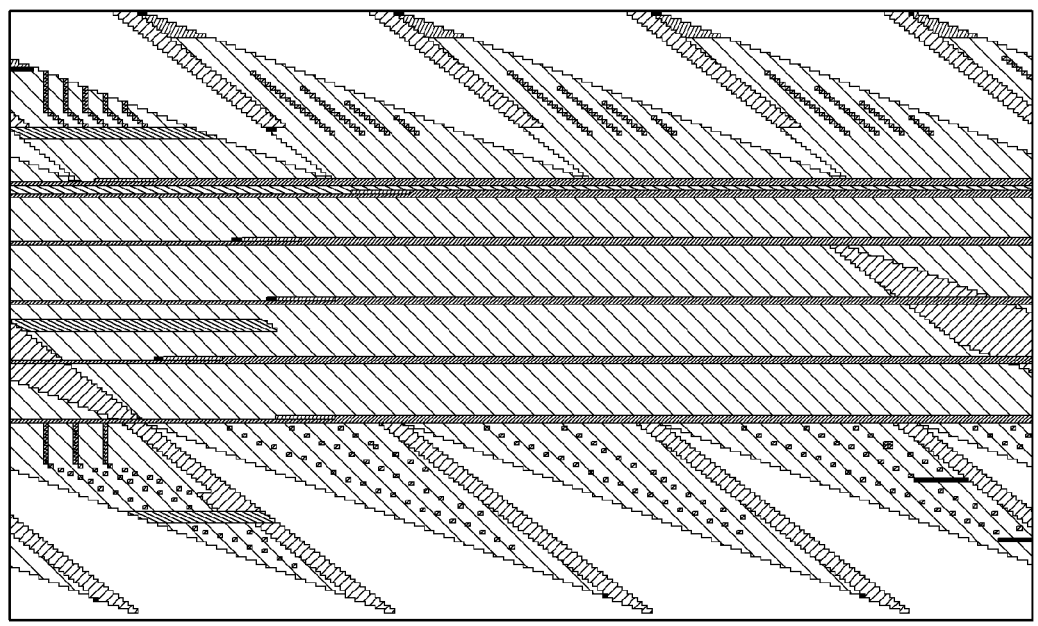

FIG. 28 illustrates a stream in which distributed known data is added to not only a head area but also a tail area.

According to various exemplary embodiments, the known data is placed in various ways as described above.

On the other hand, if mobile data is newly allocated to packets allocated to normal data, the allocating pattern may vary. Hereinafter, a configuration of a transport stream including mobile data which is placed in various ways according to a mode will be explained.

[Placement of Mobile Data]

The data pre processor 100 checks a setting condition of a frame mode. A variety of frame modes may be provided. For example, a first frame mode refers to a mode in which packets allocated to normal data are used for normal data and only packets allocated to mobile data are used for mobile data, and a second frame mode refers to a mode in which even at least one of the packets allocated to normal data is used for the mobile data. Such a frame mode may be arbitrarily set in consideration of an intention of a digital broadcast transmitter enterpriser and a transmission and reception environment.

If it is determined that the first frame mode is set in order to place normal data in all of the packets allocated to the normal data, the data pre-processor 100 places the mobile data only in the packets allocated to the mobile data in the same way as in a related art ATSC-MH system.

On the other hand, if it is determined that the second frame mode is set, the data pre-processor 100 determines the setting condition of the mode again. The mode is determined by a user regarding in what pattern and in how many packets the mobile data is placed among the packets allocated to the normal data, that is, in the second area. A variety of modes may be provided according to various exemplary embodiments.

More specifically, the mode is set to either one of a first mode in which the mobile data is placed in only part of the packets allocated to the normal data and a second mode in which the mobile data is placed in all of the packets allocated to the normal data. The first mode may be further classified according to whether the mobile data is placed in a data area of some packet, that is, in an entire payload area or a part of the payload area.

Also, for example, if 38 packets corresponds to the second area allocated to the normal data, the mode may be set to one of the following: a first mode in which mobile data is placed in 1/4 of packets except for a predetermined number of packets among the 38 packets; a second mode in which mobile data is placed in 1/2 of packets except for a predetermined number of packets among the 38 packets; a third mode in which mobile data is placed in 3/4 of packets except for a predetermined number of packets among the 38 packets; and a fourth mode in which mobile data is placed in all of the 38 packets.

Figure 29:
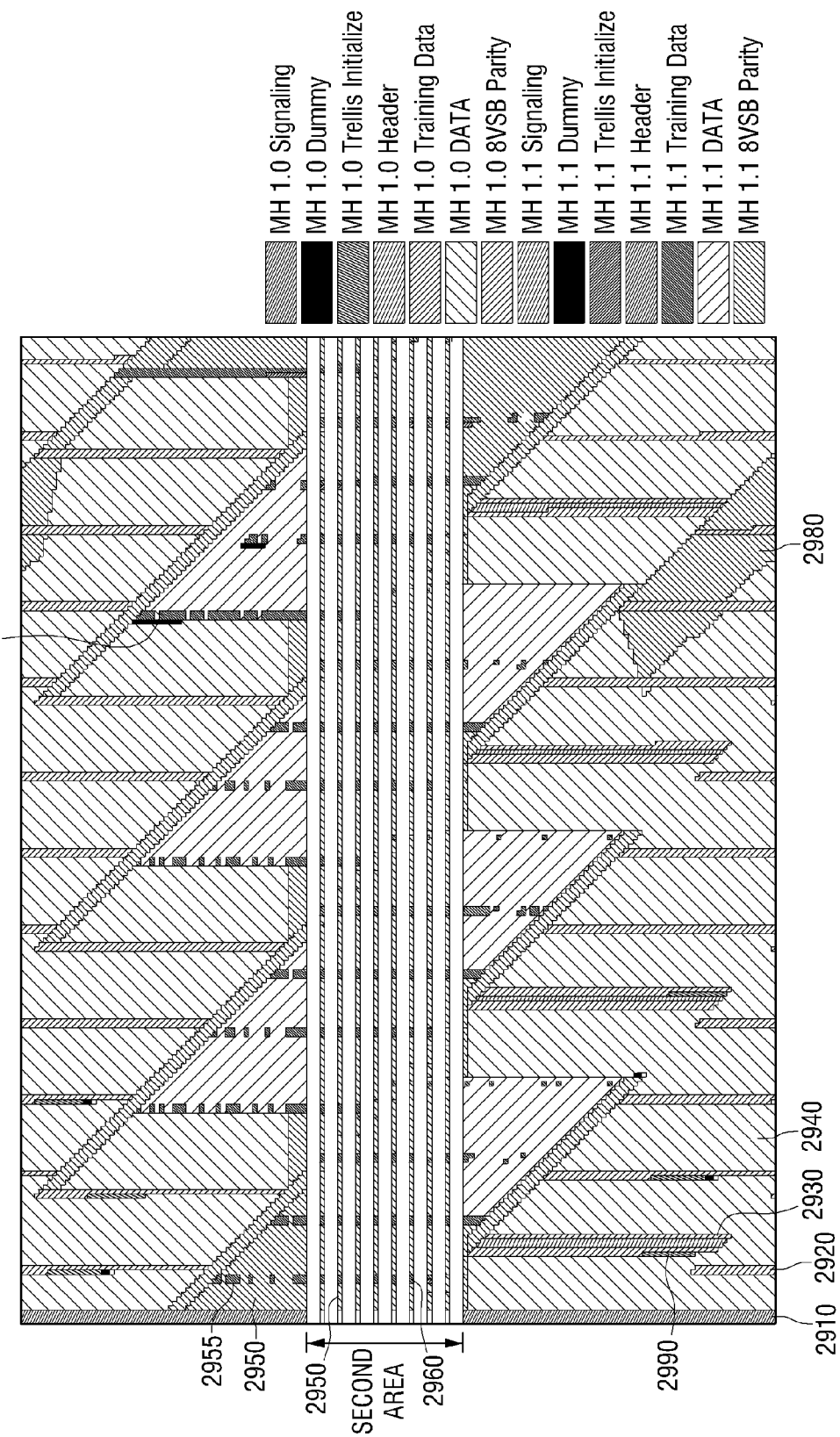
FIG. 29 is a view illustrating a pattern in which mobile data is placed in a normal data area according to a first mode.

FIG. 29 illustrates a configuration of a stream when the group formatter 130 places mobile data and known data according to the first mode in an exemplary embodiment where new mobile data is to be transmitted using the second area and the head/tail area.

Referring to FIG. 29, new mobile data 2950 and known data 2960 are placed in the second area in a predetermined pattern and are also placed in a portion 2950 corresponding to the head/tail area 2950.

Also, it can be seen that an MPEG header 2910, known data 2920, signaling data 2930, first mobile data 2940, and a dummy 2970 are arranged in a vertical direction in the stream. If encoding and interleaving are performed after an empty space of the second area is filled with normal data, a stream as shown in FIG. 30 is generated.

Figure 30:
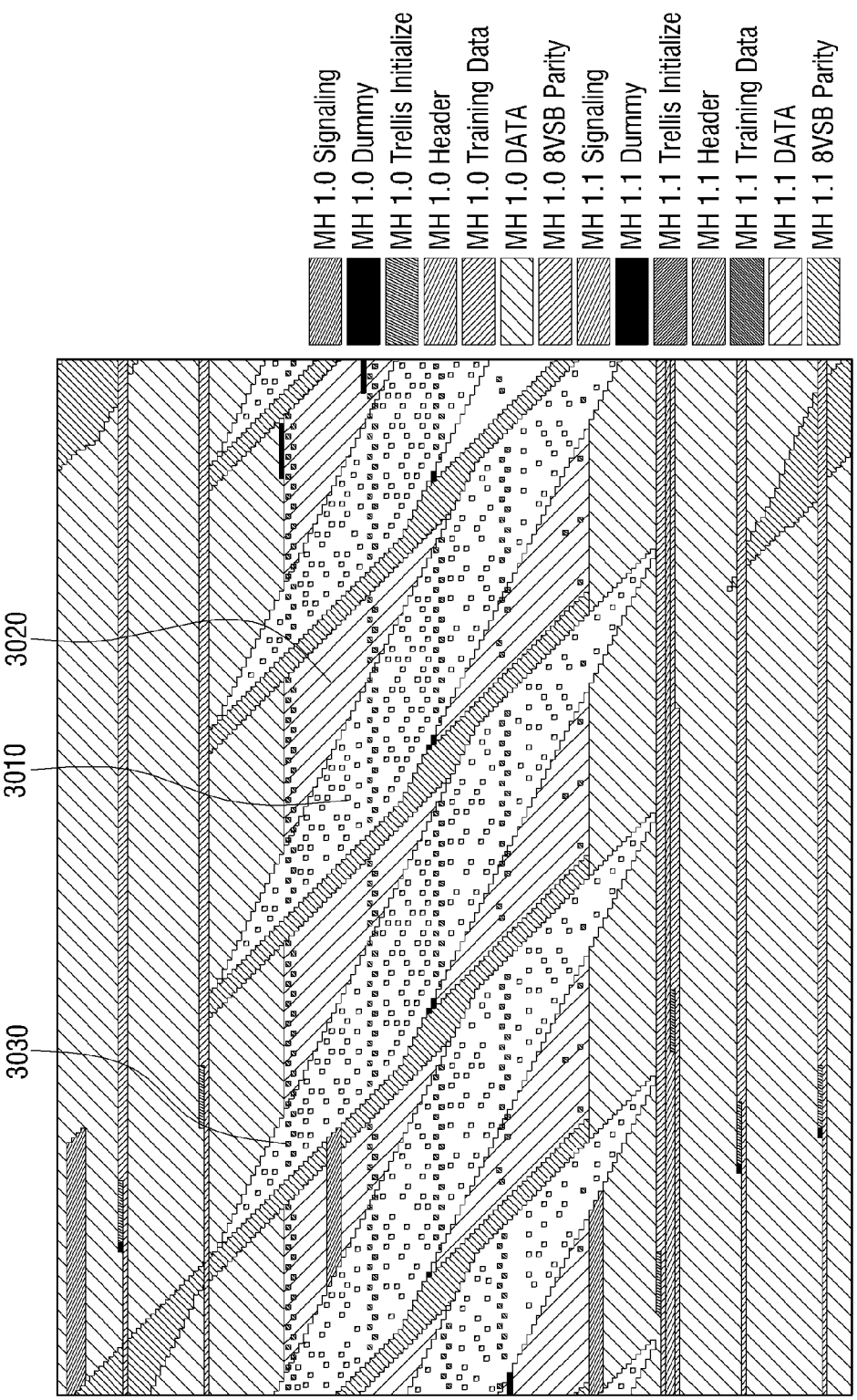
FIG. 30 is a view illustrating the stream of FIG. 29 after interleaving.

FIG. 30 illustrates a configuration of a stream after interleaving in the first mode.

Referring to FIG. 30, new mobile data 3010 and known data 3030 are placed in a part of a packet area allocated to normal data. In particular, the known data is arranged discontinuously in the second area, thereby forming long training sequences similar to the long training sequences of the body area.

The mobile data 2950 of FIG. 29, which is placed in the portion corresponding to the head/tail area, corresponds to the mobile data 3020 of FIG. 30, which is placed in the head/tail area. Furthermore, the known data 2955 placed along with the mobile data 2950 forms the known data 3030 of similar long training sequences along with the known data in the second area.

Figure 31:
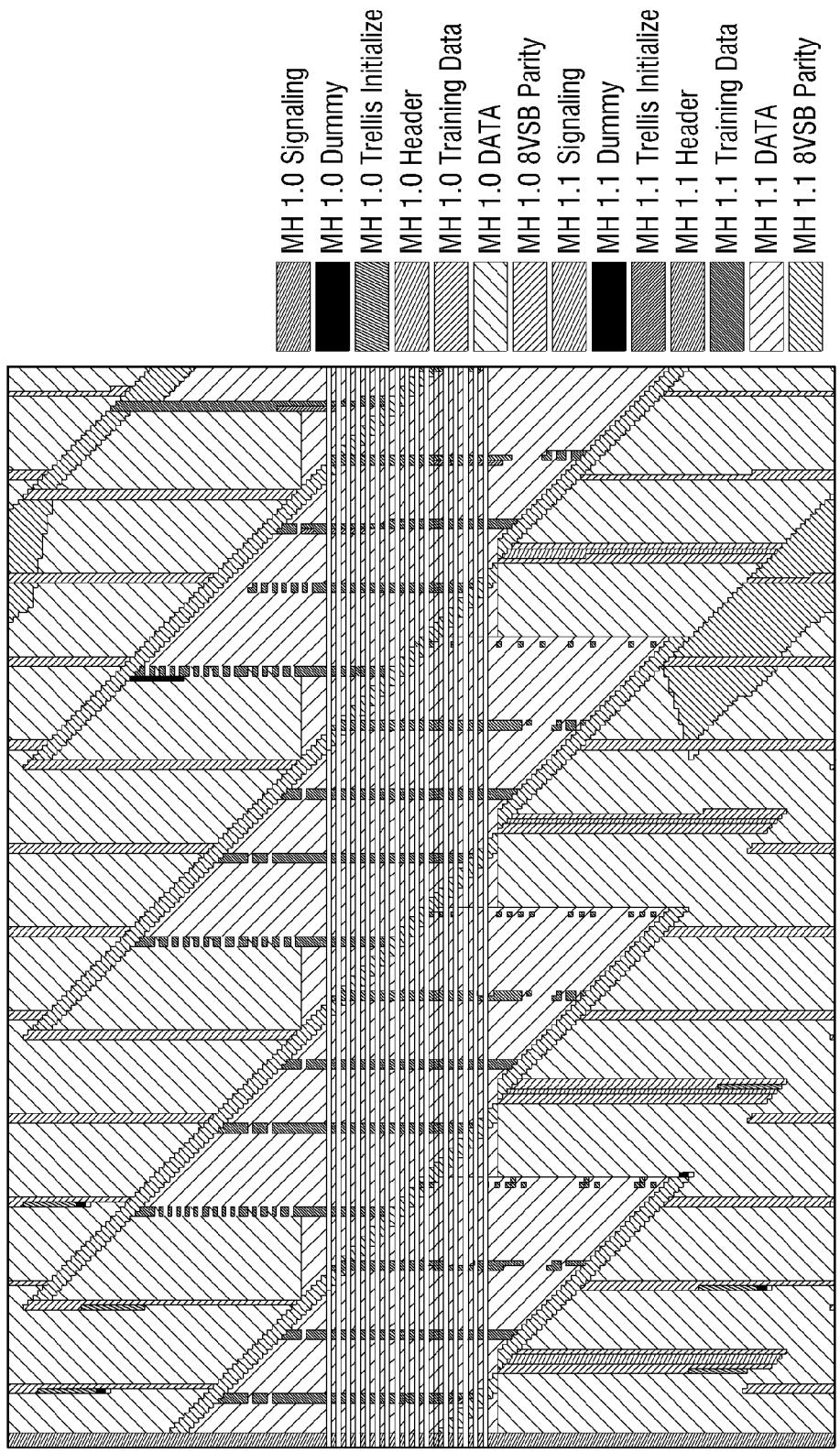
FIG. 31 is a view illustrating a pattern in which mobile data is placed in a normal data area according to a second mode.

FIG. 31 illustrates a configuration of a stream when the group formatter 130 places mobile data and known data according to the second mode in an exemplary embodiment where new mobile data is to be transmitted using the second area and the head/tail area.

In FIG. 31, the proportion of the mobile data included in the second area is greater than in FIG. 29. Compared to FIG. 29, the space occupied by the mobile data and the known data increases in FIG. 31.

Figure 32:
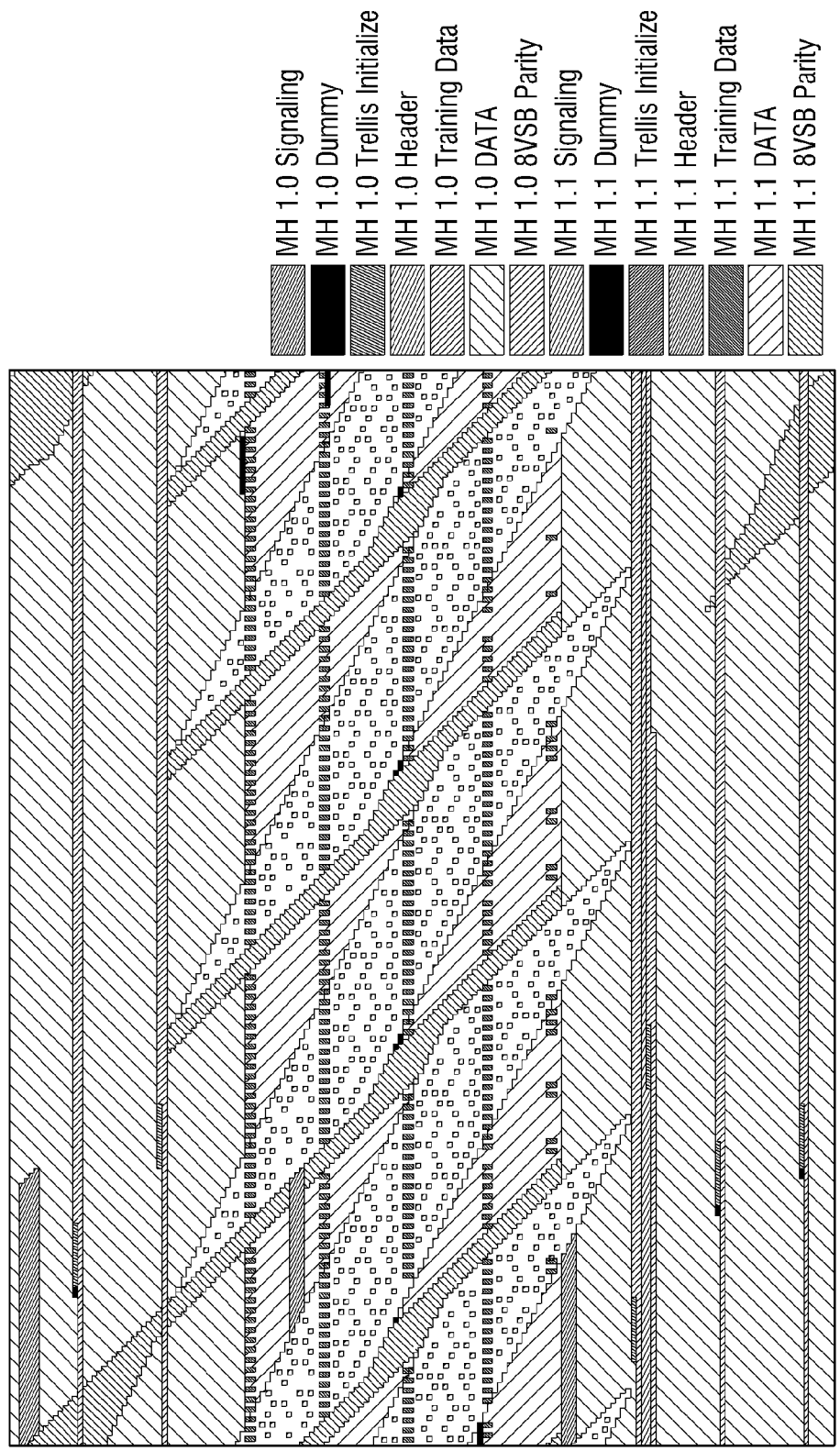
FIG. 32 is a view illustrating the stream of FIG. 31 after interleaving.

FIG. 32 illustrates the stream of FIG. 31 after interleaving. Referring to FIG. 32, the known data in the second area forms similar long training sequence more densely than the known data in the second area of FIG. 30.

Figure 33:
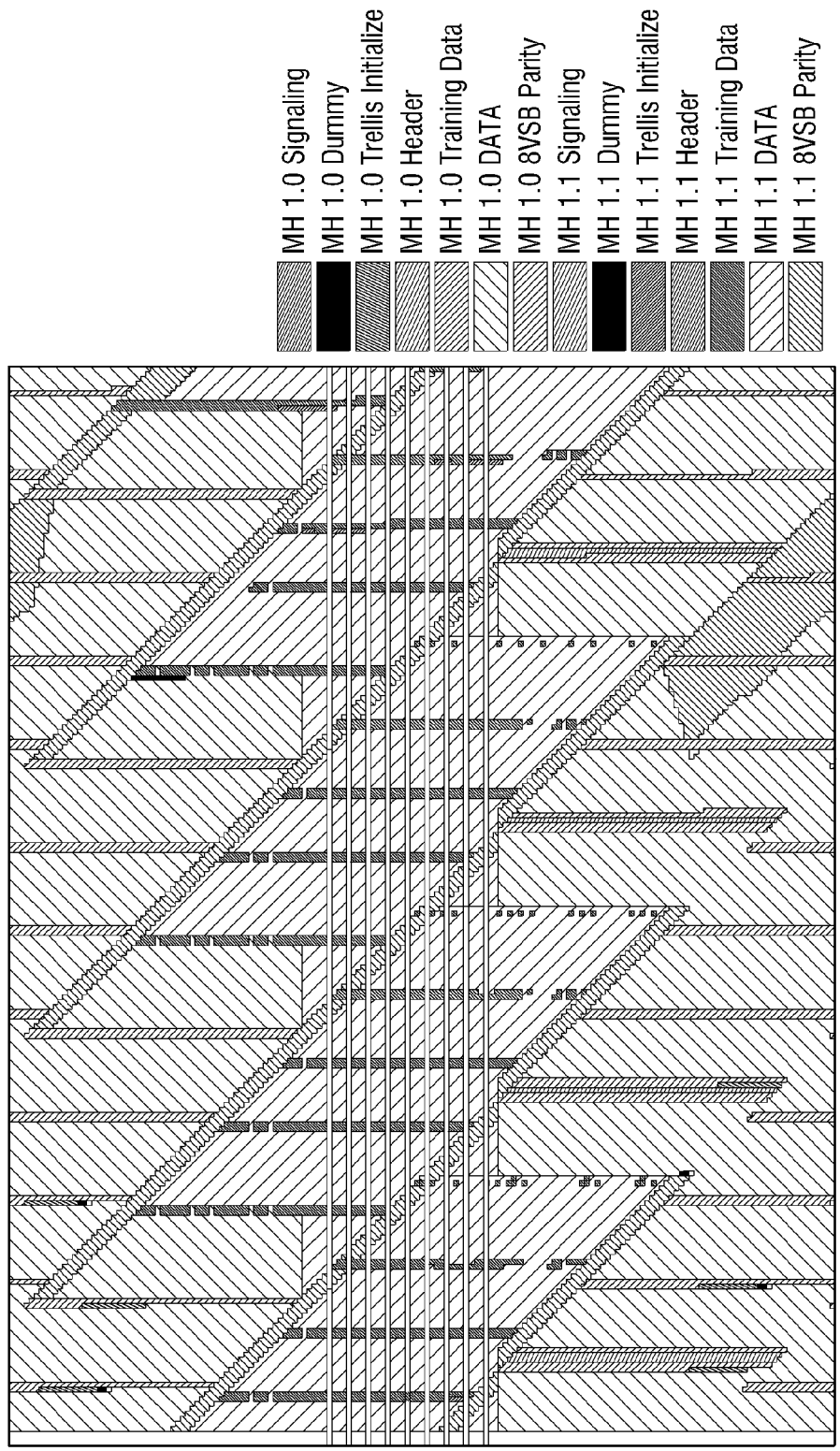
FIG. 33 is a view illustrating a pattern in which mobile data is placed in a normal data area according to a third mode.
Figure 34:
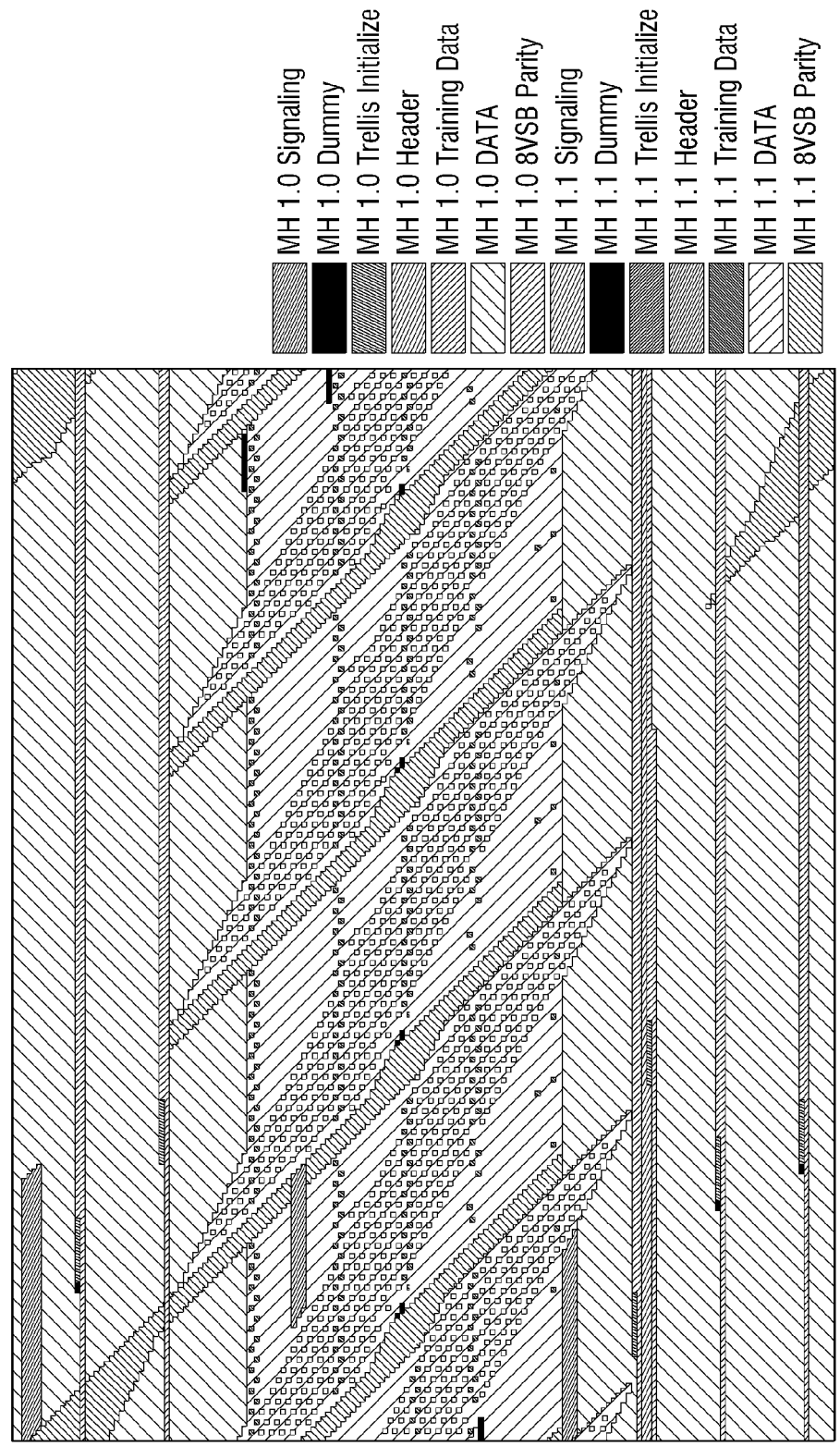
FIG. 34 is a view illustrating the stream of FIG. 33 after interleaving.

FIG. 33 illustrates a configuration of a stream when the group formatter 130 places mobile data and known data according to the third mode in an exemplary embodiment where new mobile data is to be transmitted using the second area and the head/tail area. FIG. 34 illustrates the stream of FIG. 33 after interleaving.

The placement of the mobile data and the known data of FIGS. 33 and 34 is the same as in the first mode and the second mode except for that the density in the arrangement of the mobile data and the known data increases.

Figure 35:
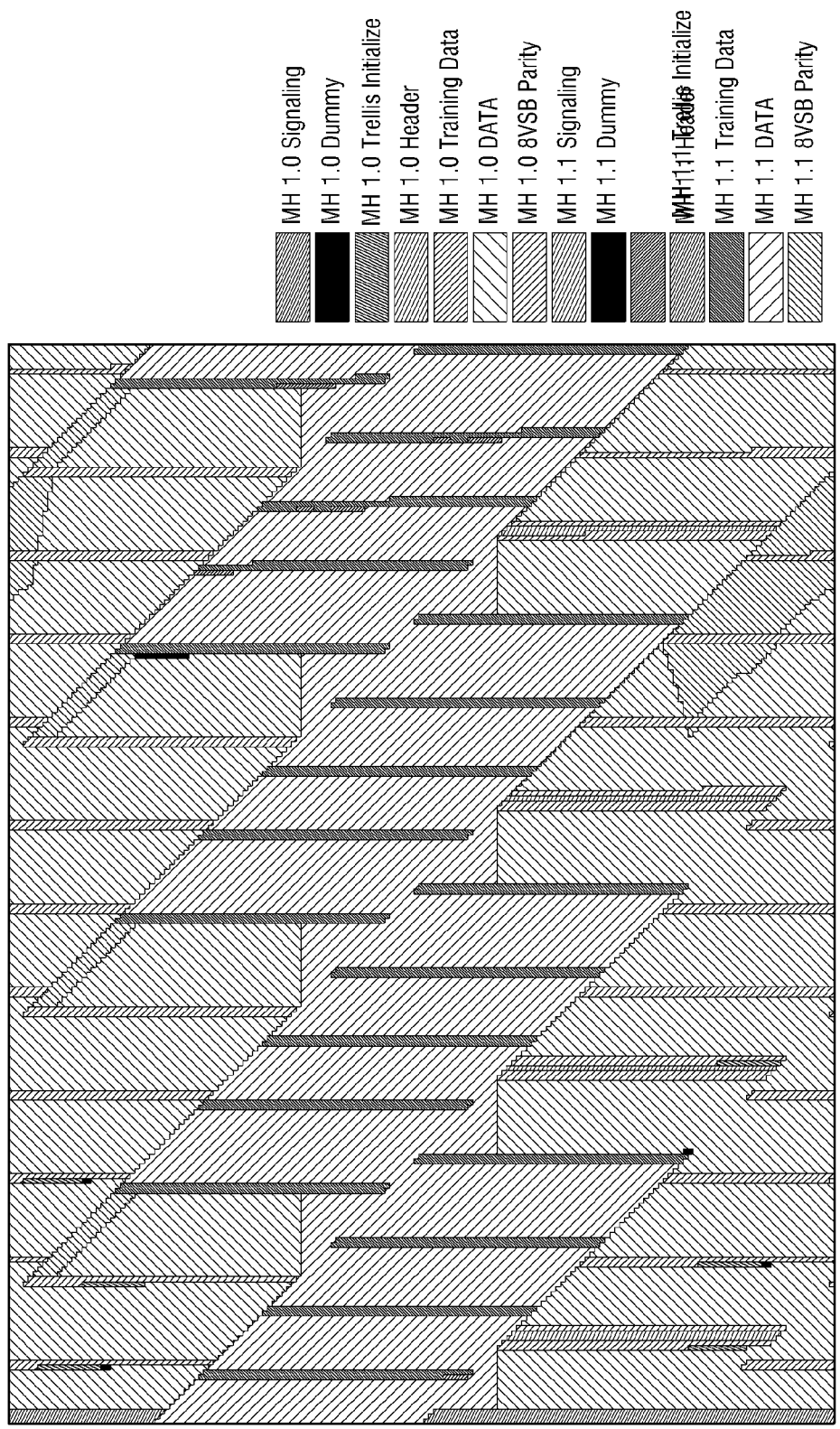
FIG. 35 is a view illustrating a pattern in which mobile data is placed in a normal data area according to a fourth mode.

FIG. 35 illustrates a configuration of a stream according to the fourth mode using the entire normal data area in an exemplary embodiment where all of the packets allocated to the normal data and the packet area allocated the first mobile data, which corresponds to the head/tail area, is used.

Referring to FIG. 35, in the second area and a surrounding area thereof, the known data is arranged in a vertical direction and the remaining area is occupied by new mobile data.

Figure 36:
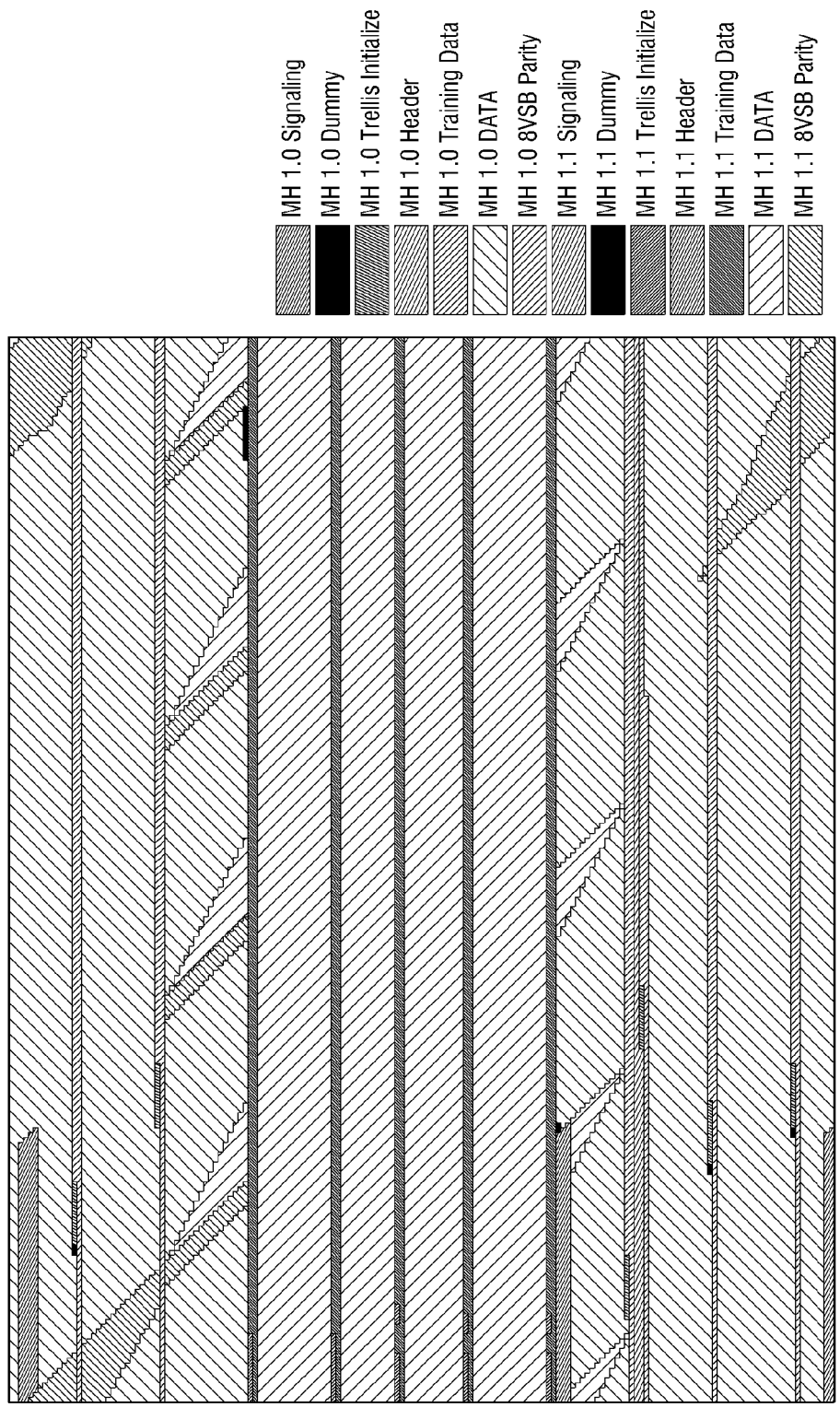
FIG. 36 is a view illustrating the stream of FIG. 35 after interleaving.

FIG. 36 illustrates the stream of FIG. 35 after interleaving. Referring to FIG. 36, the head/tail area and the entire normal data area are filled with new mobile data and the known data, and in particular, the known data is placed in the pattern of long training sequences.

In these areas, known data is inserted into a small unit repeatedly according to a plurality of pattern periods such that distributed known data is realized after interleaving.

Figure 37:
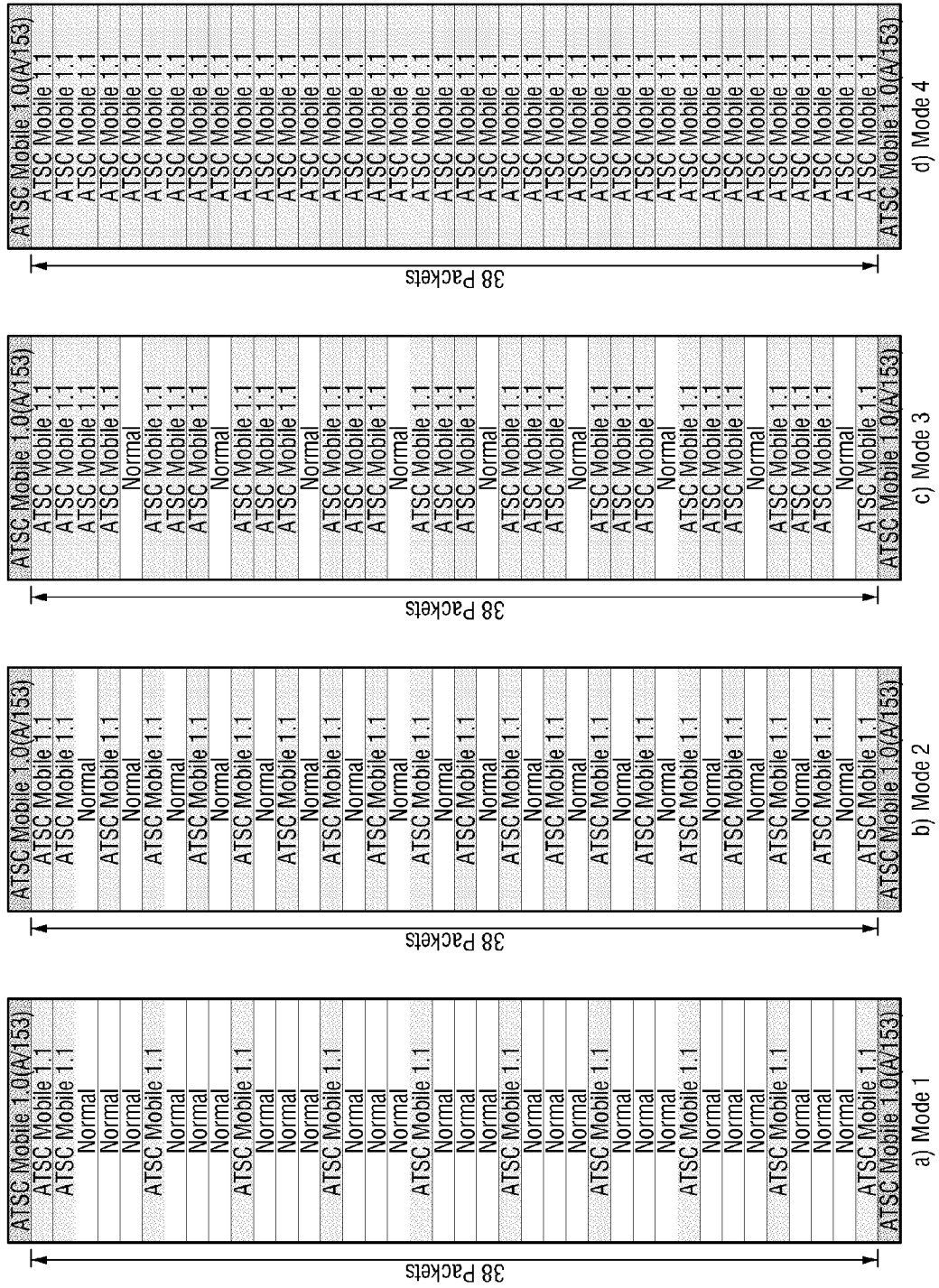
FIGS. 37 to 40 are views illustrating a pattern in which mobile data is placed according diverse modes according to various exemplary embodiments.

FIG. 37 is a view to explain how to insert new mobile data into the second area, that is, the packets (for example, 38 packets) allocated to normal data in diverse modes. Hereinafter, new mobile is referred to as ATSC mobile 1.1 data (or 1.1 version data) and first mobile data is referred to as ATSC mobile 1.0 data (or 1.0 version data) for the sake of convenience.

In the first mode a), the 1.1 version data is placed in each of first and final packets, and one 1.1 packet and 3 normal data packets are repeatedly inserted into the packets between the first and the final packets. Accordingly, 11 packets in total can be used to transmit the 1.1 version data, that is, the new mobile data.

Likewise, in the second mode b), the 1.1 version data is placed in each of the first and the final packets and one 1.1 packet and one normal data packet are placed in packets between the first and the final packets alternately and repeatedly. Accordingly, 20 packets in total can be used to transmit the 1.1 version data, that is, the new mobile data.

Likewise, in the third mode c), the 1.1 version data is placed in each of the first and the final packets, and three 1.1 packets and one normal data packet are repeatedly placed in the packets between the first and the final packets.

In the fourth mode d), all of the packets corresponding to the second area may be used to transmit the 1.1 version data.

Although the first through the fourth modes correspond to the cases using 1/4, 2/4, 3/4, and 4/4 of the entire packets of the second area to transmit the mobile data, respectively, the total number of packets is 38, which is not a multiple of 4. Accordingly, some packets (2 packets in FIG. 37) may be fixed as a packet for transmitting the new mobile data or the normal data and the remaining packets may be classified according to the aforementioned ratio. That is, referring to a), b), and c) of FIG. 37, 1.1 packets may be included in the ratio of 1/4, 2/4, and 3/4 of 36 packets except for 2 packets among 38 packets.

Figure 38:
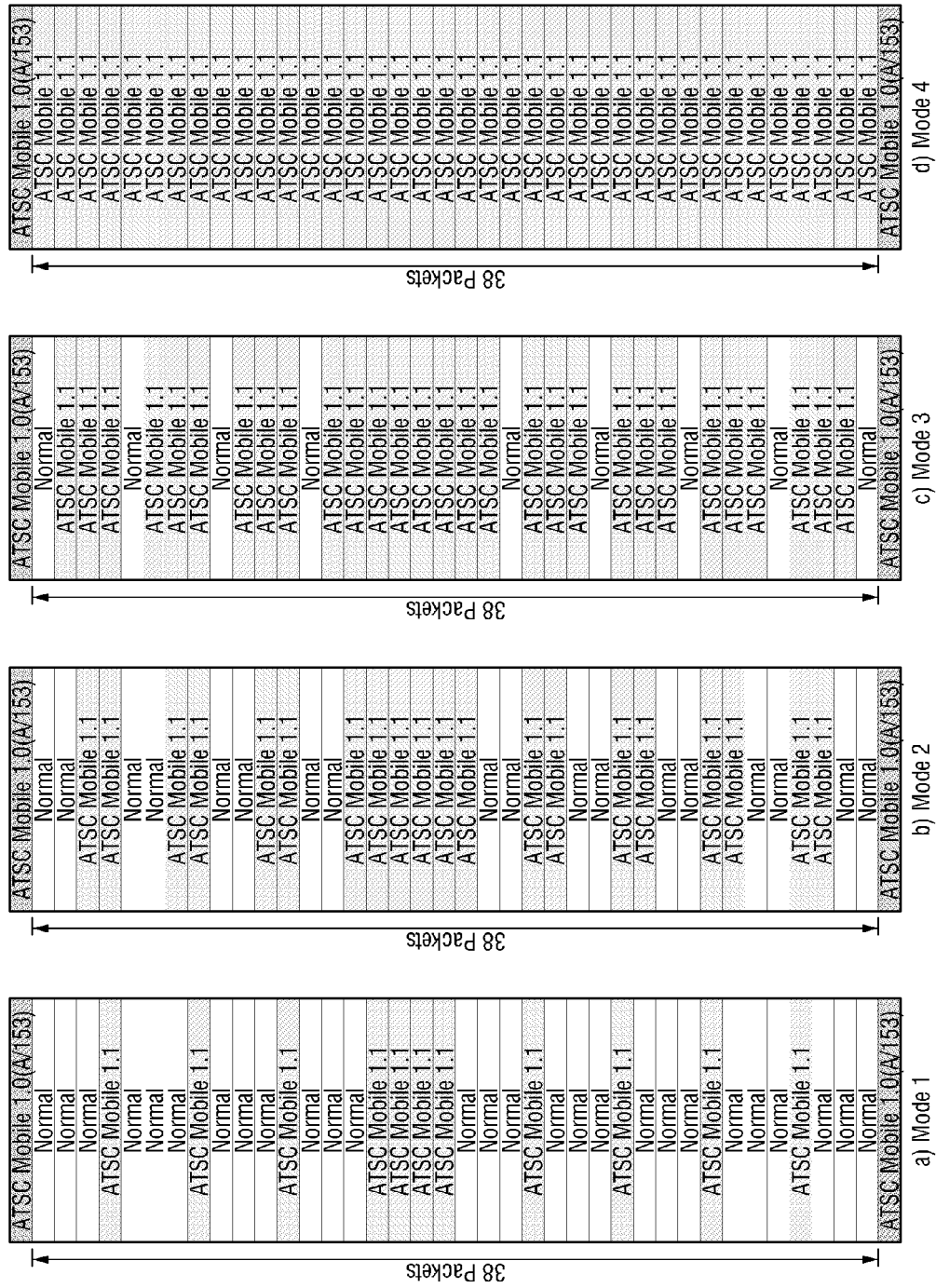

FIG. 38 is a view to explain a pattern in which mobile data is placed in a different mode.

Referring to FIG. 38, two 1.1 version data are placed in a center packet that is located at the center of the stream among the total packets in the second area, that is, 38 packets, and 1.1 version data and normal data are placed in the other packets according to a predetermined ratio in each mode.

More specifically, in the first mode a), the mobile data is placed in packets other than the 2 center packets such that 3 normal data packets and one 1.1 version data packet are repeatedly placed in the upper portion and one 1.1 version data packet and 3 normal data packets are repeatedly placed in the lower portion.

In the second mode b), the mobile data is arranged in the packets other than the two center packets such that two normal data packets and two 1.1 version data packets are repeatedly placed in the upper portion and two 1.1 version data packets and two normal data packets are repeatedly placed in the lower portion.

In the third mode c), the mobile data is arranged in the packets other than the two center packets such that one normal data packet and three (3) 1.1 version data packets are repeatedly placed in the upper portion and three (3) 1.1 version data packets and one normal data packet are repeatedly placed in the lower portion.

In the fourth mode d), all of the packets are filled with the 1.1 version data, which is the same as the fourth mode of FIG. 37.

Figure 39:
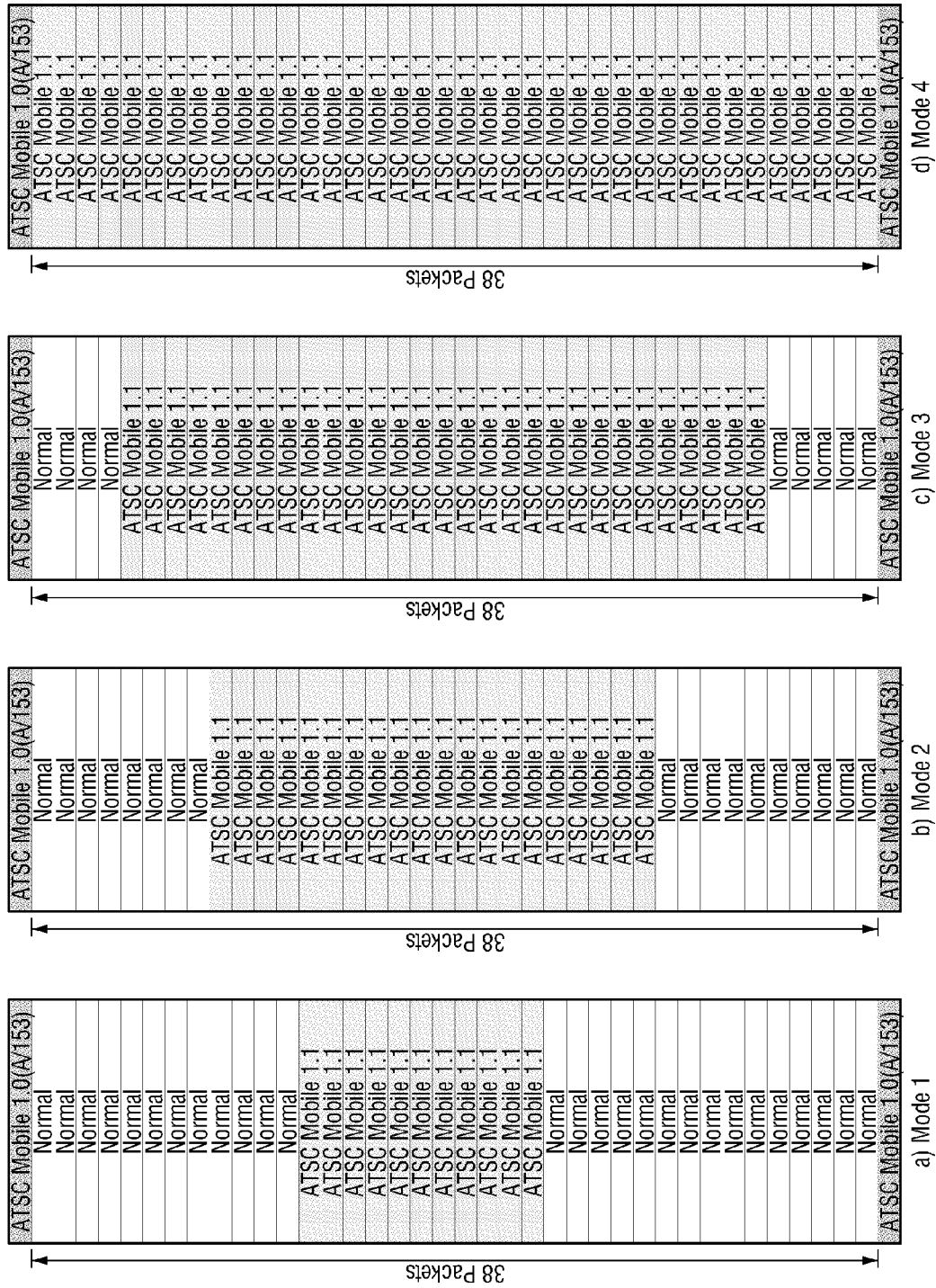

FIG. 39 illustrates placing 1.1 version data from the center packet to the upper portion and the lower portion in sequence with reference to the location on the stream.

In the first mode a) of FIG. 39, 11 packets are placed in sequence toward the upper and lower packets from the center of the total packets of the second area in a vertical direction.

In the second mode b) of FIG. 39, 20 packets in total are placed in sequence in a vertical direction from the center, and in the third mode c) of FIG. 39, 30 packets in total are placed in sequence in a vertical direction from the center. In the fourth mode of d) of FIG. 39, the entire packets are filled with 1.1 version data.

Figure 40:
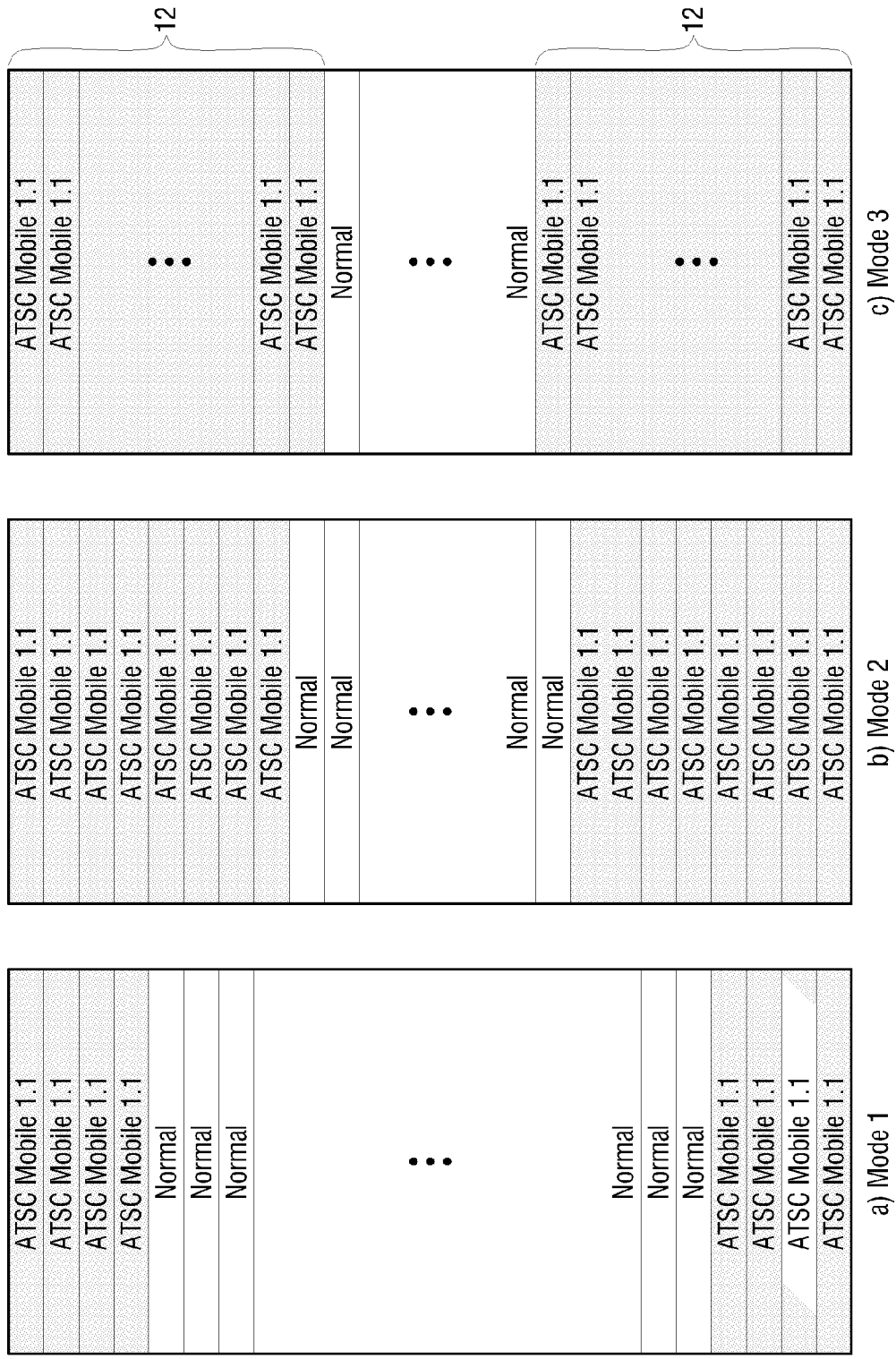

FIG. 40 illustrates a configuration of a stream in which mobile data is placed from upper and lower packets to the center packet in the reverse order of FIG. 39.

More specifically, in the first mode a) of FIG. 40, four 1.1 version data packets are placed from the top packet in a downward direction, and four 1.1 version data packets are placed from the bottom packet in an upward direction.

In the second mode b) of FIG. 40, eight 1.1 version data packets are placed from the top packet in a downward direction and eight 1.1 version data packet are placed from the bottom packet in an upward direction.

In the third mode c), twelve 1.1 version data packets are placed from the top packet in a downward direction and twelve 1.1 version data packets are placed from the bottom packet in a upward direction.

The remaining packets are filled with normal data. The placing pattern of packets in the fourth mode is the same as in FIGS. 37, 38, and 39 and is thus omitted herein.

Although insertion of known data is not illustrated in FIGS. 37 to 40, the known data may be inserted into some of the same packets for the mobile data or may be inserted into a certain area of a separate packet or an entire payload area. Since the method of inserting the known data has been described above, it is omitted from FIGS. 37 to 40.

As described above, the normal data area of each slot may be filled with mobile data in various ways. Accordingly, the shape of the slot may vary depending on the setting condition of the frame mode and the mode.

If the four modes are provided as described above, the slots in which the mobile data is placed according to the first through the fourth modes may be referred to as first through fourth type slots.

The digital broadcast transmitter may configure the same type of slot at every slot. Conversely, a stream may be configured such that different types of slots are repeated in the unit of a predetermined number of slots.

That is, as shown in FIG. 41, the data pre-processor 100 may place the mobile data so that one first type slot and three 0 type slots are repeatedly arranged. The 0 type slot refers to a slot in which normal data is allocated to the packet allocated to the normal data.

Such a slot type may be defined using existing signaling data, such as a specific portion of a TPC or a FIC.

In a situation where the RS frame mode is set to "1" as described above, the mode may be set to one of the first through the fourth modes. The slots corresponding to the modes may be referred to as 1-1, 1-2, 1-3, 1-4 type slots.

That is, the 1-1 type slot refers to a slot in which the 38 packets are allocated in the first mode, the 1-2 type slot refers to a slot in which the 38 slots are allocated in the second mode, the 1-3 type slot refers to a slot in which the 38 packets are allocated in the third mode, and the 1-4 type slot refers to a slot in which the 38 packets are allocated to the fourth mode.

FIG. 42 illustrates examples of a stream in which diverse types of slots described above are repeatedly arranged.

Referring to example 1 of FIG. 42, a stream in which the 0 type slot and the 1-1, 1-2, 1-3, 1-4 type slots are repeatedly arranged in sequence is illustrated.

Referring to example 2 of FIG. 42, a stream in which the 1-4 type slot and the 0 type slot are alternated is illustrated. As described above, since the fourth mode is a mode in which the entire normal data area is filled with mobile data, example 2 indicates a situation where a slot used for mobile data and a slot used for normal data alternate in the entire normal data area.

As shown in examples 3, 4, and 5, diverse types of slots are repeatedly arranged in various ways. In particular, all of the slots are combined into a single type slot as shown in example 6.

Figure 43:
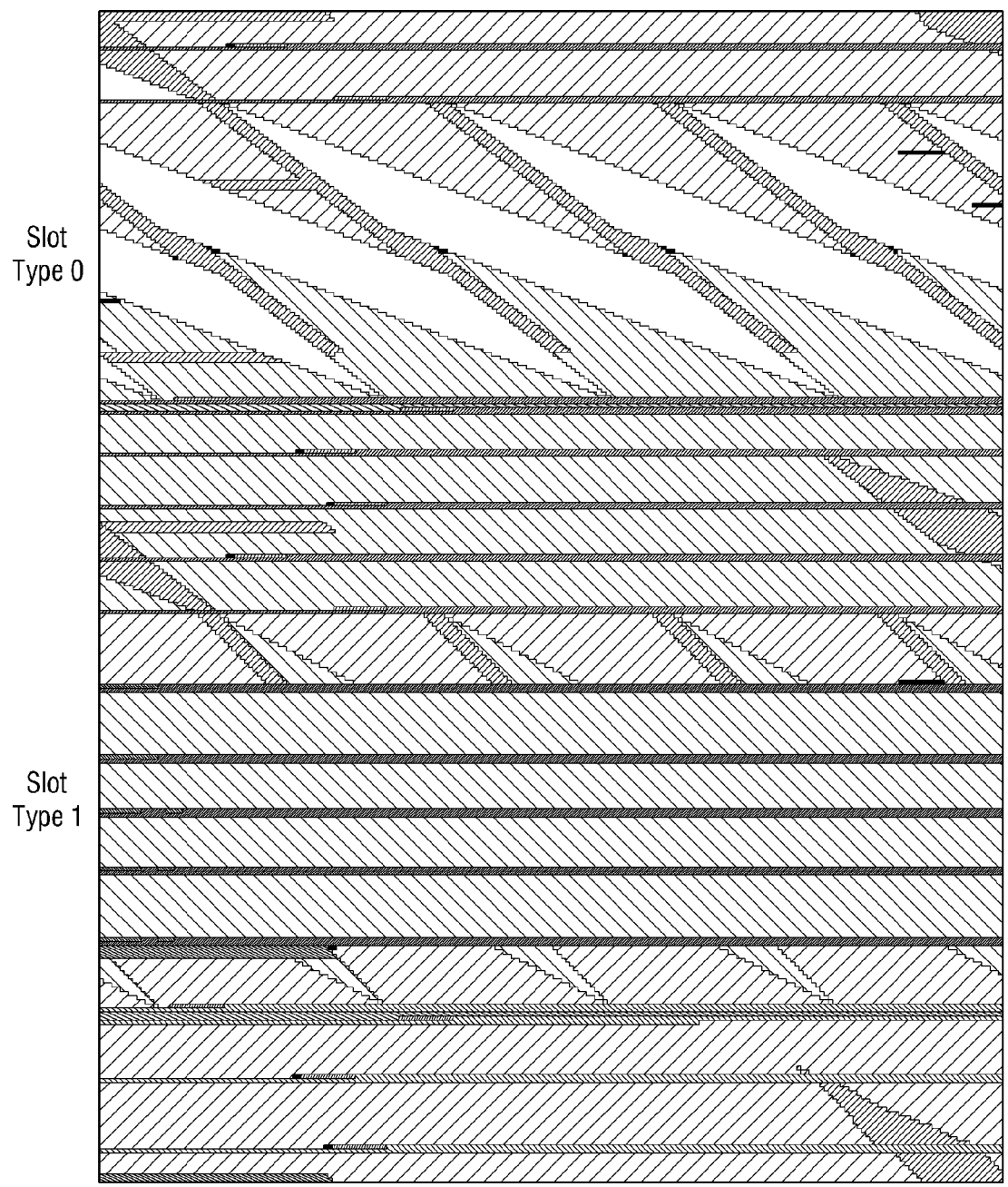

FIG. 43 is a view illustrating a configuration of the stream according to example 2 of FIG. 42. In FIG. 43, the normal data area is used for normal data at the 0 type slot, but the entire normal data area is used for mobile data and simultaneously the known data is placed in the pattern of long training sequences at the 1 type slot. As described above, a slot type may be implemented in various way as described above.

FIGS. 44 to 47 illustrate configurations of streams to explain a method for allocating blocks in the first through the fourth modes. As described above, the first area and the second area are each divided into a plurality of blocks.

The data pre-processor 100 performs block-coding on a block basis or on a block group basis according to a predetermined block mode.

Figure 44:
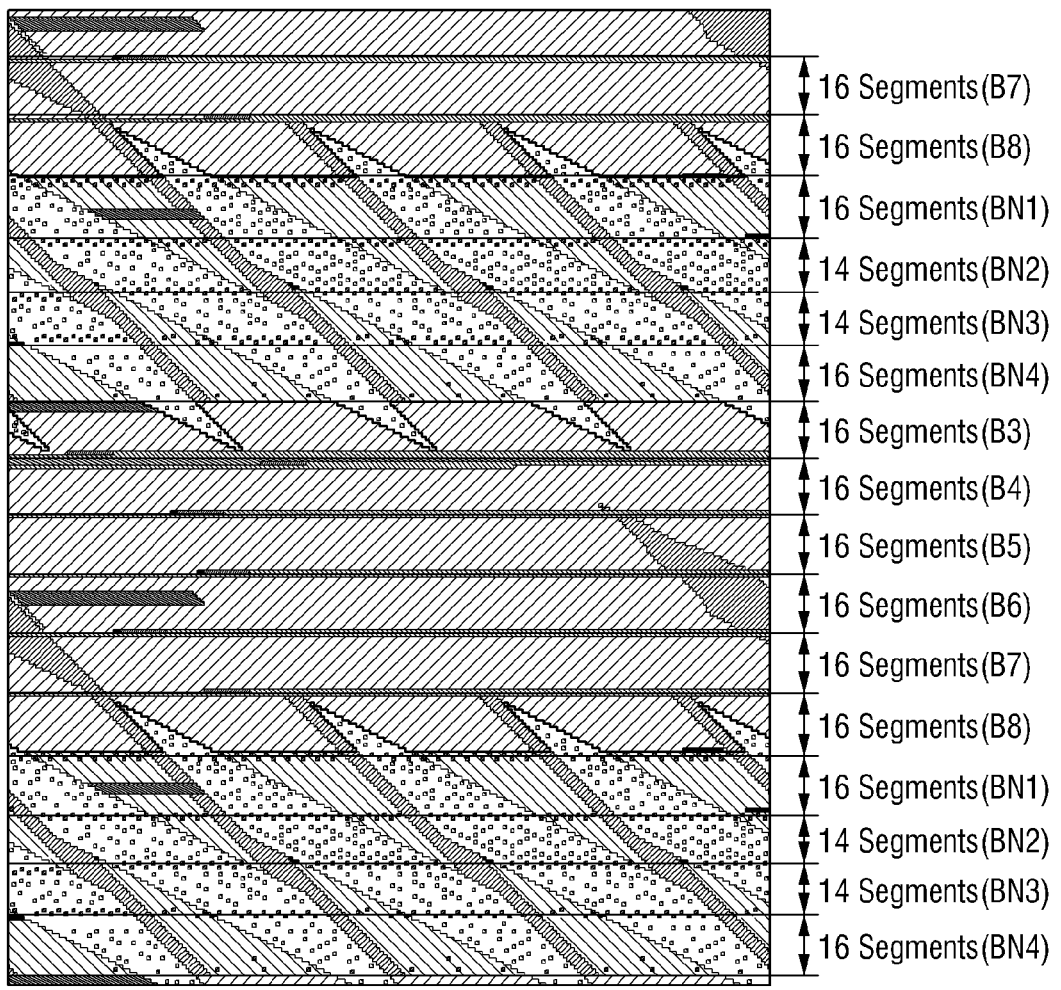
FIGS. 44 to 47 are views illustrating a block allocating method according to various exemplary embodiments.

FIG. 44 illustrates blocks being divided in a first mode. Referring to FIG. 44, the body area is divided into blocks B3-B8 and the head/tail area is divided into blocks BN1-BN4.

Figure 45:
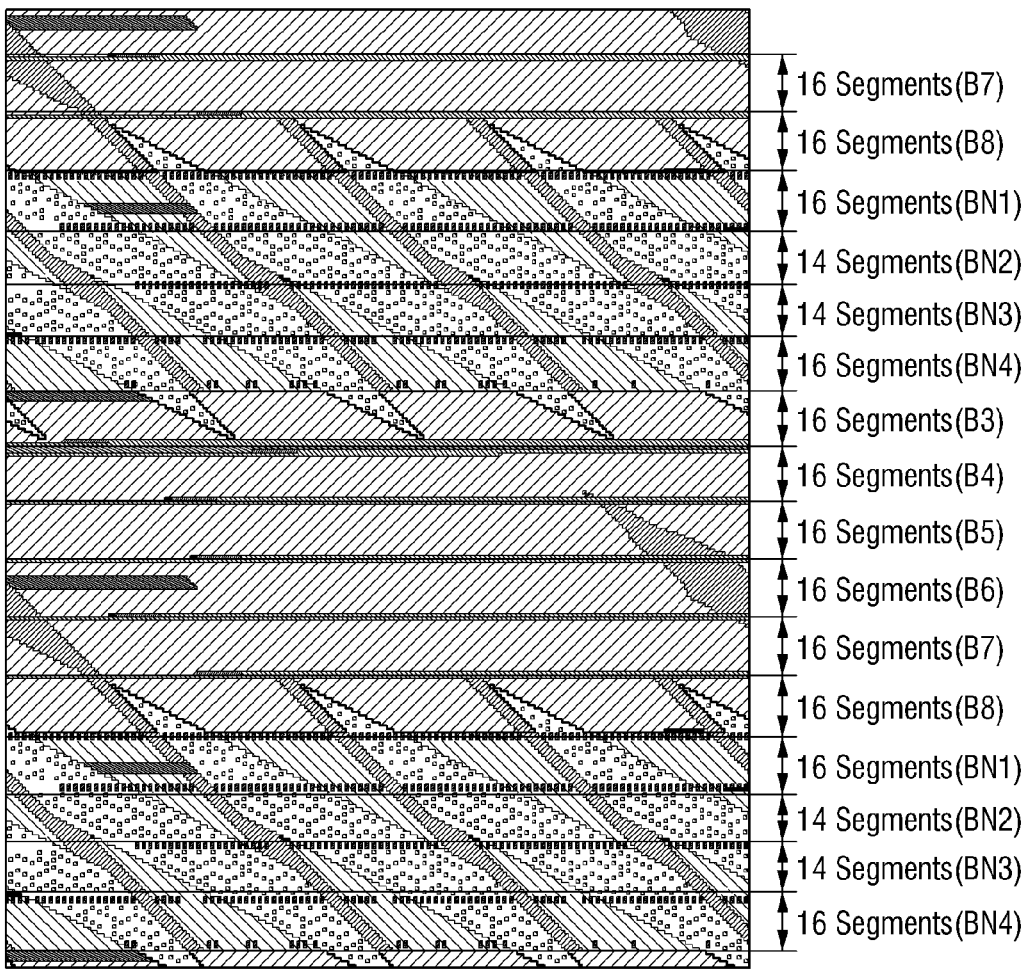
Figure 46:
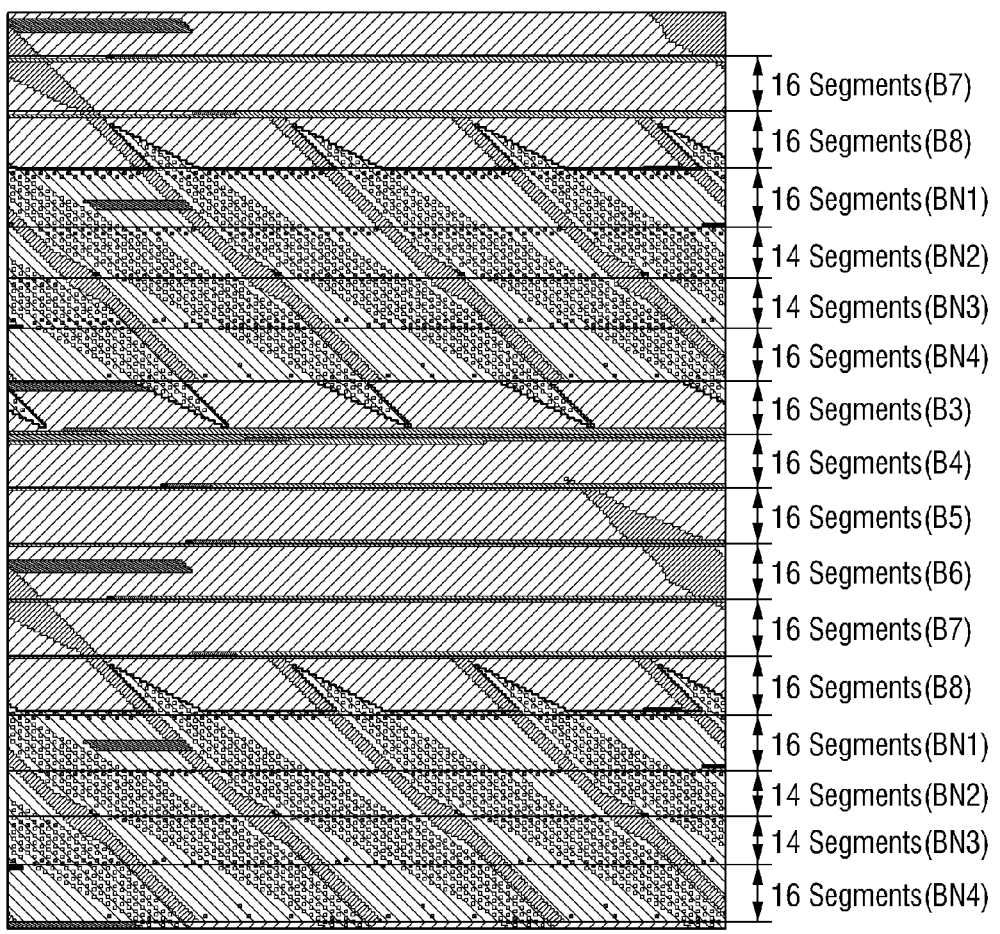

FIGS. 45 and 46 illustrate blocks being divided in a second mode and a third mode, respectively. Likewise, each of the body area and the head/tail area are divided into a plurality of blocks.

Figure 47:
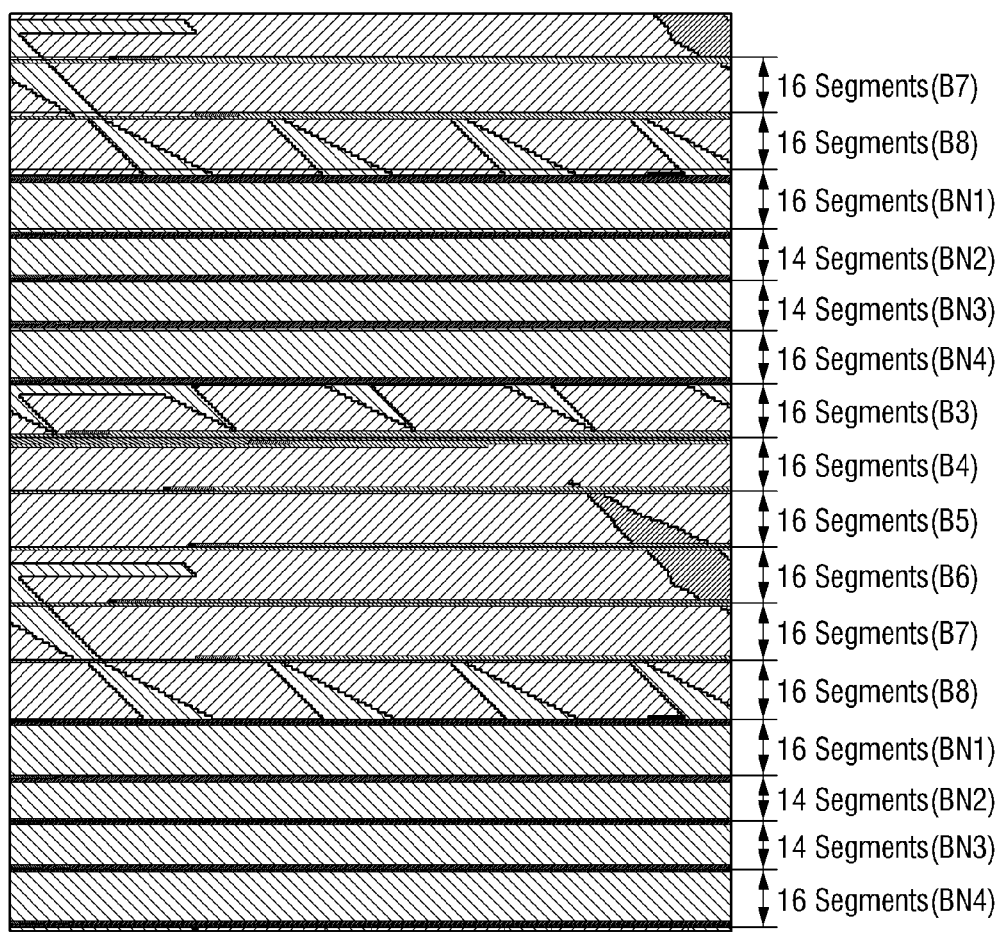

FIG. 47 illustrates blocks being divided in a fourth mode in which the head/tail area is completely filled with mobile data. As the normal data area is completely filled with the mobile data, the MPEG header of the body area and the parity portion of the normal data may not be necessary and thus they are denoted by block BN5 in FIG. 47. Unlike in FIGS. 44 to 46, the head/tail area is divided into blocks BN1-BN5 in FIG. 47.

As described above, the block processor 120 of the data pre-processor 100 divides an RS frame into blocks and processes the blocks. That is, as shown in FIG. 7, the block processor 120 includes a first converter 121 which combines the mobile data in the RS frame according to a predetermined block mode, thereby outputting a serially concatenated convolutional code (SCCC) block.

The block mode may be set diversely in various exemplary embodiments.

For example, if the block mode is set to "0", each block such as BN1, BN2, BN3, BN4, and BN5 is output as a single SCCC block and serves as a unit for SCCC coding.

On the other hand, if the block is set to "1", the blocks are combined to configure a SCCC block. More specifically, BN1+BN3=SCBN1, BN2+BN4=SCBN2, and BN5 solitarily becomes SCBN3.

In addition to the mobile data placed in the second area, the first mobile data placed in the first area may be block-coded by being combined into a single block or a block group of a plurality of blocks according to the block mode. This operation is the same as in the related-art ATSC-MH and a detailed description thereof is omitted.

Information regarding the block mode may be included in existing signaling data or may be included in an area provided in new signaling data to be notified to the digital broadcast receiver. The digital broadcast receiver identifies the information regarding the block mode and decodes the data appropriately, thereby recovering the original stream.

Also, the RS frame may be configured by combining data to be block-coded as described above. That is, the frame encoder 110 of the data pre-processor 100 combines frame potions appropriately to generate an RS frame, so that the block processor 120 performs block-coding appropriately.

More specifically, an RS frame 0 is configured by combining blocks SCBN1 and SCBN2, and an RS frame 1 is configured by combining blocks SCBN3 and SCBN4.

Also, the RS frame 0 may be configured by combining blocks SCBN1, SCBN2, SCBN3, and SCBN4, and the RS frame 1 may be configured by block SCBN 5.

Also, a single RS frame may be configured by combining blocks SCBN1, SCBN2, SCBN3, SCBN4, and SCBN5.

Otherwise, an RS frame may be configured by combining a block corresponding to first mobile data and newly added blocks SCBN1~SCBN5.

Figure 48:
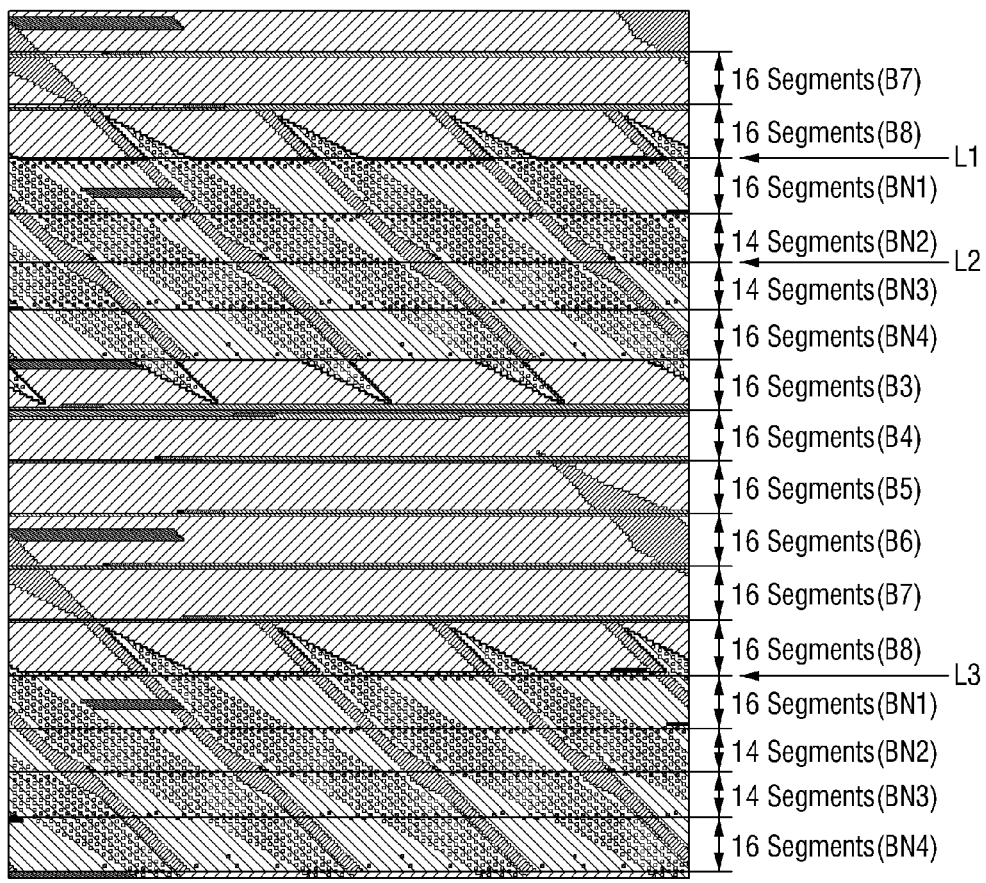
FIG. 48 is a view to explain diverse starting points of an RS frame according to various exemplary embodiments.

FIG. 48 is a view to explain various methods for defining a starting point of an RS frame. Referring to FIG. 48, a transport stream is divided into a plurality of blocks. In the related-art ATSC-MH, an RS frame is discriminated between blocks BN2 and BN3. However, the RS frame may start from various points as the mobile data and the known data are inserted into the normal data area.

For example, the RS frame may start from a boundary between BN1 and B8, may start from a boundary between BN2 and BN3, similar to a current reference point, or may start from a boundary between B8 and BN1. The starting point of the RS frame may be determined according the combination condition of the block coding.

Configuration information of the RS frame may be included in the existing signaling data or an area provided in the new signaling data to be provided to the digital broadcast receiver.

As described above, since the new mobile data and the known data are inserted into both the area allocated to the original normal data and the area allocated to the first mobile data, diverse information for notifying the digital broadcast receiver of the existence of the new mobile data and the known data may be implemented. Such information may be transmitted using a reserved bit in a TPC area of the related-art ATSC-MH standard or may be transmitted as new signaling data contained in a new signaling data area newly provided in the stream according to an aspect of an exemplary embodiment. The new signaling data area is located in the head/tail portion since it should be in the same location irrespective of the mode.

Figure 49:
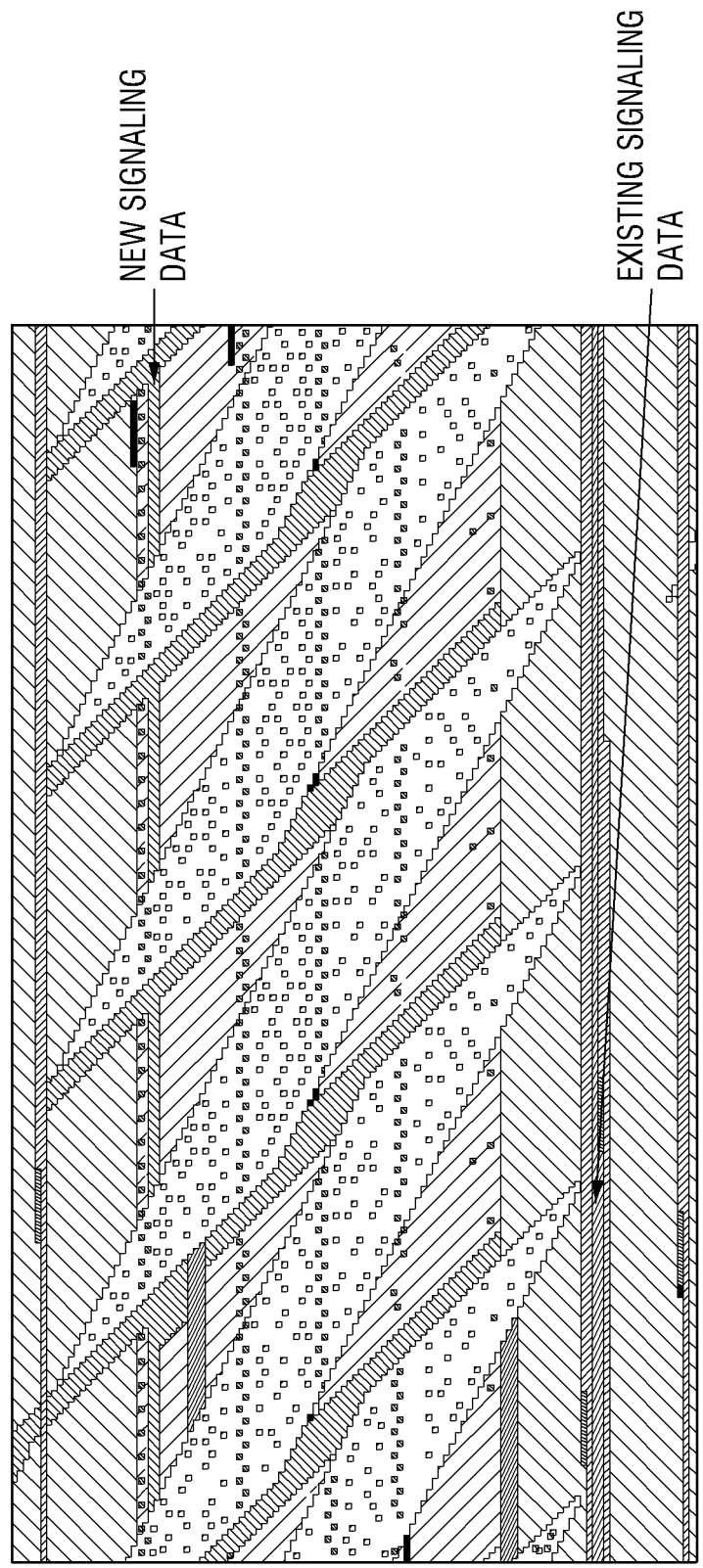
FIG. 49 is a view to explain a location where signaling data is inserted.

FIG. 49 illustrates a configuration of a stream indicating the location of related art signaling data and the location of new signaling data.

Referring to FIG. 49, the related art signaling data is located between long training sequences of the body area, and the new signaling data is located in the head/tail area. The new signaling data encoded by the signaling encoder 150 is inserted into the same predetermined location as in FIG. 49 by the group formatter 130.

The singling encoder 150 may use a code different from that of a related-art signaling encoder or perform coding at a different code rate, thereby improving performance. For example, a 1/8 PCCC code may be used in addition to an existing RS code. Alternatively, the same data is transmitted two times using a RS+1/4 PCCC code, so that the same effect as when using the 1/8 rate PCCC code can be obtained.

Also, since the known data is included in the transport stream as described above, the memory of the trellis encoder may be initialized before the known data is trellis-encoded.

If the long training sequences are provided as in the fourth mode, there is no serious problem since a corresponding sequence can be processed by a single initialization operation. However, if the known data is placed discontinuously as in the other modes, there is a problem that the initialization operation may be performed several times. Also, if the memory is initialized to 0, it may be difficult to make a symbol as in the fourth mode.

Accordingly, in the first through the third modes, a trellis encoder memory value (that is, a register value) of the mode 4 at the same location without trellis reset may be loaded directly onto the trellis encoder so as to make a same or almost same symbol as in the mode 4. To achieve this, memory storage values of the trellis encoder in the mode 4 are recorded and stored in the form of a table so that the memory storage values can be trellis encoded into values of corresponding locations of the table. Also, an additional trellis encoder operating in the mode 4 may be provided and, thus, a value obtained from the additional trellis encoder is utilized.

As described above, the mobile data can be provided diversely by utilizing the normal data area and the existing mobile data area in the transport stream. Accordingly, as compared to the related-art ATSC standard, a stream more suitable for the transmission of the mobile data can be provided.

[Signaling]

Also, a technique of notifying the digital broadcast receiver that the new mobile data and the known data are added to the transport stream in order for the receiver to process the data as described above is implemented. The notification may be made in various ways.

More specifically, in a first method, the presence/absence of the new mobile data may be notified using a data field sync which is used for transmitting existing mobile data.

Figure 50:
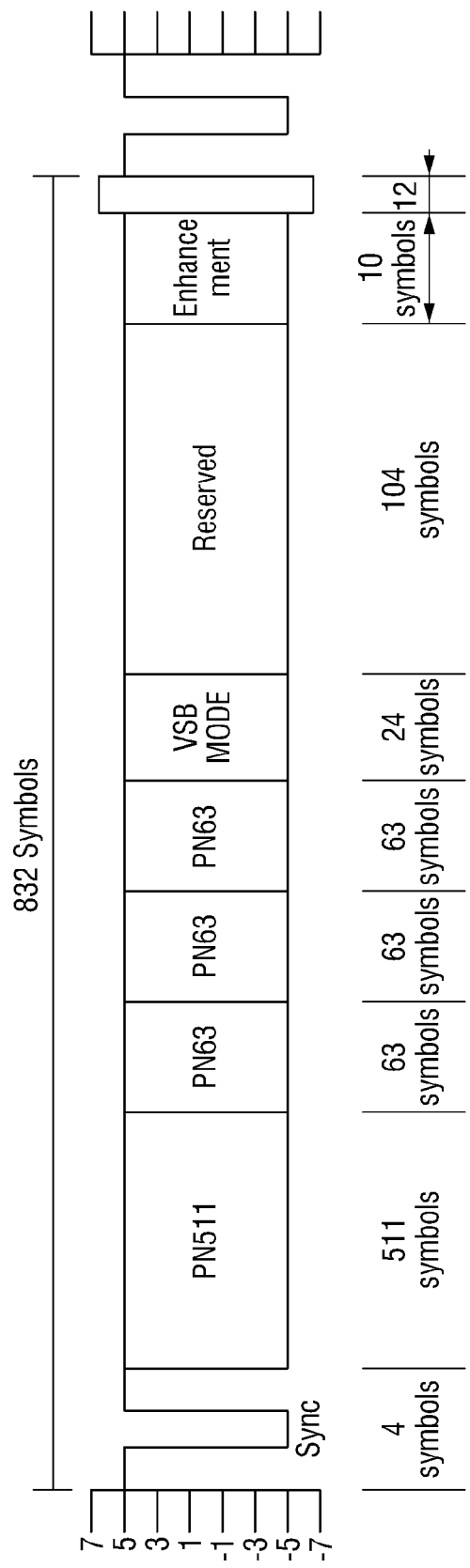
FIG. 50 is a view illustrating an example of a data field sync configuration for transmitting signaling data.

FIG. 50 is a view illustrating an example of a data field sync configuration. Referring to FIG. 50, data field sync includes 832 symbols in total, 104 symbols of which correspond to a reserved area. The $83^{rd}$ to $92^{nd}$ symbols, that is, 10 symbols in the reserved area, correspond to an enhancement area.

If only 1.0 version data is included, in the odd numbered data field, the $85^{th}$ symbol is +5 and the remaining symbols, that is, the $83^{rd}$, $84^{th}$, $86^{th}$~$92^{nd}$ symbols are −5. In the even numbered data field, the reverse sign of the symbol of the odd numbered data field is applied.

If 1.1 version data is included, in the odd numbered data field, the $85^{th}$ and $86^{th}$ symbols are +5 and the remaining symbols, that is, the $83^{rd}$, $84^{th}$, $87^{th}$~$92^{nd}$ symbols are −5. In the even numbered data field, the reverse sign of the symbol of the odd numbered data field is applied. That is, whether the 1.1 version data is included or not is determined using the $86^{th}$ symbol.

Also, whether the 1.1 version data is included or not is notified using another symbol in the enhancement area. That is, by setting one or a plurality of symbols except for the $85^{th}$ symbol to +5, it is determined whether the 1.1 version data is included or not. For example, the $87^{th}$ symbol may be used.

The data filed sync may be generated by the controller of FIG. 3, a signaling encoder, or a field sync generator additionally provided, may be provided to the sync multiplexer 470 of FIG. 4, and may be multiplexed into a stream by the sync multiplexer 470.

In a second method, the presence/absence of 1.1 version data may be notified using a TPC. The TPC includes syntax as in, for example, the following table:

TABLE 1

| Syntax | No. of Bits | Format |
|---|---|---|
| TPC_data { | | |
| sub-frame_number | 3 | uimsbf |
| slot_number | 4 | uimsbf |
| parade_id | 7 | uimsbf |
| starting_group_number | 4 | uimsbf |
| number_of_groups_minus_1 | 3 | uimsbf |
| parade_repetition_cycle_minus_1 | 3 | uimsbf |
| rs_frame_mode | 2 | bslbf |
| rs_code_mode_primary | 2 | bslbf |
| rs_code_mode_secondary | 2 | bslbf |
| sccc_block_mode | 2 | bslbf |
| sccc_outer_code_mode_a | 2 | bslbf |
| sccc_outer_code_mode_b | 2 | bslbf |
| sccc_outer_code_mode_c | 2 | bslbf |
| sccc_outer_code_mode_d | 2 | bslbf |
| fic_version | 5 | uimsbf |
| parade_continuity_counter | 4 | uimsbf |

TABLE 1-continued

| Syntax | No. of Bits | Format |
|---|---|---|
| total_number_of_groups | 5 | uimsbf |
| reserved | 21 | bslbf |
| tpc_protocol_version | 5 | bslbf |
| } | | |

The TPC information includes a reserved area. Accordingly, whether or not mobile data is included in the packets allocated to normal data, that is, in the second area packets, the location of the mobile data, whether new known data is added or not, and the location of added known data can be signaled using one or a plurality of bits in the reserved area.

Inserted information can be expressed, for example, as follows:

TABLE 2

| NECESSARY FIELD | Bits (Variable) |
|---|---|
| 1.1 RS FRAME MODE | 3 |
| 1.1 MOBILE MODE | 2 |
| 1.1 SCCC BLOCK MODE | 2 |
| 1.1 SCCCBM1 | 2 |
| 1.1 SCCCBM2 | 2 |
| 1.1 SCCCBM3 | 2 |
| 1.1 SCCCBM4 | 2 |
| 1.1 SCCCBM5 | 2 |

In table 2, a 1.1 RS frame mode is information indicating whether the packet allocated to the normal data is used for normal data or used for new mobile data, that is, 1.1 version data.

A 1.1 mobile mode is information indicating in what pattern the mobile data is placed in the packets allocated to the normal data. That is, the 1.1 mobile mode is expressed by either one of "00", "01", "10", and "11" using 2 bits, thereby indicating one of the above described first to fourth modes. Accordingly, the stream is configured in various ways as in FIGS. 29, 31, 33, 35, 37, 38, 39, and 40, and the digital broadcast receiver identifies the mobile mode information to know the location of the mobile data.

A 1.1 SCCC block mode is information indicating a block mode of the 1.1 version data. The other modes 1.1 SCCCBM1~SCCCBM5 are information indicating a coding unit of the 1.1 version data.

In addition to the information described in table 2, diverse information may be further provided so as to allow the digital broadcast receiver to detect and decode new mobile data appropriately. The number of bits allocated to each information may be changed if necessary and a location of each field may be arranged in an order different from table 2.

The presence/absence of new mobile data may be notified to the digital broadcast receiver using FIC information.

That is, a 1.1 version receiver which receives and processes new mobile data may be able to process 1.0 service information and 1.1 service information simultaneously. Conversely, a 1.0 version receiver may be able to disregard the 1.1 service information.

Accordingly, by changing existing FIC segment syntax, an area for notifying the presence/absence of 1.1 version data can be prepared.

The existing FIC segment syntax is configured, for example, as follows:

TABLE 3

| Syntax | No. of Bits | Format |
|---|---|---|
| FIC_segment_header( ) { | | |
|     FIC_segment_type | 2 | uimsbf |
|     reserved | 2 | '11' |
|     FIC_chunk_major_protocol_version | 2 | uimsbf |
|     current_next_indicator | 1 | bslbf |
|     error_indicator | 1 | bslbf |
|     FIC_segment_num | 4 | uimsbf |
|     FIC_last_segment_num | 4 | uimsbf |
| } | | |

The FIC segment of table 3 may be changed, for example, as follows to be able to notify the presence/absence of 1.1 version data.

TABLE 4

| Syntax | No. of Bits | Format |
|---|---|---|
| FIC_segment_header( ) { | | |
|     FIC_segment_type | 2 | uimsbf |
|     current_next_indicator | 1 | bslbf |
|     error_indicator | 1 | bslbf |
|     FIC_chunk_major_protocol_version | 2 | uimsbf |
|     FIC_segment_num | 5 | uimsbf |
|     FIC_last_segment_num | 5 | uimsbf |
| } | | |

Referring to table 4, FIC_segement_num and FIC_last_segment_num are extended to 5 bits instead of the reserved area.

In table 4, by adding 01 to FIC_segement_type, the presence/absence of 1.1 version data can be notified. That is, if FIC_segment_type is set to 01, the 1.1 version receiver decodes FIC information and processes the 1.1 version data. In this case, the 1.0 version receiver cannot detect FIC information. Conversely, if FIC_segement_type is set to 00 or null segment, the 1.0 version receiver decodes the FIC information and processes the existing mobile data.

The presence/absence of 1.1 version data may be notified using some area of the FIC chunk syntax without changing the original FIC syntax, for example, using a reserved area.

The FIC may include 16 bits or more when configuring the maximum FIC chunk. By changing some of syntax for the FIC chunk, the status of the 1.1 version data can be notified.

More specifically, "MH 1.1 service_status" may be added to the reserved area of a service ensemble loop, for example, as follows:

TABLE 5

| Syntax | No. of Bits | Format |
|---|---|---|
| FIC_chunk_payload( ){ | | |
|     for(i=0; i<num_ensembles; i++){ | | |
|         ensemble_id | 8 | uimsbf |
|         reserved | 3 | '111' |
|         ensemble_protocol_version | 5 | uimsbf |
|         SLT_ensemble_indicator | 1 | bslbf |
|         GAT_ensemble_indicator | 1 | bslbf |
|         reserved | 1 | '1' |
|         MH_service_signaling_channel_version | 5 | uimsbf |
|         num_MH_services | 8 | uimsbf |
|         for (j=0; j<num_MH_services; j++){ | | |
|             MH_service_id | 16 | uimsbf |

TABLE 5-continued

| Syntax | No. of Bits | Format |
|---|---|---|
|             MH1.1_service_status | 2 | uimsbf |
|             reserved | 1 | '1' |
|             multi_ensemble_service | 2 | uimsbf |
|             MH_service_status | 2 | uimsbf |
|             SP_indicator | 1 | bslbf |
|         } | | |
|     } | | |
|     FIC_chunk_stuffing( ) | var | |
| } | | |

Referring to table 5, MH 1.1_service_status may be displayed using 2 bits of the 3 bits in the reserved area. MH 1.1_service_status may be data indicating whether 1.1 version data is present or not in the stream.

In addition to MH1.1_service_status, MH1.1_ensemble_indicator may be added. That is, the syntax of the FIC chunk may be configured, for example, as follows:

TABLE 6

| Syntax | No. of Bits | Format |
|---|---|---|
| FIC_chunk_payload( ){ | | |
|     for(i=0; i<num_ensembles; i++){ | | |
|         ensemble_id | 8 | uimsbf |
|         MH1.1_ensemble_indicator | 1 | bslbf |
|         reserved | 2 | '11' |
|         ensemble_protocol_version | 5 | uimsbf |
|         SLT_ensemble_indicator | 1 | bslbf |
|         GAT_ensemble_indicator | 1 | bslbf |
|         reserved | 1 | '1' |
|         MH_service_signaling_channel_version | 5 | uimsbf |
|         num_MH_services | 8 | uimsbf |
|         for (j=0; j<num_MH_services; j++){ | | |
|             MH_service_id | 16 | uimsbf |
|             MH1.1_service_status_extension | 2 | uimsbf |
|             reserved | | '1' |
|             multi_ensemble_service | 2 | uimsbf |
|             MH_service_status | 2 | uimsbf |
|             SP_indicator | 1 | bslbf |
|         } | | |
|     } | | |
|     FIC_chunk_stuffing( ) | var | |
| } | | |

Referring to table 6, 1 bit of the 3 bits in the first reserved area is allocated to MH1.1_ensemble_indicator. MH1.1_ensemble_indicator is information regarding an ensemble which is a service unit of 1.1 version data. In table 6, MH1.1_service_status_extension may be displayed using 2 bits of the 3 bits in the second reserved area.

In a case that a 1.1 version service is provided by changing an ensemble protocol version as in, for example, the following table 7, the 1.1 version service is clearly presented using a value allocated to a reserved area of 1.0 version.

TABLE 7

| Syntax | No. of Bits | Format |
|---|---|---|
| FIC_chunk_payload( ){ | | |
|     for(i=0; i<num_ensembles; i++){ | | |
|         ensemble_id | 8 | uimsbf |
|         reserved | 3 | '111' |
|         ensemble_protocol_version | 5 | uimsbf |
|         SLT_ensemble_indicator | 1 | bslbf |

TABLE 7-continued

| Syntax | No. of Bits | Format |
|---|---|---|
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++){ | | |
|         MH_service_id | 16 | uimsbf |
|         reserved | 3 | '111' |
|         multi_ensemble_service | 2 | uimsbf |
|         MH_service_status | 2 | uimsbf |
|         SP_indicator | 1 | bslbf |
|     } | | |
| } | | |
|     FIC_chunk_stuffing( ) | var | |
| } | | |

Also, signaling data may be transmitted by changing the ensemble loop header extension length of the syntax field of the FIC chunk header, adding an ensemble extension to the syntax field of the FIC chunk payload, and adding MH1.1_service_status to service loop reserved 3 bits of the syntax of the FIC chunk payload, as in, for example, the following table 8:

TABLE 8

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     reserved | 3 | uimsbf |
|     ensemble_extension | 5 | |
|     num_MH_services | 8 | uimsbf |
|     for (j=0; j<num_MH_services; j++){ | | |
|         MH_service_id | 16 | uimsbf |
|     MH_service_status_extention | 2 | |
|     reserved | 1 | |
|         reserved | 3 | '111' |
|         multi_ensemble_service | 2 | uimsbf |
|         MH_service_status | 2 | uimsbf |
|         SP_indicator | 1 | bslbf |
|     } | | |
| } | | |
|     FIC_chunk_stuffing( ) | var | |
| } | | |

Also, MH_service_loop_extension_length of the syntax field of the FIC chunk header may be changed and an information field regarding MH1.1_service status of the payload field of the FIC chunk may be added, as in, for example, the following table 9:

TABLE 9

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |

TABLE 9-continued

| Syntax | No. of Bits | Format |
|---|---|---|
|     reserved | | |
|     MH_service_signaling_channel_version | 5 | uimsbf |
|     num_MH_services | 8 | uimsbf |
|     for (j=0; j<num_MH_services; j++){ | | |
|         MH_service_id | 16 | uimsbf |
|         reserved | 3 | '111' |
|         multi_ensemble_service | 2 | uimsbf |
|         MH_service_status | 2 | uimsbf |
|         SP_indicator | 1 | bslbf |
|     reserved | 5 | uimsbf |
|     MH1.1_Detailed_service_Info | 3 | uimsbf |
|     } | | |
| } | | |
|     FIC_chunk_stuffing( ) | var | |
| } | | |

As described above, the signaling data may be provided to the digital broadcast receiver using diverse areas such as field sync, TPC information, and FIC information.

Also, the signaling data may be inserted into an area other than these areas. That is, the signaling data may be inserted into a packet payload portion of existing data. In this case, the presence of 1.1 version data or the location of signaling data is simply recorded using FIC information shown in table 5, and signaling data for a 1.1 version is additionally provided so that the 1.1 version receiver detects corresponding signaling data and uses it.

The signaling data may be configured as a separate stream and may be transmitted to the digital broadcast receiver using a separate channel from a stream transmission channel.

Also, the signaling data may further include information capable of signaling at least one presence/absence of first or new mobile data, location of mobile data, addition of known data, location of added known data, placing pattern of mobile data and known data, block mode, coding unit, and so on.

The digital broadcast transmitter using the signaling data may be implemented with a configuration including a data pre-processor to place at least one of mobile data and known data in at least one portion of a normal data area among all packets of a stream, and a multiplexer to generate a transport stream including the mobile data and the signaling data. A detailed configuration of the data pre-processor may be implemented according to one of the aforementioned exemplary embodiments or another exemplary embodiment, for example, where some element may be omitted, added or changed. In particular, the signaling data may be generated by a signaling encoder, controller, or a filed sync generator (not shown) additionally provided and may be inserted into the transport stream by the multiplexer or the sync multiplexer. In this case, the signaling data is information indicating at least one of the presence/absence of the mobile data and the placing pattern, and, as described above, may be implemented as data field sync or TPC or FIC information.

[Digital Broadcast Receiver]

As described above, the digital broadcast transmitter may transmit new mobile data using part or all of the packets allocated to normal data and part or all of the packets allocated to existing mobile data in a stream configuration.

The digital broadcast receiver which receives the above stream may receive and process at least one data from among first mobile data, normal data, and new mobile data depending on its version.

That is, once the above-mentioned streams in various configurations are received, a related art digital broadcast receiver for processing normal data may detect and decode normal data by identifying signaling data. As described above, if the received stream is in a mode which does not include normal data at all, the receiver for processing normal data may not provide a normal data service.

However, if the above-mentioned streams in various configurations are received in a 1.0 version digital broadcast receiver, the receiver may detect and decode first mobile data based on signaling data. If 1.1 version mobile data is located in entire area, the 1.0 version digital broadcast receiver may not provide a mobile service, either.

On the other hand, a 1.1 version digital broadcast receiver may detect and process not only 1.1 version data but also 1.0 version data. In this case, if a decoding block for processing normal data is formed, normal data service may be supported.

Figure 51:
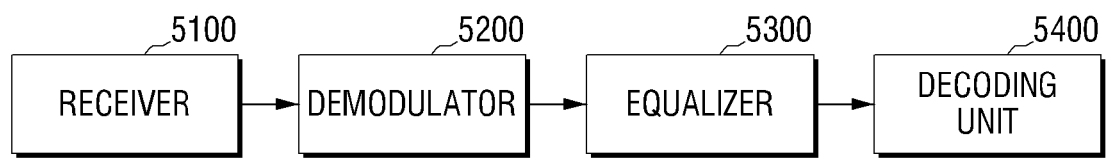
FIGS. 51 to 53 are views illustrating a digital broadcast receiver according to various exemplary embodiments.

FIG. 51 is a block diagram illustrating an example of a configuration of a digital broadcast receiver according to an exemplary embodiment. According to some, though not all, exemplary embodiments, the digital broadcast receiver may have a configuration in which elements correspond to various elements of the digital broadcast transmitter in FIGS. 2 to 4 are located reversely. Accordingly, in the exemplary embodiment in FIG. 51, only essential elements are illustrated for convenience of description.

Referring to FIG. 51, the digital broadcast receiver includes a receiver 5100, a demodulator 5200, an equalizer 5300, and a decoder 5400.

The receiver 5100 receives a transport stream transmitted from the digital broadcast transmitter via an antenna or a cable.

The demodulator 5200 demodulates the transport stream received via the receiver 5100. The frequency, clock signal, etc. of the signal received via the receiver 5100 are synchronized with the digital broadcast transmitter as they go through the demodulator 5200.

The equalizer 5300 equalizes the demodulated transport stream.

The demodulator 5200 and the equalizer 5300 may perform synchronization and equalization using known data included in the transport stream, for example, known data which is added along with new mobile data.

The decoder 5400 detects mobile data from the equalized transport stream and decodes the data.

The location where the mobile data and known data are inserted and the volume of the mobile data and known data may be notified by signaling data included in the transport stream or by signaling data received via a separate channel.

The decoder 5400 may determine a location of mobile data suitable for the digital broadcast receiver using signaling data, detect mobile data from the determined location, and decode the mobile data.

The configuration of the decoder 5400 may vary according to various exemplary embodiments.

That is, the decoder 5400 may include two decoders of a trellis decoder (not shown) and a convolution decoder (not shown). The two decoders may enhance performance by exchanging information on decoding reliability with each other. The output of the convolution decoder may be identical or similar to the input of the RS encoder of the transmitter.

Figure 52:
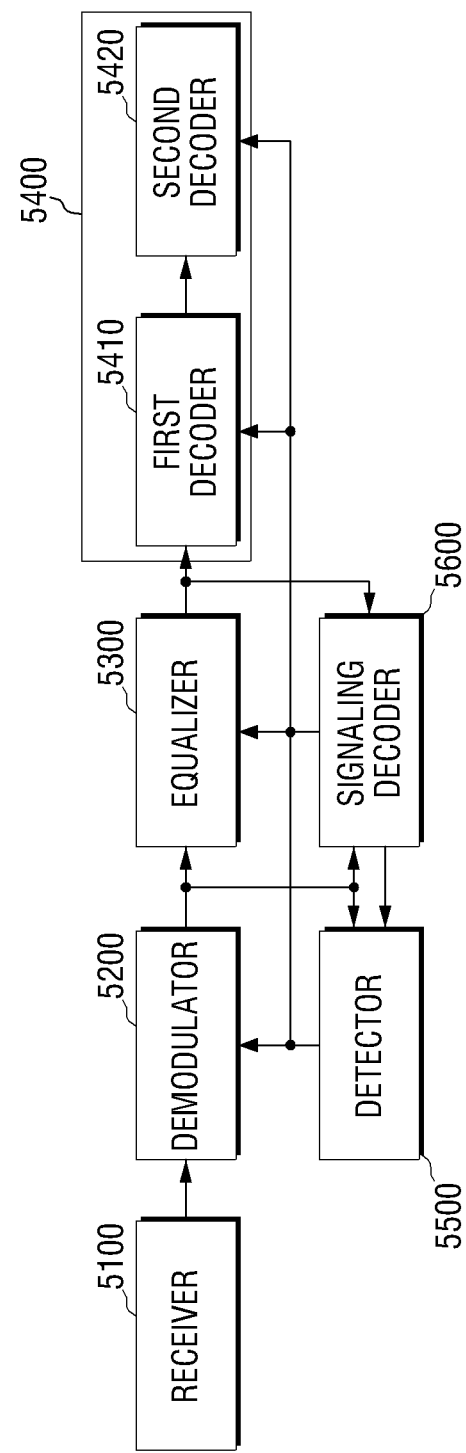

FIG. 52 is a block diagram illustrating an example of a detailed configuration of a digital broadcast receiver according to an exemplary embodiment.

Referring to FIG. 52, the digital broadcast receiver may include the receiver 5100, the demodulator 5200, the equalizer 5300, the decoder 5400, a detector 5500, and a signaling decoder 5600.

Since operations of the receiver 5100, the demodulator 5200, the equalizer 5300 are the same or similar to those in FIG. 51, explanations thereof will not be provided herein.

The decoder 5400 may include a first decoder 5410 and a second decoder 5420.

The first decoder 5410 decodes at least one of first mobile data and new mobile data. The first decoder 5410 may perform SCCC decoding which decodes data by block.

The second decoder 5420 performs RS decoding on the stream that has been decoded by the first decoder 5410.

The first and second decoders 5410, 5420 may process mobile data using the output value of the signaling decoder 5600.

That is, the signaling decoder 5600 may detect signaling data included in the stream and decode the data. Specifically, the signaling decoder 5600 de-multiplexes a reserved area in field sync data, or a TPC information area and an FIC information area from the transport stream. Accordingly, the de-multiplexed portion is convolutional decoded and RS decoded, and derandomized so that signaling data may be recovered. The recovered signaling data is provided to each element of the digital broadcast receiver, that is, the demodulator 5200, the equalizer 5300, the decoder 5400, and the detector 5500. The signaling data may include information that is used by each element, such as block mode information, mode information, known data insertion pattern information, and RS frame mode information. The types and functions of such information have been explained above, so further explanation regarding them is not provided herein.

A variety of information such as a coding rate of mobile data, a data rate, an inserting location, a type of used error correction code, information on a primary service, information used to support time slicing, a description regarding mobile data, information relating to the mode information conversion, and information used to support an internet protocol (IP) service may be provided to the receiver in the form of signaling data or additional data.

The signaling data may be included in the stream in FIG. 52. However, if a signaling data signal is transmitted through a separate channel, the signaling decoder 5600 decodes such a signaling data signal and provides the above information.

The detector 5500 may detect known data from the stream using the known data insertion pattern information provided by the signaling decoder 5600. In this case, known data that is inserted together with the first mobile data may be processed in addition to the known data that is inserted together with the new mobile data.

Specifically, the known data may be inserted into at least one of the body area and the head/tail area of the mobile data in various locations and various patterns as shown in FIGS. 22 to 36. The information on the insertion pattern of the known data, for example, at least one of the location, the starting point, the length may be included in the signaling data. The detector 5500 may detect known data from an appropriate location according to the signaling data, and provide the demodulator 5200, the equalizer 5300, and the decoder 5400 with the detected known data.

Figure 53:
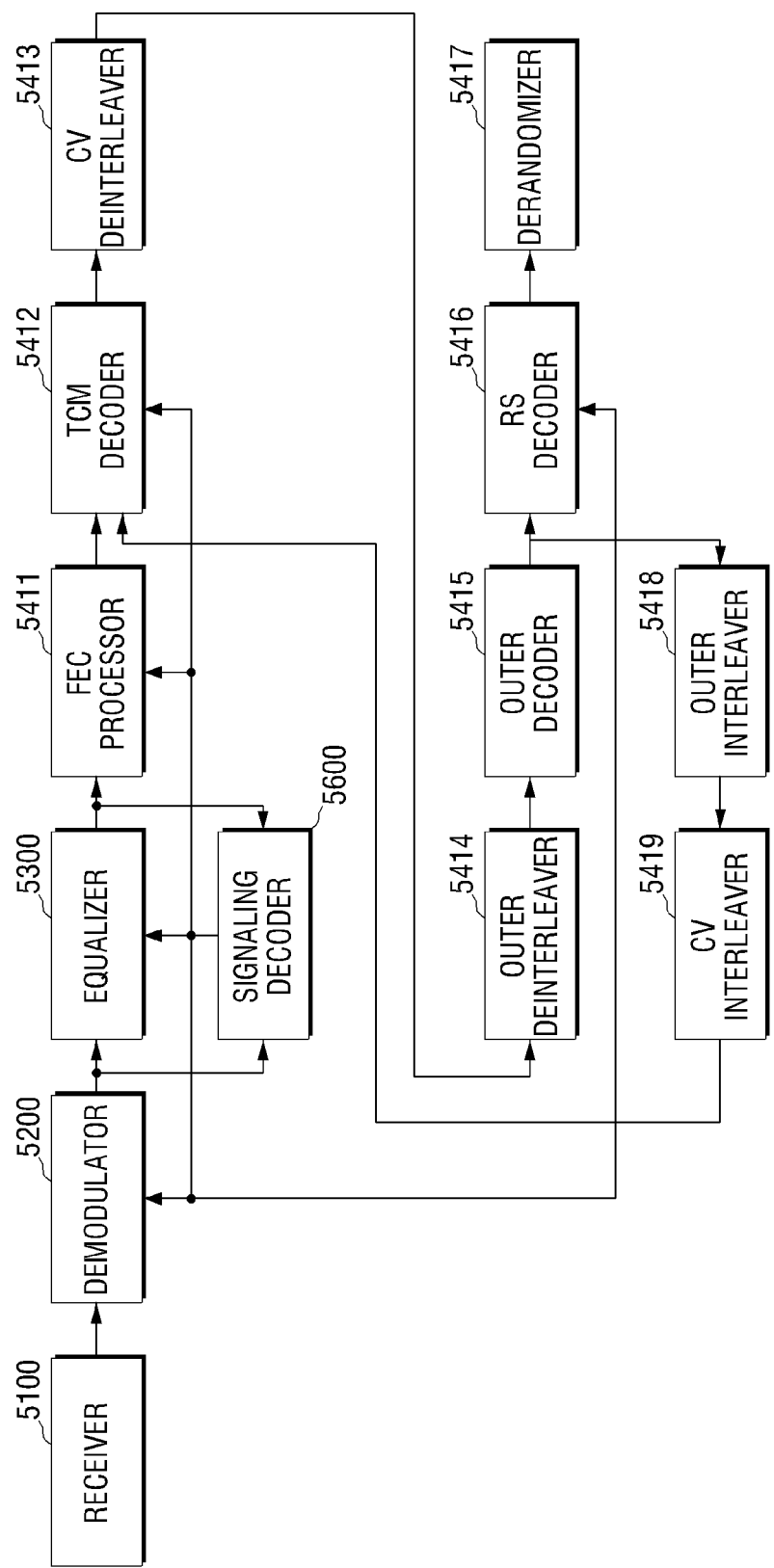

FIG. 53 is a view illustrating a detailed configuration of a digital broadcast receiver according to yet another exemplary embodiment.

Referring to FIG. 53, the digital broadcast receiver may include a receiver 5100, a demodulator 5200, an equalizer 5300, an FEC processor 5411, a TCM decoder 5412, a CV deinterleaver 5413, an outer deinterleaver 5414, an outer decoder 5415, an RS decoder 5416, a derandomizer 5417, an outer interleaver 5418, a CV interleaver 5419, and a signaling decoder 5600.

Since the operations or similar operations of the receiver 5100, the demodulator 5200, the equalizer 5300, and the signaling decoder 5600 have been described with reference to FIG. 52, overlapping explanations are not provided herein. Unlike in FIG. 52, the detector 5500 is not illustrated in FIG. 53. Each element may directly detect known data using the signaling data which is decoded by the signaling decoder 5600 as in the exemplary embodiment illustrated in FIG. 53.

The FEC processor 5411 may perform a forward error correction for the transport stream that is equalized by the equalizer 5300. The FEC processor 5411 may detect the known data from the transport stream using the information on the known data location or the insertion pattern among the information provided by the signaling decoder 5600 in order to use the known data in performing the forward error correction. Alternatively, an additional reference signal may not be used for the forward error correction according to another exemplary embodiment.

In FIG. 53, each element is placed in a configuration of decoding the mobile data after the FEC processing. That is, the FEC processing is performed for the entire transport stream. Alternatively, the elements may be implemented in a configuration of detecting the mobile data from the transport stream and then performing the FEC for only the mobile data.

The TCM decoder 5412 detects the mobile data from the transport stream output from the FEC processor 5411, and performs trellis decoding for the mobile data. In this case, if the FEC processor 5411 has already detected the mobile data, and performed the forward error correction for only the mobile data, the TCM decoder 5412 may immediately perform the trellis decoding for the input data.

The CV deinterleaver 5413 performs convolution de-interleaving for the trellis decoded data. As described above, since the configuration of the digital broadcast receiver may correspond to the configuration of the digital broadcast transmitter which configures and processes the transport stream, the CV de-interleaver 5413 may not be used or included according to the configuration of the transmitter.

The outer de-interleaver 5414 performs outer de-interleaving for the convolution de-interleaved data. After this, the outer decoder 5415 decodes the outer de-interleaved data in order to remove a parity that is inserted into the mobile data.

In some situations, the digital broadcast receiver may improve a performance in receiving the mobile data by repeating the operations from the TCM decoder 5412 to the outer decoder 5415 one or more times. For the repeated operations, the data decoded by the outer decoder 5415 may be provided to the TCM decoder 5412 passing through the outer interleaver 5418 and the CV interleaver 5419. In this situation, the CV interleaver 5419 may not be used or included according to the configuration of the transmitter.

The trellis decoded data may be provided to the RS decoder 5416. The RS decoder 5416 may perform RS decoding for the provided data, and the derandomizer 5417 may perform derandomizing for the provided data. The operations may allow the stream of the mobile data, in particular, newly defined 1.1 version mobile data to be processed.

As described above, if a 1.1 version digital broadcast receiver is provided, 1.0 version data may also be processed in addition to 1.1 version data.

That is, at least one of the FEC processor 5411 and the TCM decoder 5412 detects the entire mobile data except for the normal data, and processes the detected data.

Alternatively, if a common digital broadcast receiver is provided, the common digital broadcast receiver may include a block for processing the normal data, a block for processing the 1.0 version data, and a block for processing the 1.1 version data. In this case, a plurality of processing paths are provided on a rear end of the equalizer 5300, and each of the above blocks is disposed on each processing path. Therefore, at least one of the processing paths is selected according to a control of a controller (not shown) so that the proper data for the transport stream may be included in each processing path.

In addition, as described above, the mobile data may be placed in the transport stream in a different pattern for each slot. That is, various types of slot such as the first type of slot in which normal data is included as is, the second type of slot in which new mobile data is included in the entire area of the normal data, the third type of slot in which new mobile data is included in an area of the normal data area, and the fourth type of slot in which new mobile data is included in the normal data area and the entire existing mobile data area may be configured repeatedly according to a predetermined pattern.

The signaling decoder 5600 decodes the signaling data and notifies each element of the RS frame mode information or other mode information. Therefore, each element, including the FEC processor 5411 and the TCM decoder 5412, detect the mobile data at a predetermined location for each slot and processes the detected mobile data.

Though a controller is omitted in FIGS. 51 to 53, it is understood that a controller which applies a control signal to each block using the signaling data decoded by the signaling decoder 5600 may be additionally provided. Such a controller may control a tuning operation of the receiver 5100 according to a user's selection.

In the case of a 1.1 version receiver, 1.0 version data or 1.1 version data may be provided according to the user's selection. In addition, in the case where a plurality of 1.1 version data is provided, one of those services may be provided according to the user's selection.

The digital broadcast receiver illustrated in FIGS. 51 to 53 may be a set-top box, a TV, a personal computer, a general purpose computer, a special-purpose computer, and a portable device such as a mobile telephone, personal digital assistant (PDA), MP3 player, electronic dictionary, and laptop computer. Furthermore, although not illustrated in FIGS. 51 to 53, it is understood that an element which scales the decoded data appropriately and/or converts the decoded data, and outputs the scaled and/or converted decoded data on, for example, a screen in the form of audio and video data.

Meanwhile, a stream configuring method of a digital broadcast transmitter and a stream processing method of a digital broadcast receiver according to an exemplary embodiment may also correspond to the aforementioned block diagrams and the stream configuration views.

In other words, the stream configuring method of the digital broadcast transmitter may include: placing mobile data in at least a part of the packets allocated to normal data of the entire packets configuring the stream, and configuring a transport stream with the mobile data.

The placing the mobile data may be performed by the data pre-processor 100 illustrated in FIGS. 2 to 4.

The mobile data may be placed in various locations either together with the normal data and the existing mobile data, or independently, as in the aforementioned various exemplary embodiments. In other words, the mobile data and the known data may be placed in various methods as in FIGS. 15 to 40.

In addition, the configuring multiplexes the normal data that has been processed apart from the mobile data with the mobile data, to configure a transport stream.

The configured transport stream undergoes various processes such as RS encoding, interleaving, trellis encoding, sink multiplexing, and modulating, and is then transmitted to the receiver. Processing the transport stream may be performed by various elements of the digital broadcast receiver illustrated in FIG. 4.

The various exemplary embodiments of the stream configuring method may correspond to the various operations of the aforementioned digital broadcast transmitter.

Meanwhile, the stream processing method of the digital broadcast receiver according an exemplary embodiment may include: dividing into a first area which is allocated to first mobile data and a second area which is allocated to normal data, and receiving a transport stream where the mobile data has been placed in at least a portion of the second area apart from the first mobile data; demodulating the received transport stream; equalizing the demodulated transport stream; and decoding at least one of the first mobile data and the mobile data from the equalized transport stream.

The received transport stream according to an exemplary embodiment may be a transport stream that is configured and transmitted by the digital broadcast transmitter according to any of the aforementioned various exemplary embodiments. That is, the transport stream may be the mobile data placed in various methods as in FIGS. 15 to 21 and 29 to 40. In addition, the known data may also be placed in various methods as illustrated in FIGS. 22 to 28.

The various exemplary embodiments for the stream processing method may correspond to the various exemplary embodiments of the aforementioned digital broadcast receiver.

Meanwhile, the exemplary embodiments of the configurations of the various streams as illustrated in the aforementioned FIGS. 15 to 40 are not limited to just one configuration, but may be switched to different configurations according to different situations. That is, the data pre-processor 100 may place the mobile data and the known data, and block code the mobile data and the known data, with reference to various RS frame modes, modes, and block modes, according to a control signal applied from a separately provided controller or an externally input control signal. Accordingly, a digital broadcast enterpriser is able to provide the desired data, including the mobile data, in various sizes.

Furthermore, the aforementioned new mobile data, that is, 1.1 version data may be the same data as other mobile data, for example, 1.0 version data, or may be a different data input from a different source. In addition, a plurality of 1.1 version data may be contained in one slot and transmitted together. Accordingly, a user of the digital broadcast receiver is able to view various types of data that the user desires.

While not restricted thereto, exemplary embodiments can also be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, exemplary embodiments may be written as computer programs transmitted over a computer-readable transmission medium, such as a carrier wave, and received and implemented in general-use or special-purpose digital computers that execute the programs. Moreover, while not required in all aspects, one or more units of the digital broadcast transmitter and the digital broadcast receiver can include a processor or microprocessor executing a computer program stored in a computer-readable medium.

The foregoing exemplary embodiments and advantages are merely exemplary and are not to be construed as limiting the present invention. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A method for configuring a transport stream, the method comprising:
   placing mobile data in at least part of a normal data area allocated to normal data from among packets of the transport stream;
   generating signaling data which indicates at least one of whether the mobile data is placed in the normal data area and in which pattern the mobile data is placed in the normal data area; and
   transmitting the transport stream comprising the mobile data and the signaling data,
   wherein the signaling data is included in the transport stream by recording at least one symbol value as a predetermined first value if the mobile data is placed in at least part of the normal data area, and
   recording the at least one symbol value as a predetermined second value if the mobile data is not placed in the normal data area.

2. The method as claimed in claim 1, further comprising: determining a setting condition of a frame mode,
   wherein the placing comprises placing the normal data in the entire normal data area if the setting condition of the frame mode is determined to be a first frame mode and placing the mobile data in at least part of the normal data area if the setting condition of the frame mode is determined to be a second frame mode.

3. The method as claimed in claim 1, further comprising: determining a set mode which determines a placement condition of the mobile data in the normal data area,
   wherein the placing comprises placing the mobile data in a number of packets corresponding to the determined set mode in the normal data area in a pattern corresponding to the determined set mode.

4. The method as claimed in claim 1, wherein the signaling data is recorded in a reserved area of a data field sync.

5. The method as claimed in claim 4, wherein the signaling data is included in the transport stream by recording at least one symbol value of a predetermined location in the reserved area of the data field sync as a predetermined first value if the mobile data is placed in at least part of the normal data area, and recording the at least one symbol value as a predetermined second value if the mobile data is not placed in the normal data area.

6. The method as claimed in claim 5, wherein the signaling data is recorded using an $87^{th}$ symbol in the reserved area.

7. The method as claimed in claim 1, wherein the signaling data comprises transmission parameter channel (TPC) data and fast information channel (FIC) data.

8. The method as claimed in claim 7, wherein a reserved area of the TPC data comprises data to signal at least one of:
   whether the mobile data is included in the transport stream,
   where the mobile data is located in the transport stream,
   whether known data is added to the transport stream,
   where the known data is added to the transport stream,
   in what pattern the mobile data and the known data are placed in the transport stream,
   a block mode, and
   a coding unit.

9. The method as claimed in claim 7, wherein the generating the signaling data comprises:
- receiving the TPC data and the FIC data via a transmission parameter channel and a fast information channel, respectively;
- generating a TPC codeword by encoding the TPC data and a FIC codeword by encoding and block-interleaving the FIC data;
- multiplexing the TPC codeword and the FIC codeword;
- randomizing the multiplexed TPC codeword and FIC codeword; and
- parallel concatenated convolutional code (PCCC)-encoding the randomized TPC codeword and FIC codeword and outputting the randomized TPC codeword and FIC codeword as the signaling data.

10. The method as claimed in claim 1, wherein the signaling data is placed in a location in the transport stream according to other signaling data regarding placement of other mobile data, different from the mobile data, in the transport stream.

11. The method as claimed in claim 1, wherein the signaling data is placed between two long training sequences.

12. The method as claimed in claim 1, wherein the signaling data is placed alternately with a distributed training sequence.

13. A digital broadcast transmitter, comprising:
- a data preprocessor which places mobile data in at least part of a normal data area allocated to normal data from among packets of a transport stream; and
- an exciter unit which outputs the transport stream comprising the mobile data and signaling data which indicates at least one of whether the mobile data is placed in the normal data area and in which pattern the mobile data is placed in the normal data area,
- wherein the signaling data is included in the transport stream by recording at least one symbol value as a predetermined first value if the mobile data is placed in at least part of the normal data area, and recording the at least one symbol value as a predetermined second value if the mobile data is not placed in the normal data area.

14. The digital broadcast transmitter as claimed in claim 13, further comprising:
- a controller which determines a setting condition of a frame mode,
- wherein the controller controls the data preprocessor to place the normal data in the entire normal data area if the setting condition of the frame mode is determined to be a first frame mode and controls the data preprocessor to place the mobile data in at least part of the normal data area if the setting condition of the frame mode is determined to be a second mode.

15. The digital broadcast transmitter as claimed in claim 14, wherein the controller determines a set mode which determines a placement condition of the mobile data in the normal data area, and controls the data preprocessor to place the mobile data in a number of packets corresponding to the determined set mode in the normal data area in a pattern corresponding to the determined set mode.

16. The digital broadcast transmitter as claimed in claim 13, wherein:
- the exciter unit comprises a sync multiplexer which multiplexes a data field sync to the transport stream; and
- the signaling data is recorded in a reserved area of the data field sync.

17. The digital broadcast transmitter as claimed in claim 16, wherein the signaling data is included in the transport stream by recording at least one symbol value of a predetermined location in the reserved area of the data field sync as a predetermined first value if the mobile data is placed in at least part of the normal data area, and recording the at least one symbol value as a predetermined second value if the mobile data is not placed in the normal data area.

18. The digital broadcast transmitter as claimed in claim 17, wherein the signaling data is recorded using an $87^{th}$ symbol in the reserved area.

19. The digital broadcast transmitter as claimed in claim 13, wherein the signaling data comprises transmission parameter channel (TPC) data and fast information channel (FIC) data.

20. The digital broadcast transmitter as claimed in claim 19, wherein a reserved area of the TPC data comprises data to signal at least one of:
- whether the mobile data is included in the transport stream,
- where the mobile data is located in the transport stream,
- whether known data is added to the transport stream,
- where the known data is added to the transport stream,
- in which pattern the mobile data and the known data are placed in the transport stream,
- a block mode, and
- a coding unit.

21. The digital broadcast transmitter as claimed in claim 19, wherein:
- the data preprocessor comprises a signaling encoder which generates the signaling data; and
- the signaling encoder comprises:
  - an RS encoder for TPC which generates a TPC codeword by RS encoding the TPC data input via a transmission parameter channel;
  - an RS encoder for FIC which RS encodes the FIC data input via a fast information channel;
  - a block interleaver which generates an FIC codeword by block-interleaving the RS encoded FIC data;
  - a multiplexer which multiplexes the TPC codeword and the FIC codeword;
  - a signaling randomizer which randomizes the multiplexed TPC codeword and FIC codeword; and
  - a parallel concatenated convolutional code (PCCC) encoder which outputs the randomized TPC codeword and FIC codeword as the signaling data by PCCC-encoding the randomized TPC codeword and FIC codeword.

22. The digital broadcast transmitter as claimed in claim 13, further comprising:
- a multiplexer which multiplexes the mobile data processed by the data preprocessor to generate the transport stream and provides the transport stream to the exciter unit,
- wherein the data preprocessor comprises:
  - a frame encoder which performs RS frame encoding on the mobile data;
  - a block processor which block-codes an output value of the frame encoder;
  - a signaling encoder which generates the signaling data;
  - a group formatter which receives the mobile stream processed by the block processor and the signaling data and formats the mobile stream and the data by group unit; and
  - a packet formatter which packet-formats the mobile stream processed by the group formatter and outputs the mobile stream to the multiplexer.

23. The digital broadcast transmitter as claimed in claim 13, wherein the signaling data is placed in a location in the transport stream allocated to other signaling data regarding placement of other mobile data, other than the mobile data, in the transport stream.

24. The digital broadcast transmitter as claimed in claim 13, wherein the signaling data is placed between two long training sequences.

25. The digital broadcast transmitter as claimed in claim 13, wherein the signaling data is placed alternately with a distributed training sequence.

26. A method for processing a transport stream of a digital broadcast receiver, the method comprising:
   receiving the transport stream comprising mobile data placed in at least part of a normal data area allocated to normal data from among packets of the transport stream and signaling data which indicates at least one of whether the mobile data is placed in the transport stream and in which pattern the mobile data is placed in the transport stream;
   decoding the signaling data; and
   detecting the mobile data comprised in the transport stream using the decoded signaling data and decoding the detected mobile data,
   wherein the signaling data includes at least one symbol value as a predetermined first value if the mobile data is placed in at least part of the normal data area, and as a predetermined second value if the mobile data is not placed in the normal data area.

27. The method as claimed in claim 26, wherein the signaling data is recorded in a reserved area of a data field sync of the transport stream.

28. The method as claimed in claim 27, wherein the signaling data is included in the transport stream by recording at least one symbol value of a predetermined location in the reserved area of the data field sync as a predetermined first value if the mobile data is placed in at least part of the normal data area, and recording the at least one symbol value as a predetermined second value if the mobile data is not placed in the normal data area.

29. The method as claimed in claim 28, wherein the signaling data is recorded using an $87^{th}$ symbol in the reserved area.

30. The method as claimed in claim 26, wherein the signaling data comprises transmission parameter channel (TPC) data and fast information channel (FIC) data.

31. The method as claimed in claim 30, wherein a reserved area of the TPC data comprises data to signal at least one of:
   whether the mobile data is included in the transport stream,
   where the mobile data is located in the transport stream,
   whether known data is added to the transport stream,
   where the known data is added to the transport stream,
   in which pattern the mobile data and the known data are placed in the transport stream,
   a block mode, and
   a coding unit.

32. The method as claimed in claim 26, wherein the signaling data is placed in a location of the transport stream allocated to other signaling data regarding placement of other mobile data, different from the mobile data, in the transport stream.

33. The method as claimed in claim 26, wherein:
   the transport stream further comprises known data which is placed in a form of a long training sequence; and
   the signaling data is placed between two long training sequences.

34. The method as claimed in claim 26, wherein:
   the transport stream further comprises known data which is placed in a form of a distributed training sequence; and
   the signaling data is placed alternately with the known data in the form of the distributed training sequence.

35. A digital broadcast receiver, comprising:
   a receiver which receives a transport stream comprising mobile data placed in at least part of a normal data area allocated to normal data from among packets of the transport stream and signaling data which indicates at least one of whether the mobile data is placed in the transport stream and in which pattern the mobile data is placed in the transport stream;
   a demodulator which demodulates the received transport stream;
   an equalizer which equalizes the demodulated transport stream;
   a signaling decoder which detects the signaling data from the transport stream and decodes the signaling data;
   a decoder which detects the mobile data comprised in the transport stream using the decoded signaling data and decodes the mobile data,
   wherein the signaling data includes at least one symbol value as a predetermined first value if the mobile data is placed in at least part of the normal data area, and as a predetermined second value if the mobile data is not placed in the normal data area.

36. The digital broadcast receiver as claimed in claim 35, wherein the signaling data is recorded in a reserved area of a data field sync of the transport stream.

37. The digital broadcast receiver as claimed in claim 35, wherein the signaling data is included in the transport stream by recording at least one symbol value of a predetermined location in the reserved area of the data field sync as a predetermined first value if the mobile data is placed in at least part of the normal data area, and recording the at least one symbol value as a predetermined second value if the mobile data is not placed in the normal data area.

38. The digital broadcast receiver as claimed in claim 37, wherein the signaling data is recorded using an $87^{th}$ symbol in the reserved area.

39. The digital broadcast receiver as claimed in claim 35, wherein the signaling data comprises transmission parameter channel (TPC) data and fast information channel (FIC) data.

40. The digital broadcast receiver as claimed in claim 39, wherein a reserved area of the TPC data comprises data to signal at least one of:
   whether the mobile data is included in the transport stream,
   where the mobile data is located in the transport stream,
   whether known data is added to the transport stream, where the known data is added to the transport stream,
   in which pattern the mobile data and the known data are placed in the transport stream,
   a block mode, and
   a coding unit.

41. The digital broadcast receiver as claimed in claim 35, wherein the signaling data is placed in a location of the transport stream allocated to other signaling data regarding placement of other mobile data, different from the mobile data, in the transport stream.

42. The digital broadcast receiver as claimed in claim 35, wherein:
   the transport stream further comprises known data which is placed in a form of long training sequence; and
   the signaling data is placed between two long training sequences.

43. The digital broadcast receiver as claimed in claim 35, wherein:
   the transport stream further comprises known data which is placed in a form of a distributed training sequence, wherein the signaling data is placed alternately with the known data in the form of the distributed training sequence.

44. A non-transitory computer readable recording medium having recorded thereon a program executable by a computer for performing the method of claim 1.

45. A non-transitory computer readable recording medium having recorded thereon a program executable by a computer for performing the method of claim 26.

* * * * *